United States Patent
Katakura et al.

(10) Patent No.: US 9,260,658 B2
(45) Date of Patent: Feb. 16, 2016

(54) ORGANIC ELECTROLUMINESCENCE ELEMENT, LIGHTING DEVICE AND DISPLAY DEVICE

(75) Inventors: Rie Katakura, Hino (JP); Hideo Taka, Inagi (JP)

(73) Assignee: KONICA MINOLTA, INC. (JP)

( * ) Notice: Subject to any disclaimer, the term of this patent is extended or adjusted under 35 U.S.C. 154(b) by 702 days.

(21) Appl. No.: 13/585,981

(22) Filed: Aug. 15, 2012

(65) Prior Publication Data

US 2013/0049576 A1 Feb. 28, 2013

(30) Foreign Application Priority Data

Aug. 25, 2011 (JP) ................. 2011-183401

(51) Int. Cl.
*C09K 11/06* (2006.01)
*H01L 51/00* (2006.01)
(Continued)

(52) U.S. Cl.
CPC ............ *C09K 11/06* (2013.01); *H01L 51/0085* (2013.01); *H01L 51/5024* (2013.01);
(Continued)

(58) Field of Classification Search
None
See application file for complete search history.

(56) References Cited

U.S. PATENT DOCUMENTS 6,097,147 A 8/2000 Baldo et al.
2008/0297033 A1* 12/2008 Knowles et al. ............. 313/504
(Continued)

FOREIGN PATENT DOCUMENTS

JP 2005-112765 A 4/2005
JP 2012525405 A 10/2012
(Continued)

OTHER PUBLICATIONS

Extended European Search Report for Application No. 12180994.1-1218, mailed Jan. 3, 2013.
(Continued)

*Primary Examiner* — Robert S Loewe
(74) *Attorney, Agent, or Firm* — Cantor Colburn LLP

(57) ABSTRACT

Provided is an organic electroluminescence element containing an anode, a cathode and a plurality of organic layers including a light emitting layer sandwiched between the anode and the cathode, wherein at least one of the organic layers contains: a blue phosphorescence organic metal complex which is coordinated with a ligand having a structure represented by Formula (1); and a compound represented by Formula (H1), provided that Formula (H1) includes a structure represented by Formula (H2),

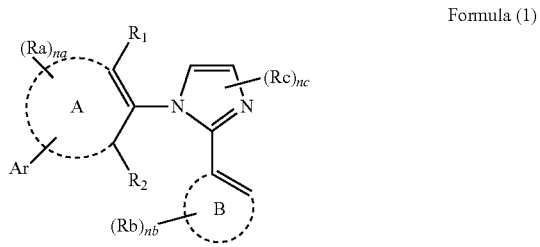

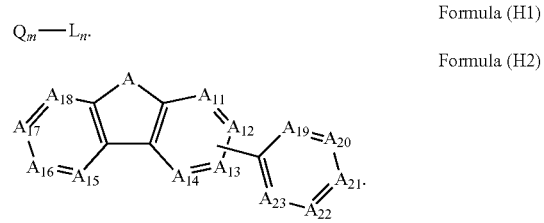

18 Claims, 5 Drawing Sheets

(51) Int. Cl.
  *H01L 51/50* (2006.01)
  *H05B 33/14* (2006.01)
  *H05B 33/20* (2006.01)
(52) U.S. Cl.
  CPC ............... *H05B33/14* (2013.01); *H05B 33/20* (2013.01); *C09K 2211/1007* (2013.01); *C09K 2211/1029* (2013.01); *C09K 2211/1044* (2013.01); *C09K 2211/1088* (2013.01); *C09K 2211/1092* (2013.01); *C09K 2211/185* (2013.01)

(56) References Cited

U.S. PATENT DOCUMENTS

2009/0243479 A1* 10/2009 Tanaka et al. ................. 313/504
2010/0141127 A1* 6/2010 Xia et al. ...................... 313/504
2010/0148663 A1* 6/2010 Tsai et al. ..................... 313/504
2011/0057559 A1   3/2011 Xia et al.

FOREIGN PATENT DOCUMENTS

JP   2014508778 A    4/2014
WO   2007108327 A1   9/2007

OTHER PUBLICATIONS

Japanese Notification of Reasons for Refusal corresponding to Application No. 2011-183401; Dispatch Date: Jan. 20, 2015, with English translation.

* cited by examiner

LIGHT

LIGHT

ORGANIC ELECTROLUMINESCENCE ELEMENT, LIGHTING DEVICE AND DISPLAY DEVICE

This application is based on Japanese Patent Application No. 20011-183401 filed on Aug. 25, 2011 with Japan Patent Office, the entire content of which is hereby incorporated by reference.

TECHNICAL FIELD

The present invention relates to an organic electroluminescence element, a lighting device and a display device. More particularly, the present invention relates to an organic electroluminescence element and a compound preferably used for the organic electroluminescence element.

BACKGROUND

An organic electroluminescence element (hereafter, it is also called as an organic EL element) is an element provided with a constitution comprising an emitting layer containing a emitting substance being sandwiched with a cathode and an anode, and an exciton is generated by an electron and a hole being injected into the emitting layer to be recombined, resulting emission utilizing light release (fluorescence and phosphorescence) at the time of deactivation of the exciton. This element is a completely solid element composed of layers of organic materials having a thickness of a sub-micron order between the electrodes. It can emit light at a voltage of approximately a few to a few tens volts, therefore, an organic electroluminescence element is expected to use for application to a flat type display or a lighting device.

As an investigation of an organic EL element for practical use, an organic EL element using phosphorescent emission from an excited triplet state was reported (for example, refer to Non patent document 1). Since then, there have been extensively investigated materials which exhibit phosphorescent emission at room temperature (for example, refer to Patent document 1 and Non patent document 2).

Furthermore, in the organic EL element using phosphorescence luminescence which was discovered recently, it is theoretically possible to realize about 4 times of the luminescence efficiency compared with the known element using fluorescence luminescence. Therefore, it has been investigated throughout the world, to begin with, the material itself, the layer composition of the emitting element and the electrode For example, many compounds were prepared for synthetic study focusing on heavy metal complexes, such as an iridium complex system (for example, refer to Non patent document 3).

Thus, although the organic EL element using phosphorescence luminescence has a very high potential, it has problems to be solved. It differs greatly from the organic electroluminescence element using fluorescence luminescence in the following point. In the organic EL element using phosphorescence luminescence, the method of controlling the location of a luminescence center, especially, the method to perform recombination inside the light emitting layer and to emit light stably, has been an important technical investigational work from the viewpoint of improving efficiency and lifetime of the element.

Then, there is well known in recent years the element of the multilayer lamination type equipped with the hole transport layer (located in the anode side of the light emitting layer) and the electron transport layer (located in the cathode side of the light emitting layer), both transport layers each respectively adjoining the light emitting layer (for example, refer to Patent document 2). Further, it is widely used a light emitting layer of a mixed type containing a host compound and a phosphorescent dopant compound mixed with each other.

On the other hand, it is required materials provided with a high carrier property with high thermal and electric stability. In particular, when blue phosphorescence luminescence is used, since the material producing blue phosphorescence luminescence will have a high excited triplet energy level (T1), it is strongly required other materials applicable therewith and a precise control of the center of the luminescence.

As one of the most representative blue phosphorescence compounds, it is known FIrpic. This compound contains a phenyl pyridine having a fluorinated substituent as a main ligand, and also contains picolinic acid as a sub ligand. It has been realized light emission of short wavelength. Although this group of dopants has enabled to produce an element of high emission efficiency by combining a carbazole derivative or a triazole silane compound as a host compound, the emission lifetime of the element was extremely deteriorated. It was demanded improvement of this trade-off relationship.

In recent years, there is disclosed a metal complex having specific ligand as a blue phosphorescence compound in Patent document 3. In Patent document 3, there is further proposed a dibenzofuran derivative and a dibenzothiophene derivative as a host material which are used with a blue phosphorescence compound. However, although the organic EL element produced by using a host compound disclosed in the above-mentioned document exhibited improved light emitting efficiency and lifetime, it is still insufficient in driving voltage. In addition, there is required further improvement in light emitting efficiency and lifetime.

Moreover, from the viewpoint of application to a display or illumination, aging stability is also needed for an organic EL element. In the light emitting layer of the organic EL element containing a dopant and a host compound, in order to solve the problems, such as concentration quenching by a transportation property of a carrier, or aggregation of luminescence dopant, and quenching by the interaction of excitons, it is desirable that the luminescence dopant will be distributed uniformly in the host compound. For example, when prolonged continuation luminescence is carried out, or when it is kept under the conditions of elevated temperature and high humidity, the conditions of the dopant and the host will be changed in the light emitting layer. As a result, there is concern of deterioration of element performance such as increase of driving voltage, or decrease of luminescence luminance. It has been found out that the viewpoint of such aging stability is not disclosed and investigation is not fully sufficient in Patent document 3, and that further improvement is required.

On the other hand, from the requirements of larger area, lower cost and higher productivity, the expectation for a wet method (it is called a wet process etc.) is great. Since film formation can be achieved at low temperature compared with film formation with a vacuum process, the damage of an underlaying organic layer can be reduced and it attracts great expectation from the field of improvement of light emitting efficiency and lifetime of an element.

However, in the organic EL element using blue phosphorescence luminescence, in order to realize element production with a wet process, it has been found the problem of solubility of a host compound contained in a light emitting layer and an electron transport material laminated on light emitting layer. From a practical viewpoint, the conventionally known host compounds and electron transport materials are still insufficient in respect of solubility to the solvent, solution stability and driving voltage. Therefore, it has been recognized that further technological improvement is indispensable. On the other hand, although it is well known a method of polymerizing a material in order to improve its solvent resistive property toward a solvent, it is hard to obtain a highly purified polymer due to its molecular weight and due to the property of encapsulating foreign materials. These foreign materials will have a large tendency to deteriorate the performance of the element. It is also well known in the art to use highly pure materials as much as possible for an organic EL element. In addition, it is hard to apply a well known purification method for a low molecular material such as a sublimation purification method, and there is a concern from the viewpoint of production aptitude.

PRIOR ART DOCUMENTS

Patent Documents

Patent document 1: U.S. Pat. No. 6,097,147
Patent document 2: Japanese Patent Application Publication (JP-A) No. 2005-112765
Patent document 3: US 2011/0057559

Non Patent Documents

Non patent document 1: M. A. Baldo at al., Nature, vol. 395, pp 151-154 (1998)
Non patent document 2: M. A. Baldo at al., Nature, vol. 403 (17), pp 750-753 (2000)
Non patent document 3: S. Lamansky et al., J. Am. Chem. Soc., vol. 123, p. 4304 (2001)

SUMMARY

An object of the present invention is to provide an organic EL element exhibiting high light emitting efficiency, low driving voltage, long lifetime, and excellent in aging stability. Further, an object of the present invention is to provide an organic EL element having a manufacturing aptitude by a wet process, and to provide a blue phosphorescence luminescence metal complex for attaining the above-described properties and to provide a host compound suitable for the blue phosphorescence luminescence metal complex.

An object of the present invention described above has been achieved by the following constitutions.

1. An organic electroluminescence element comprising an anode, a cathode and a plurality of organic layers including a light emitting layer sandwiched between the anode and the cathode,
wherein at least one of the plurality of organic layers contains:
a blue phosphorescence organic metal complex which is coordinated with a ligand having a structure represented by Formula (1); and
a compound represented by Formula (H1).

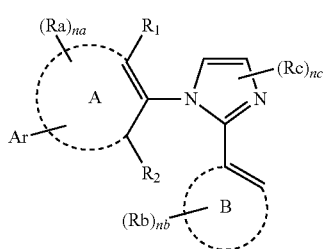

Formula (1)

In Formula (1), ring A and ring B each respectively represent a five or six membered aromatic hydrocarbon ring or aromatic heterocycle; Ar represents an aromatic hydrocarbon ring, an aromatic heterocycle, a non-aromatic hydrocarbon ring, or a non-aromatic heterocycle; $R_1$ and $R_2$ each respectively represent a hydrogen atom, a halogen atom, a cyano group, an alkyl group, an alkenyl group, an alkynyl group, an alkoxyl group, an amino group, a silyl group, an arylalkyl group, an aryl group, a heteroaryl group, a non-aromatic hydrocarbon ring group, or a non-aromatic heterocyclic group, provided that these groups may have a substituent, and that at least one of $R_1$ and $R_2$ is an alkyl group having 2 or more carbon atoms or a cycloalkyl group.

$R_a$, $R_b$ and $R_c$ each respectively represent a hydrogen atom, a halogen atom, a cyano group, an alkyl group, an alkenyl group, an alkynyl group, an alkoxyl group, an amino group, a silyl group, an arylalkyl group, an aryl group, a heteroaryl group, a non-aromatic hydrocarbon ring group, or a non-aromatic heterocyclic group, provided that these groups may have a substituent; na and nc each respectively represent an integer of 1 or 2; and nb represents an integer of 1 to 4.

$$Q_m\text{-}L_n \qquad \text{Formula (H1):}$$

In Formula (H1) L is a condensed aromatic heterocycle which may have a substituent; Q is an aromatic hydrocarbon ring or aromatic heterocycle which may have a substituent; n and m each respectively represent an integer of 1 to 3, provided that when n is 2 or more, a plurality of Ls may be the same or different with each other, when m is 2 or more, a plurality of Qs may be the same or different with each other. The compound represented by Formula (H1) includes a structure represented by Formula (H2).

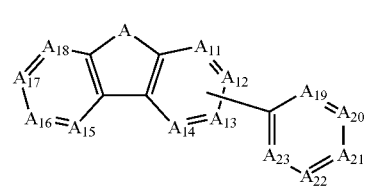

Formula (H2)

In Formula (H2), A represents an oxygen atom, a sulfur atom, NR', or CR''=CR''; $A_{11}$ to $A_{23}$ each respectively represent a nitrogen atom or CR'', R' and R'' each respectively represent a linking position, a hydrogen atom, or a substituent, provided that when there are a plurality of CR''s, each CR'' may be the same or different, and the plurality of CR''s may be joined to form a ring.

2. An organic electroluminescence element comprising an anode, a cathode and one or a plurality of organic layers including a light emitting layer sandwiched between the anode and the cathode,
wherein at least one of the organic layers contains:
a blue phosphorescence organic metal complex represented by Formula (2); and
a compound represented by Formula (H1).

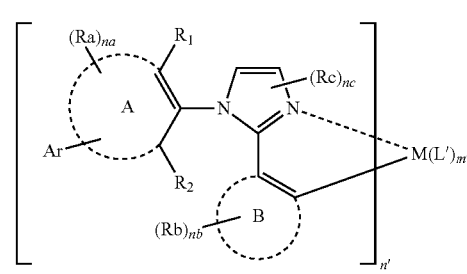

Formula (2)

In Formula (2), ring A and ring B each respectively represent a five or six membered aromatic hydrocarbon ring or aromatic heterocycle; Ar represents an aromatic hydrocarbon ring, an aromatic heterocycle, a non-aromatic hydrocarbon ring, or a non-aromatic heterocycle; $R_1$ and $R_2$ each respectively represent a hydrogen atom, a halogen atom, a cyano group, an alkyl group, an alkenyl group, an alkynyl group, an alkoxyl group, an amino group, a silyl group, an arylalkyl group, an aryl group, a heteroaryl group, a non-aromatic hydrocarbon ring group, or a non-aromatic heterocyclic group, provided that these groups may have a substituent, and that at least one of $R_1$ and $R_2$ is an alkyl group having 2 or more carbon atoms or a cycloalkyl group.

$R_a$, $R_b$ and $R_c$ each respectively represent a hydrogen atom, a halogen atom, a cyano group, an alkyl group, an alkenyl group, an alkynyl group, an alkoxyl group, an amino group, a silyl group, an arylalkyl group, an aryl group, a heteroaryl group, a non-aromatic hydrocarbon ring group, or a non-aromatic heterocyclic group, provided that these groups may have a substituent; na and nc each respectively represent an integer of 1 or 2; and nb represents an integer of 1 to 4.

L' represents a monoanionic bidentate ligand which is coordinated to M; M represents a transition metal atom having an atomic number of 40 or more and belonging to groups 8 to 10 in the periodic table; m' represents an integer of 0 to 2, n' represents an integer of 1 to 3, provided that m'+n' is equal to 2 or 3.

$$Q_m\text{-}L_m \qquad \text{Formula (H 1):}$$

In Formula (H1), L is a condensed aromatic heterocycle which may have a substituent; Q is an aromatic hydrocarbon ring or aromatic heterocycle which may have a substituent; n and m each respectively represent an integer of 1 to 3, provided that when n is 2 or more, a plurality of Ls may be the same or different with each other, when m is 2 or more, a plurality of Qs may be the same or different with each other. The compound represented by Formula (H1) includes a structure represented by Formula (H2) in the molecule.

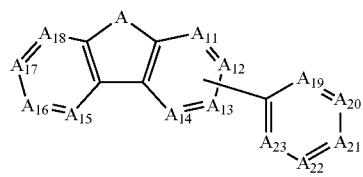

Formula (H2)

In Formula (H2), A represents an oxygen atom, a sulfur atom, NR', or CR"=CR"; $A_{11}$ to $A_{23}$ each respectively represent a nitrogen atom or CR", R' and R" each respectively represent a linking position, a hydrogen atom, or a substituent, provided that when there are a plurality of CR"s, each CR" may be the same or different, and the plurality of CR"s may be joined to form a ring.

3. The organic electroluminescence element described in the above-described items 1 or 2, wherein, Formula (H1) is further represented by any one of Formulas (H3) to (H102)

L—Q
(m = 1, n = 1)

Formula (H3)

L—Q—L
(m = 1, n = 2)

Formula (H4)

L—L—Q
(m = 1, n = 2)

Formula (H5)

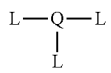
(m = 1, n = 3)

Formula (H6)

L—Q—L—L
(m = 1, n = 3)

Formula (H7)

L—L—L—Q
(m = 1, n = 3)

Formula (H8)

Q—L—Q
(m = 2, n = 1)

Formula (H9)

Q—Q—L
(m = 2, n = 1)

Formula (H10)

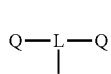
(m = 3, n = 1)

Formula (H11)

Q—L—Q—Q
(m = 3, n = 1)

Formula (H12)

Q—Q—Q—L
(m = 3, n = 1)

Formula (H13)

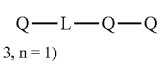
(m = 3, n = 1)

Formula (H14)

L—Q—L—Q
(m = 2, n = 2)

Formula (H15)

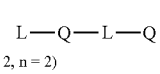
(m = 2, n = 2)

Formula (H16)

L—Q—Q—L
(m = 2, n = 2)

Formula (H17)

Q—L—L—Q
(m = 2, n = 2)

Formula (H18)

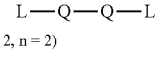
(m = 2, n = 2)

Formula (H19)

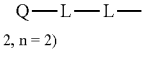
(m = 2, n = 2)

Formula (H20)

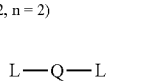
(m = 3, n = 2)

Formula (H21)

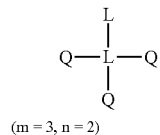
(m = 3, n = 2)

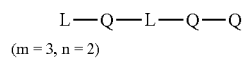
(m = 3, n = 2)

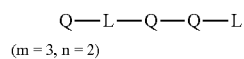
(m = 3, n = 2)

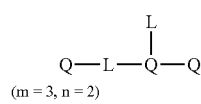
(m = 3, n = 2)

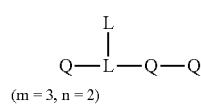
(m = 3, n = 2)

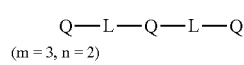
(m = 3, n = 2)

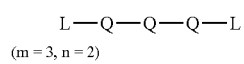
(m = 3, n = 2)

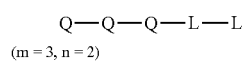
(m = 3, n = 2)

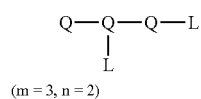
(m = 3, n = 2)

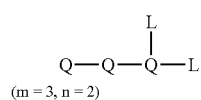
(m = 3, n = 2)

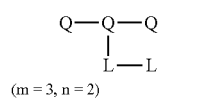
(m = 3, n = 2)

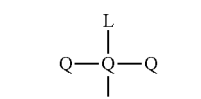
(m = 3, n = 2)

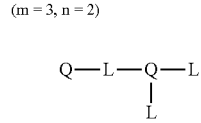
(m = 2, n = 3)

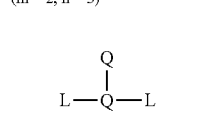
(m = 2, n = 3)

Formula (H22)

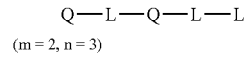
(m = 2, n = 3)

Formula (H23)

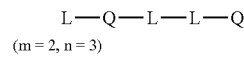
(m = 2, n = 3)

Formula (H24)

Formula (H25)

Formula (H26)

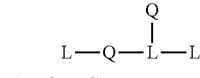
(m = 2, n = 3)

Formula (H27)

Formula (H28)

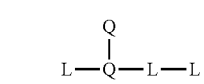
(m = 2, n = 3)

Formula (H29)

Formula (H30)

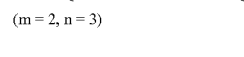
(m = 2, n = 3)

Formula (H31)

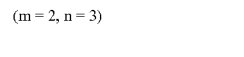
(m = 2, n = 3)

Formula (H32)

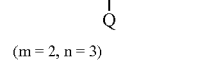
(m = 2, n = 3)

Formula (H33)

Formula (H34)

Formula (H35)

Formula (H36)

Formula (H37)

Formula (H38)

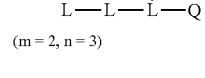
(m = 2, n = 3)

Formula (H39)

Formula (H40)

Formula (H41)

Formula (H42)

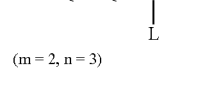
(m = 2, n = 3)

Formula (H43)

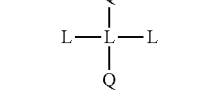
(m = 2, n = 3)

Formula (H44)

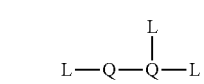
(m = 2, n = 3)

Formula (H45)

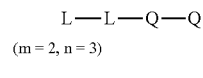
(m = 2, n = 3)

Formula (H46)

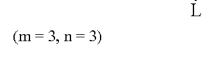
(m = 2, n = 3)

Formula (H47)

Formula (H48)

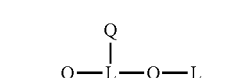

Formula (H49)

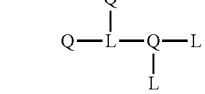
(m = 3, n = 3)

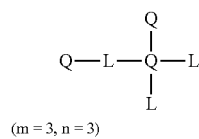
Formula (H50)
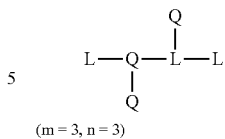
(m = 3, n = 3)
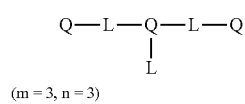
Formula (H51)
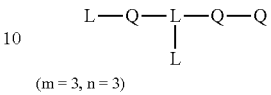
(m = 3, n = 3)
Formula (H63)
Formula (H64)
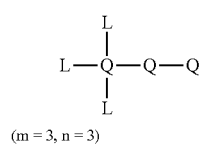
Formula (H52)
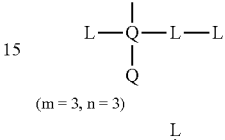
(m = 3, n = 3)
Formula (H65)
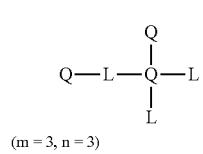
Formula (H53)
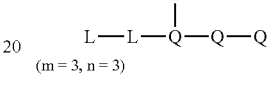
(m = 3, n = 3)
Formula (H66)
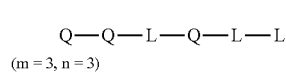
Formula (H54)
Q—Q—L—L—Q
(m = 3, n = 3)
Formula (H67)
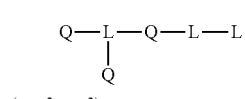
Formula (H55)
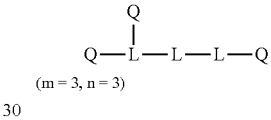
(m = 3, n = 3)
Formula (H68)
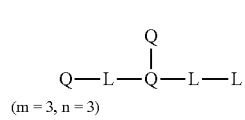
Formula (H56)
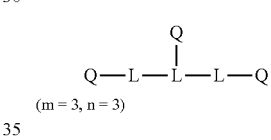
(m = 3, n = 3)
Formula (H69)
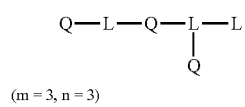
Formula (H57)
L—L—Q—Q—Q
(m = 3, n = 3)
Formula (H70)
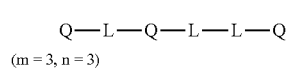
Formula (H58)
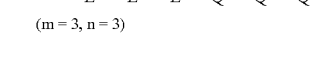
(m = 3, n = 3)
Formula (H71)
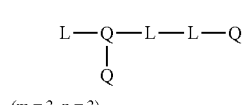
Formula (H59)
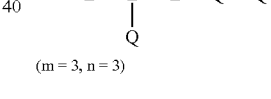
(m = 3, n = 3)
Formula (H72)
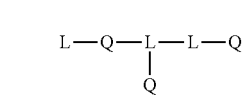
Formula (H60)
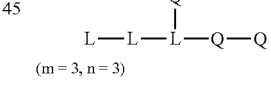
(m = 3, n = 3)
Formula (H73)
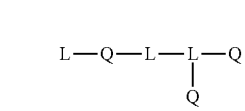
Formula (H61)
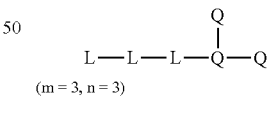
(m = 3, n = 3)
Formula (H74)
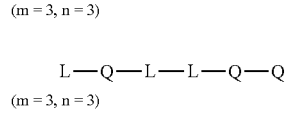
Formula (H62)
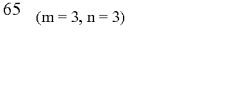
(m = 3, n = 3)
Formula (H75)

-continued

Formula (H76)
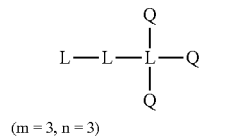
(m = 3, n = 3)

Formula (H77)
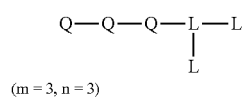
(m = 3, n = 3)

Formula (H78)
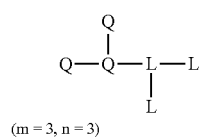
(m = 3, n = 3)

Formula (H79)
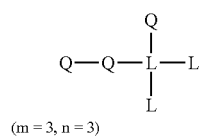
(m = 3, n = 3)

Formula (H80)
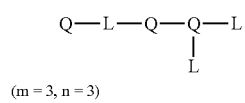
(m = 3, n = 3)

Formula (H81)
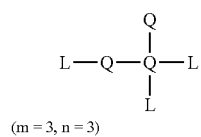
(m = 3, n = 3)

Formula (H82)
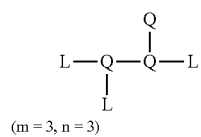
(m = 3, n = 3)

Formula (H83)
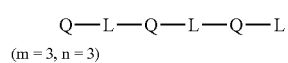
Q—L—Q—L—Q—L
(m = 3, n = 3)

Formula (H84)
Q—L—Q—Q—L—L
(m = 3, n = 3)

Formula (H85)
Q—L—L—Q—Q—L
(m = 3, n = 3)

Formula (H86)
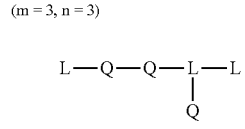
(m = 3, n = 3)

Formula (H87)
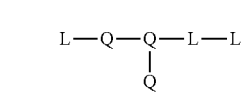
(m = 3, n = 3)

Formula (H88)
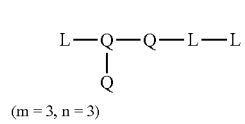
(m = 3, n = 3)

Formula (H89)
L—Q—Q—L—Q—L
(m = 3, n = 3)

Formula (H90)
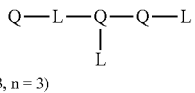
(m = 3, n = 3)

Formula (H91)
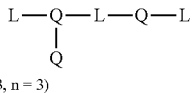
(m = 3, n = 3)

Formula (H92)
Q—Q—L—L—Q
(m = 3, n = 3)

Formula (H93)
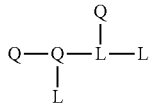
(m = 3, n = 3)

Formula (H94)
L—L—Q—Q—L
(m = 3, n = 3)

Formula (H95)
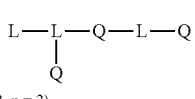
(m = 3, n = 3)

Formula (H96)
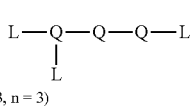
(m = 3, n = 3)

Formula (H97)
L—Q—Q—Q—L
(m = 3, n = 3)

Formula (H98)
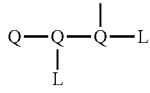
(m = 3, n = 3)

Formula (H99)
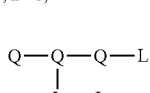
(m = 3, n = 3)

Formula (H100)
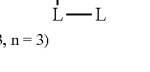
(m = 1, n = 3)

Formula (H101)
Q—Q—L—L
(m = 2, n = 2)

Formula (H102)
Q—L—Q—L—L—Q
(m = 3, n = 3)

4. The organic electroluminescence element described in any one of the above-described items 1 or 3, wherein, A in Formula (H2) represents an oxygen atom, a sulfur atom, or NR'.

5. The organic electroluminescence element described in any one of the above-described items 1 or 4, wherein, at least one of Ls in Formula (H1) represents a carbazole ring.

6. The organic electroluminescence element described in any one of the above-described items 1 or 5, wherein, L in Formula (H1) is further represented by Formula (H2').

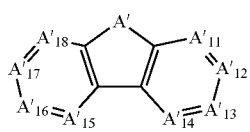

Formula (H2')

In Formula (H2'), A' represents an oxygen atom, a sulfur atom, or NR'''; $A'_{11}$ to $A'_{18}$ each respectively represent a nitrogen atom or CR'''', R''' and R'''' each respectively represent a linking position, a hydrogen atom, or a substituent, provided that when there are a plurality of CR''''s, each CR'''' may be the same or different, and the plurality of CR''''s may be joined to form a ring.

7. The organic electroluminescence element described in the above-described item 6, wherein all of $A'_{11}$ to $A'_{18}$ in Formula (H2') represent CR''''.

8. The organic electroluminescence element described in any one of the above-described items 1 or 7, wherein, $R_1$ and $R_2$ in Formula (1) or Formula (2) each respectively represent an alkyl group having 2 or more carbon atoms or a cycloalkyl group.

9. The organic electroluminescence element described in any one of the above-described items 1 or 8, wherein, at least one of $R_1$ and $R_2$ in Formula (1) or Formula (2) represents a branched alkyl group having 3 or more carbon atoms.

10. The organic electroluminescence element described in any one of the above-described items 1 or 9, wherein, both $R_1$ and $R_2$ in Formula (1) or Formula (2) represent a branched alkyl group having 3 or more carbon atoms.

11. The organic electroluminescence element described in any one of the above-described items 1 or 10, wherein, ring B in Formula (1) or Formula (2) represents a benzene ring.

12. The organic electroluminescence element described in any one of the above-described items 1 or 11, wherein, Ar in Formula (1) or Formula (2) represents a benzene ring.

13. The organic electroluminescence element described in any one of the above-described items 2 or 12, wherein, Formula (2) is further represented by Formula (2-1)

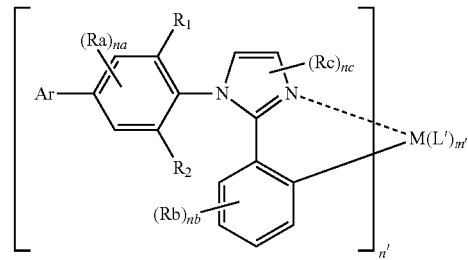

Formula (2-1)

In Formula (2-1), Ar, $R_1$, $R_2$, $R_a$, $R_b$, $R_c$, na, nb, nc, M, L', m', and n' each are synonymous with Ar, $R_1$, $R_2$, $R_a$, $R_b$, $R_c$, na, nb, nc, M, m', and n' in Formula (2), respectively.

14. The organic electroluminescence element described in any one of the above-described items 2 or 13, wherein, M in Formula (2) or Formula (2-1) represents Ir.

15. The organic electroluminescence element described in any one of the above-described items 1 or 14, wherein, the organic electroluminescence element emits a white light.

16. A lighting device comprising the organic electroluminescence element of any one of the above-described items 1 to 15.

17. A display device comprising the organic electroluminescence element of any one of the above-described items 1 to 15.

It was found that the present invention can provide an organic electroluminescence element which is driven with a small driving voltage to result in exhibiting high emission efficiency and a long lifetime.

The present invention can also provide a lighting device and a display device each provided with this organic electroluminescence element.

PREFERRED EMBODIMENTS TO CARRY OUT THE INVENTION

Figure 1:
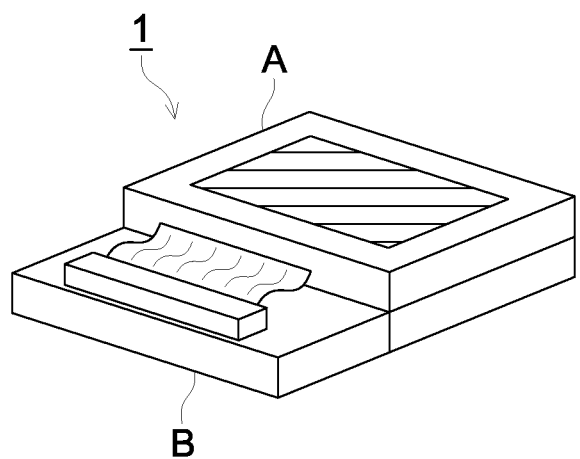
FIG. 1 is a schematic drawing to show an example of a display device constituted of an organic EL element.

The preferred embodiments to carry out the present invention will be detailed below, however, the present invention will not be limited to these.

In order to attain the above-mentioned object, the present inventors have continued investigation extensively. As a result, the present inventors found out that it can obtain an organic electroluminescence element which exhibits an elevated luminance with a low driving voltage, and at the same time, achieves a longer life of emission lifetime by jointly using a metal complex dopant represented by Formula (1) with a host compound containing a specific structure represented by Formula (H1). Further, it was found out that the organic electroluminescence element produced by jointly using a dopant and a host compound of the present invention will give an organic EL element which is improve in its aging stability.

As is described in prior art Patent document 3, it has been already known that a metal complex having a imidazole structure ligand with a specific substituent is efficient as a light emitting dopant in an organic EL element. In this document, it was found out that a blue phosphorescence organic EL element exhibiting high luminescence can be produced by further introducing an aromatic ring (including an aromatic hydrocarbon ring and an aromatic heterocycle) having a specific substituent into an imidazole ring.

However, the performance of the produced organic EL element was still insufficient to fully resolve the above-described problems.

The present inventors have further investigated repeatedly a host compound which is suitable to an organic metal complex coordinated to a ligand having a structure represented by Formula (1). As a result, it was found out that performance of an organic EL element can be remarkably improved by employing a compound having a specific structure in the molecule as a host. Namely, it became possible to provide a group of compounds which have a high Tg and a sufficiently high excited triplet state to result in not deteriorating emission efficiency of a blue phosphorescence organic complex by providing a structure represented by Formula (H2) in the molecule of a host compound. In addition, the structure represented by Formula (H2) keeps a planarity and the molecules will be easily oriented or arranged partially. By employing a host compound having properties of this orientation or arrangement, it was found that carriers will be transported efficiently in the light emitting layer to result in realizing compatibility of both high emission efficiency and low driving voltage of the element.

Moreover, by achieving orientation and arrangement of the molecules, an increase of a driving voltage at the time of continuous light emission can be suppressed compared with a perfect amorphous membrane, and the molecule becomes difficult to be influenced by environments, such as temperature and humidity, and aging stability has been improved. As a result, it became possible to provide a host compound which is suitable for the organic metal complex represented by Formula (1) by this.

The blue phosphorescent organic metal complex of the present invention contains Ar represented in Formula (1). The ring structure portion represented by Ar is extruded from the spherical portion formed by the metal and the ligand directly coordinated to the metal. As a result, it will receive the effect of orientation and arrangement of the molecules more than the spherical portion. It is supposed that the improvement can be achieved by using in combination with a host compound of the present invention.

The compounds relating to the present invention will be described in the following.

<<Blue Phosphorescence Organic Metal Complex which is Coordinated with a Ligand Having a Structure Represented by Formula (1)>>

In Formula (1), an example of a 5 or 6-membered aromatic hydrocarbon ring represented by ring A or ring B is a benzene ring.

In Formula (1), examples of a 5 or 6-membered aromatic heterocycle which is represented by ring A or ring B include: a furan ring, a thiophene ring, an oxazole ring, a pyrrole ring, a pyridine ring, a pyridazine ring, a pyrimidine ring, a pyrazine ring, a triazine ring, an oxadiazole ring, a triazole ring, an imidazole ring, a pyrazole ring, and a thiazole ring. Preferably, ring B is a benzene ring, and ring B is also a benzene ring.

In Formula (1), examples of an aromatic hydrocarbon ring which is represented by Ar include: a benzene ring, a biphenyl ring, a naphthalene ring, an azulene ring, an anthracene ring, a phenanthrene ring, a pyrene ring, a chrysene ring, a naphthacene ring, a triphenylene ring, o-terphenyl ring, m-terphenyl ring, p-terphenyl ring, an acenaphthene ring, a coronene ring, a fluorene ring, a fluoanthrene ring, a naphthacene ring, a pentacene ring, a perylene ring, a pentaphene ring, a picene ring, a pyrene ring, a pyranthrene ring and an anthraanthrene ring.

In Formula (1), examples of an aromatic heterocycle which is represented by Ar include: a silole ring, a furan ring, a thiophene ring, an oxazole ring, a pyrrole ring, a pyridine ring, a pyridazine ring, a pyrimidine ring, a pyrazine ring, a triazine ring, an oxadiazole ring, a triazole ring, an imidazole ring, a pyrazole ring, a thiazole ring, an indole ring, a benzimidazole ring, a benzothiazole ring, a benzoxazole ring, a quinoxaline ring, a quinazoline ring, a phthalazine ring, a thienothiophene ring, a carbazole ring, and an azacarbazole ring (indicating a ring structure in which one or plural carbon atoms in the ring constituting the aforesaid carbazole ring is replaced with one or plural nitrogen atoms), a dibenzosilole ring, a dibenzofuran ring, a dibenzothiophene ring, a ring in which one or more arbitral carbon atoms which constitutes a benzothiophene ring or a dibenzofuran ring are replaced with nitrogen atoms, a benzodifuran ring, a benzodithiophene ring, an acridine ring, a benzoquinoline ring, a phenazine ring, a phenanthridine ring, a phenanthroline ring, a cycladine ring, a quindoline ring, a thebenidine ring, a quinindoline ring, a triphenodithiazine ring, a triphenodioxazine ring, a phenanthrazine ring, an anthrazine ring, a perimidine ring, a naphthofuran ring, a naphthothiophene ring, a naphthodifuran ring, a naphthodithiophene ring, an anthrafuran ring, an anthradifuran ring an anthrathiophene ring, an anthradithiophene ring, a thianthrene ring, a phenoxathiine ring, a dibenzocarbazole ring, an indrocarbazole ring and a dithienobenzene ring.

In Formula (1), examples of a non-aromatic hydrocarbon ring which is represented by Ar include: a cycloalkane group (for example, a cyclopentane ring and a cyclohexane ring), a cycloalkoxy group (for example, a cyclopentyloxy group and a cyclohexyloxy group), a cycloalkylthio group (for example, a cyclopentylthio group and a cyclohexylthio group), a cyclohexylaminosulfonyl group, a tetrahydronaphthalene ring, a 9,10-dihydroanthracene ring, and a biphenylene ring.

In Formula (1), examples of a non-aromatic heterocycle which is represented by Ar include:

an epoxy ring, an aziridine ring, a thiirane ring, an oxetane ring, an azetidine ring, a thiethane ring, a tetrahydrofuran ring, a dioxolane ring, a pyrrolidine ring, a pyrazolidine ring, an imidazolidine ring, an oxazolidine ring, a tetrahydrothiophene ring, a sulfolane ring, a thiazolidine ring, an ε-caprolactone ring, an ε-caprolactam ring, a piperidine ring, a hexahydropyridazine ring, a hexahydropyrimidine ring, a piperazine ring, a morpholine ring, a tetrahydropyran ring, a 1,3-dioxane ring, a 1,4-dioxane ring, a trioxane ring, a tetrahydrothiopyran ring, a thiomorpholine ring, a thiomorpholine-1,1-dioxide ring, a pyranose ring, a diazabicyclo [2,2,2]-octane ring, a phenoxazine ring, a phenothiazine ring, an oxanthrene ring, a thioxanthene ring, and a phenoxathiin ring.

In Formula (1), these rings represented by Ar may have a substituent represented by R' or R" in Formula (H2) which will be described later, and plural substituents may be further joined to form a ring.

Preferably, Ar is an aromatic hydrocarbon ring or an aromatic heterocycle, and more preferably, Ar is an aromatic hydrocarbon ring. Still more preferably, Ar is a benzene ring.

In Formula (1), $R_1$ and $R_2$ each respectively represent: a hydrogen atom, a halogen atom, a cyano group, an alkyl group, an alkenyl group, an alkynyl group, an alkoxy group, an amino group, a silyl group, an arylalkyl group, an aryl group, a hetero aryl group, a non-aromatic hydrocarbon ring group, or a non-aromatic heterocyclic group. These groups may have a substituent, and at least one of $R_1$ and $R_2$ represents an alkyl group having 2 or more carbon atoms or a cycloalkyl group.

In Formula (1), as an aryl group or a heteroaryl group represented by $R_1$ and $R_2$, it can be cited a monovalent group derived from an aromatic hydrocarbon ring or an aromatic heterocycle represented by Ar in Formula (1).

In Formula (1), as a non-aromatic hydrocarbon ring group or a non-aromatic heterocyclic group represented by $R_1$ and $R_2$, it can be cited a monovalent group derived from a non-aromatic hydrocarbon ring or a non-aromatic heterocycle represented by Ar in Formula (1).

Preferably, $R_1$ and $R_2$ both are an alkyl group having 2 or more carbon atoms or a cycloalkyl group. Further, it is preferable that at least one of $R_1$ and $R_2$ is a branched alkyl group having 3 or more carbon atoms.

In Formula (1), $R_a$, $R_b$ and $R_c$ each respectively represent: a hydrogen atom, a halogen atom, a cyano group, an alkyl group, an alkenyl group, an alkynyl group, an alkoxy group, an amino group, a silyl group, an arylalkyl group, an aryl group, a hetero aryl group, a non-aromatic hydrocarbon ring group, or a non-aromatic heterocyclic group. These groups may have a substituent.

In Formula (1), as an aryl group or a heteroaryl group represented by $R_a$, $R_b$, and $R_c$, it can be cited a monovalent group derived from an aromatic hydrocarbon ring or an aromatic heterocycle represented by Ar in Formula (1).

In Formula (1), as a non-aromatic hydrocarbon ring group or a non-aromatic heterocyclic group represented by $R_a$, $R_b$ and $R_c$, it can be cited a monovalent group derived from a non-aromatic hydrocarbon ring or a non-aromatic heterocycle represented by Ar in Formula (1).

In Formula (1), na and nc each respectively represent an integer of 1 or 2, and nc represents an integer of 1 to 4.

<<Blue Phosphorescence Organic Metal Complex Represented by Formula (2)>>

In Formula (2), ring A, ring B, Ar, $R_1$, $R_2$, $R_a$, $R_b$, $R_c$, na, nb, nc, M, L', m', and n' each are synonymous with ring A, ring B, Ar, $R_1$, $R_2$, $R_a$, $R_b$, $R_c$, na, nb, nc, M, L', m', and n' in Formula (2), respectively.

In Formula (2), specific examples of a monoanionic bidentate ligand are ligands having the following structures.

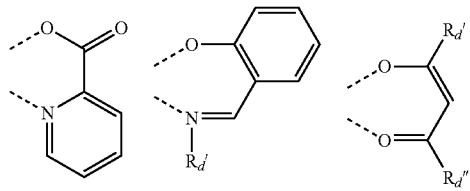

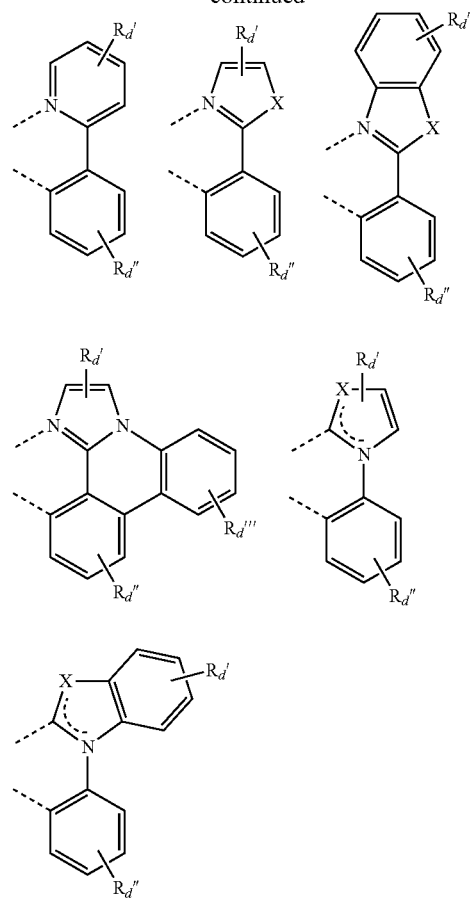

In the above-described structure, Rd', Rd" and Rd''' each respectively represent a hydrogen atom or a substituent, provided that the substituent represented by Rd', Rd" and Rd''' are the same substituents represented by R' and R" in Formula (H2) which will be described later.

In Formula (2), M represents a transition metal atom having an atomic number of 40 or more and belonging to groups 8 to 10 in the periodic table. In particular, M is preferably Os, Ir, or Pt, and more preferably M is Ir.

In Formula (2), m' represents an integer of 0 to 2, n' represents an integer of 1 to 3, provided that m'+n' is equal to 2 or 3. Preferably, n' represents an integer of 2 or 3, and m' represents an integer of 0.

Among the blue phosphorescence organic metal complexes represented by Formula (2), preferable are organic metal complexes represented by Formula (2-1).

<<Blue Phosphorescence Organic Metal Complex Represented by Formula (2-1)>>

In Formula (2-1), Ar, $R_1$, $R_2$, $R_a$, $R_b$, $R_c$, na, nb, nc, M, L', m', and n' each are synonymous with Ar, $R_1$, $R_2$, $R_a$, $R_b$, $R_c$, na, nb, nc, M, L', m', and n' in Formula (2), respectively.

The compounds represented by Formulas (1), (2) and (2-1) of the present invention can be synthesized by referring to the known method described in WO 2006/121811, for example.

Specific examples of a dopant compound, which are preferably used in the present invention, will be shown below, however, the present invention is not limited to these.

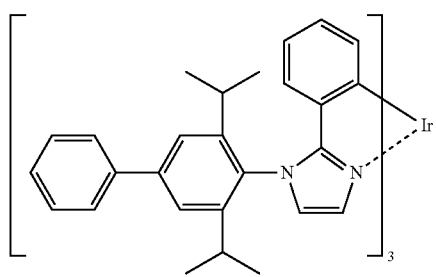
DP-1
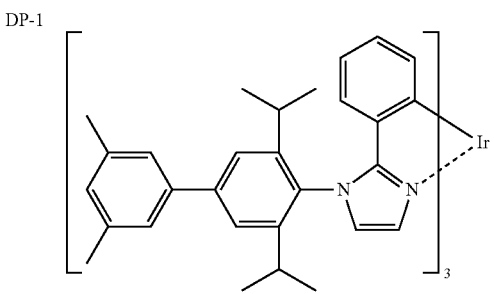
DP-2
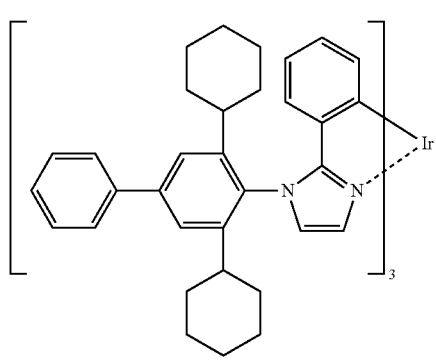
DP-3
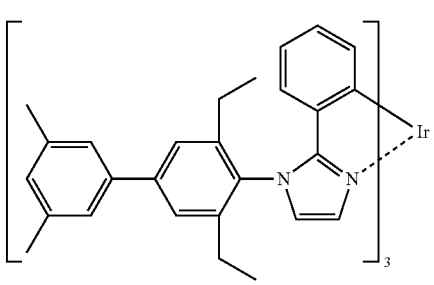
DP-4
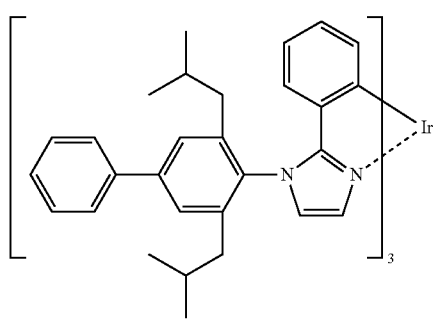
DP-5
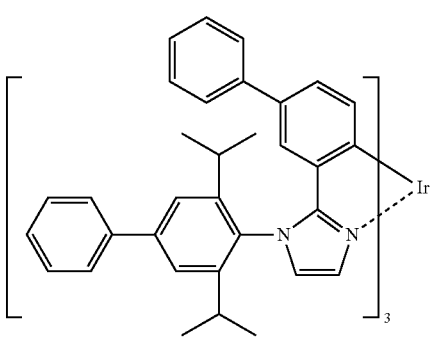
DP-6
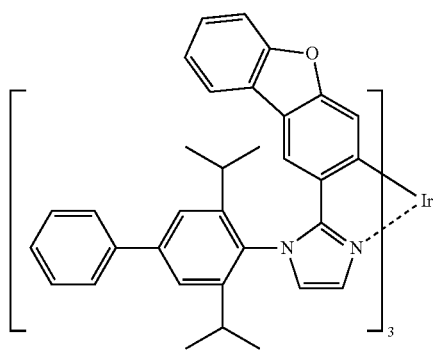
DP-7
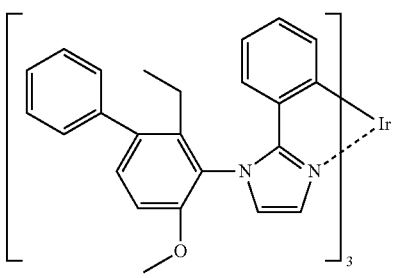
DP-8

-continued
DP-9
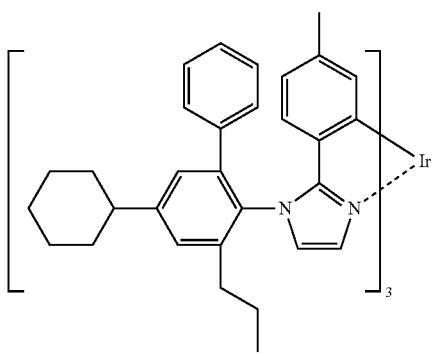
DP-10
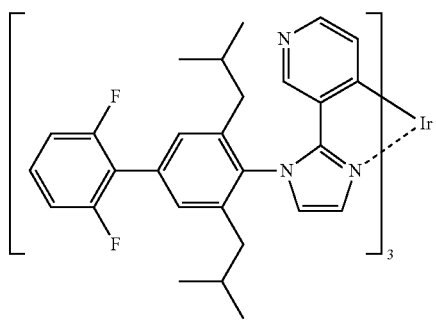
DP-11
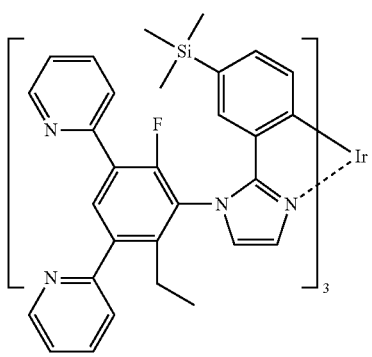
DP-12
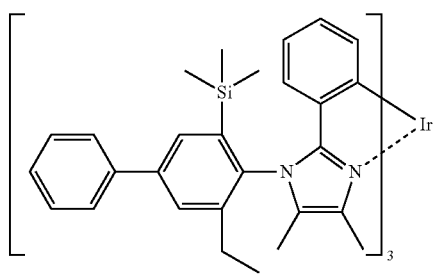
DP-13
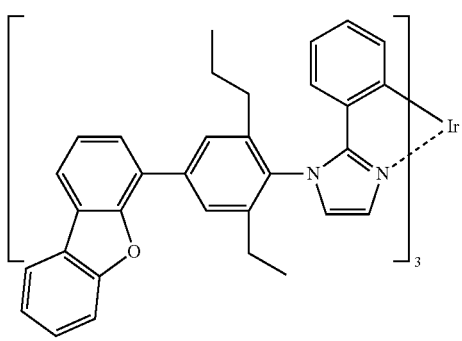
DP-14
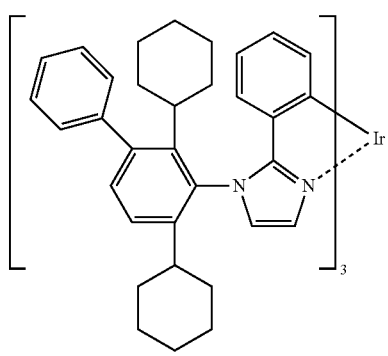
DP-15
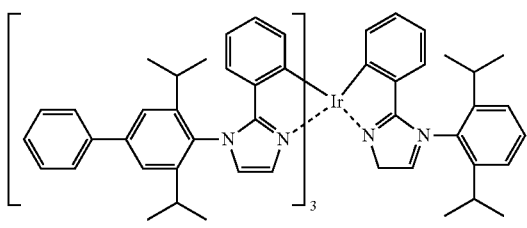
DP-16
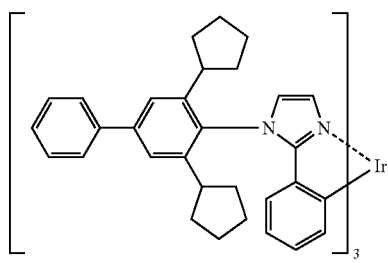

-continued
DP-17
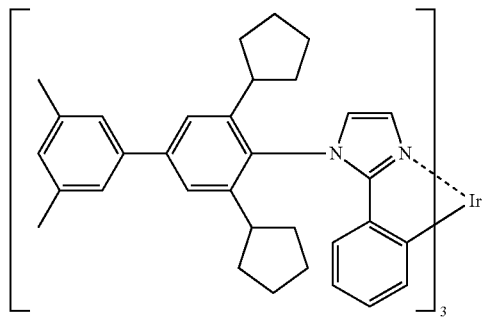
DP-18
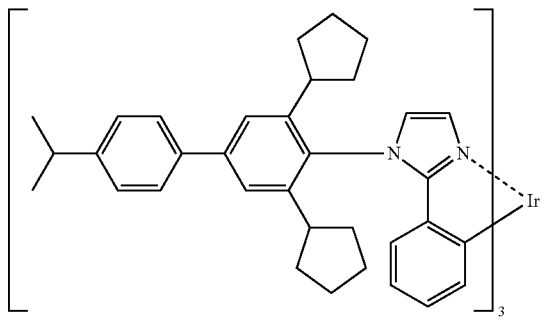
DP-19
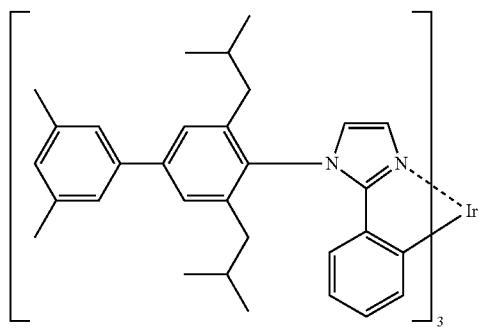
DP-20
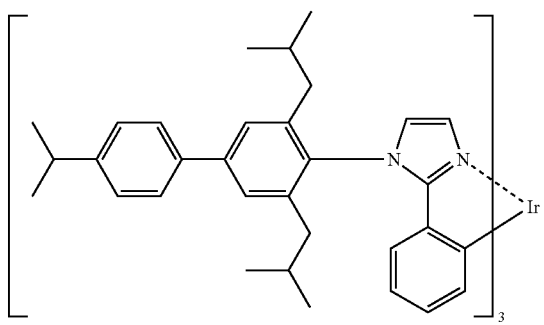
DP-21
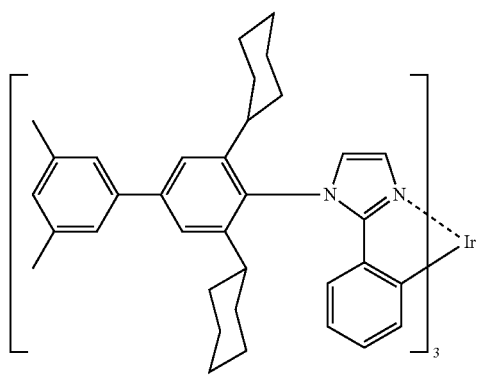
DP-22
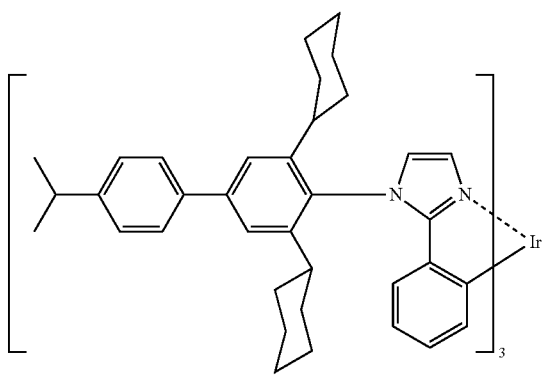
DP-23
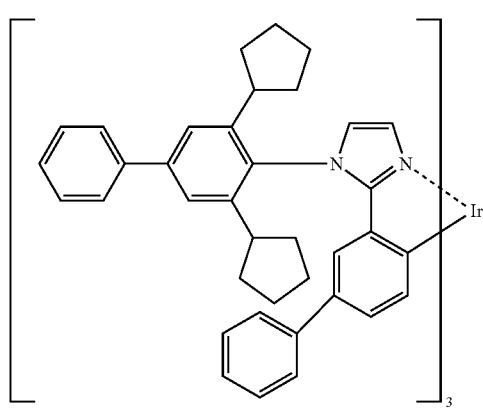
DP-24
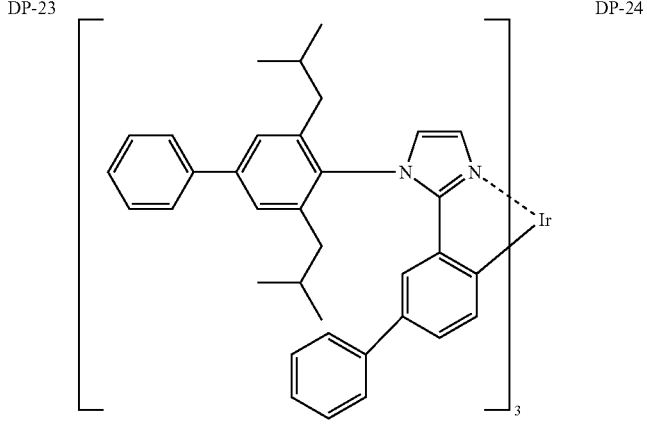

-continued
DP-25
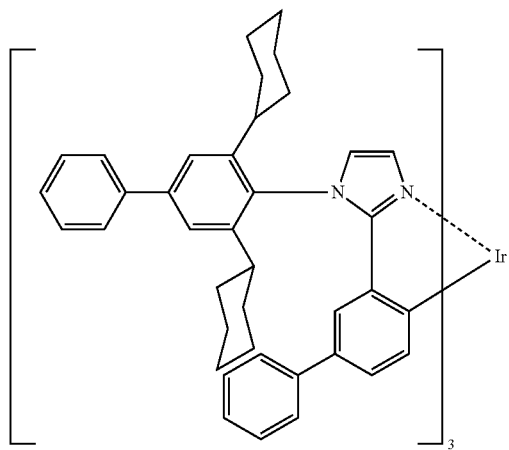
DP-26
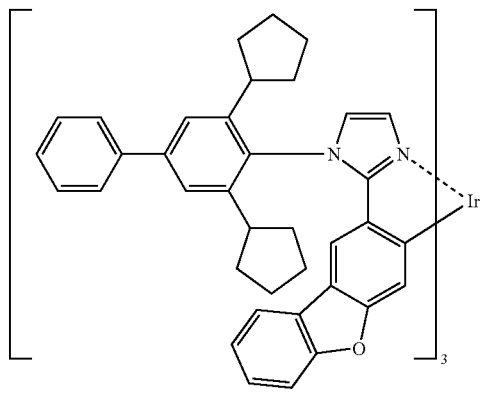
DP-27
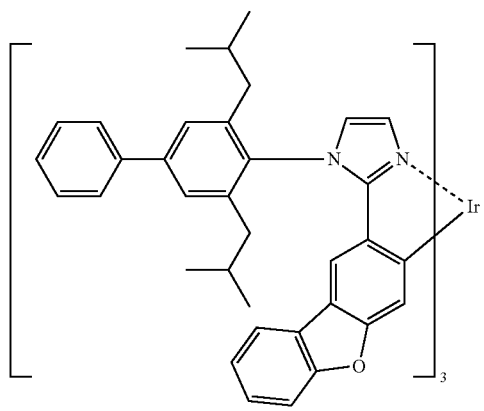
DP-28
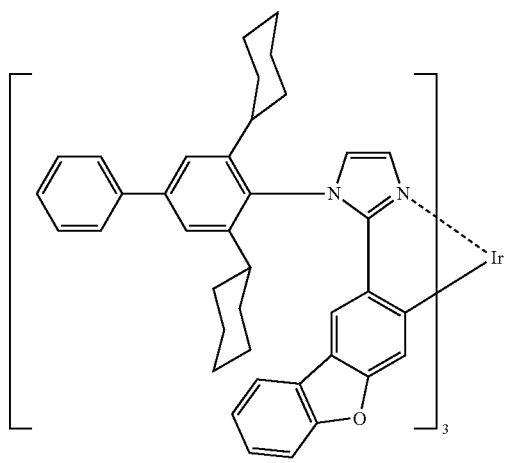
DP-29
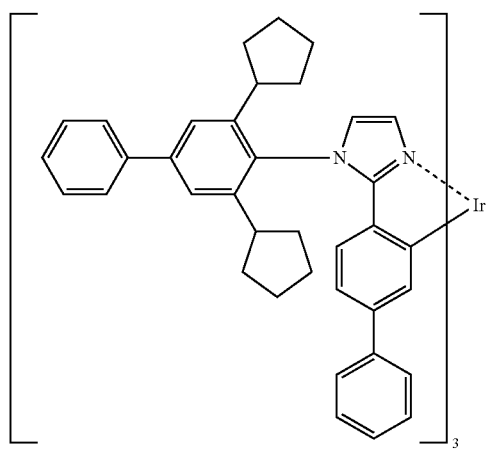
DP-30
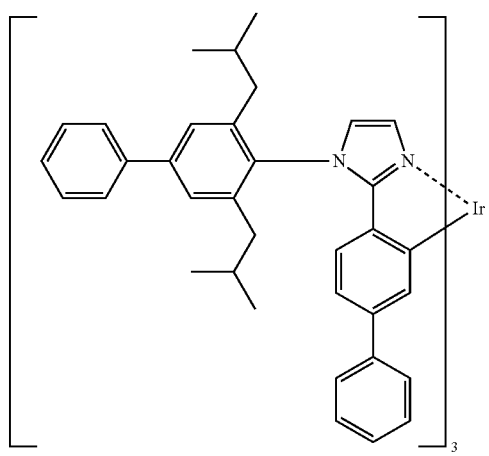

-continued
DP-31
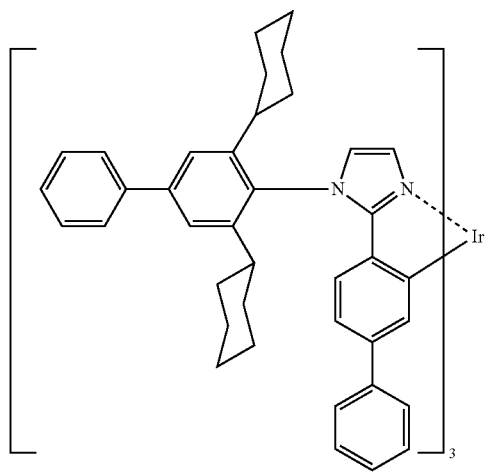
DP-32
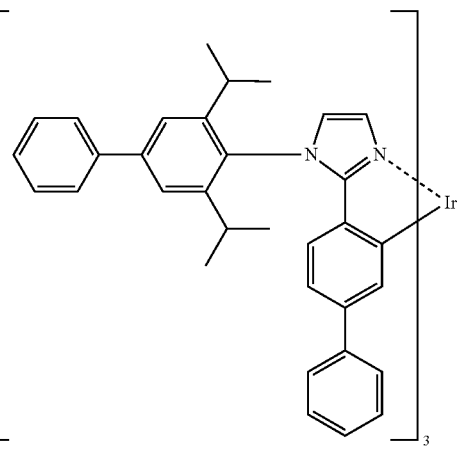
DP-33
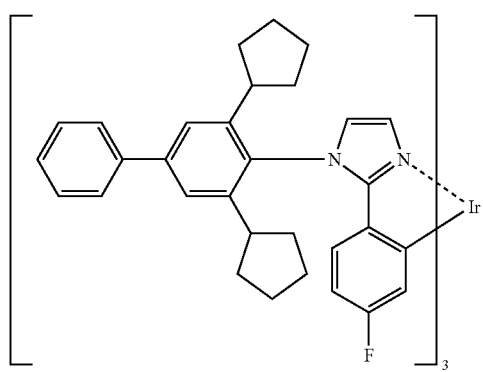
DP-34
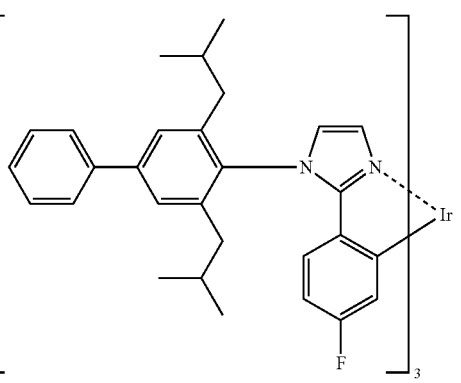
DP-35
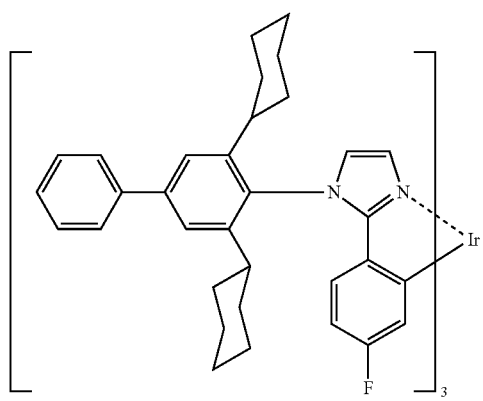
DP-36
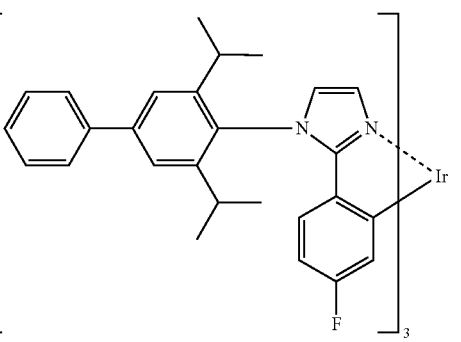
DP-37
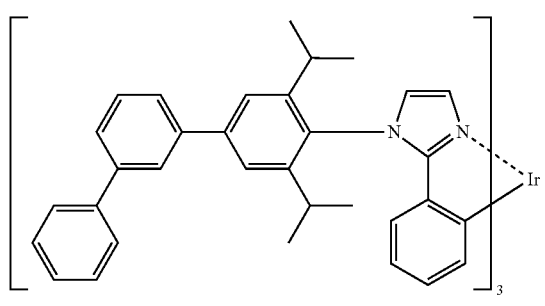
DP-38
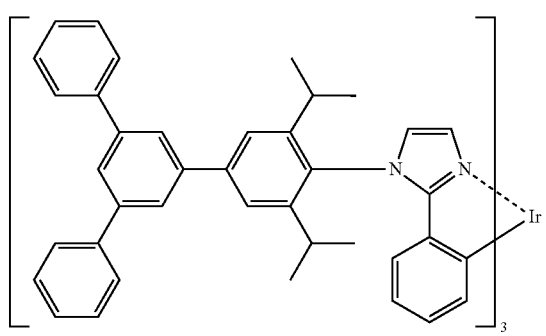

-continued
DP-39
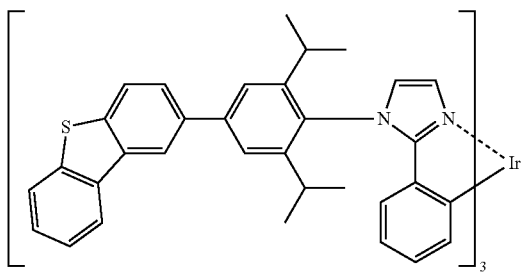
DP-40
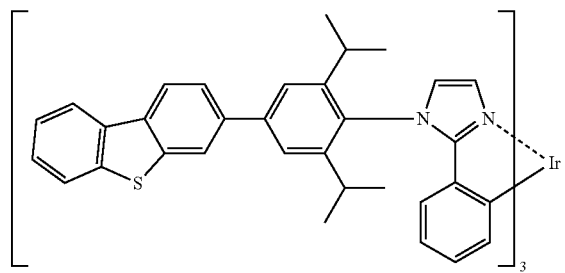
DP-41
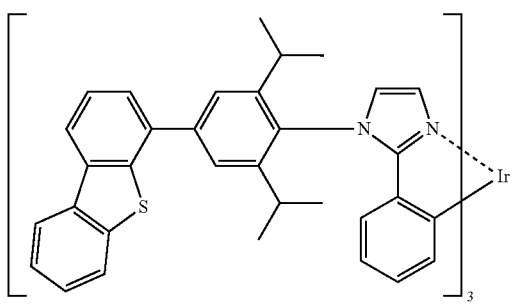
DP-42
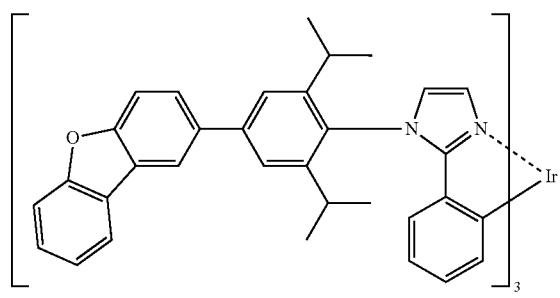
DP-43
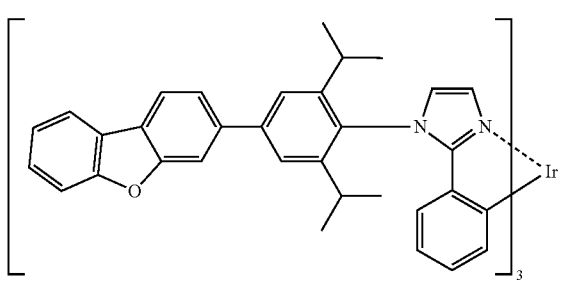
DP-44
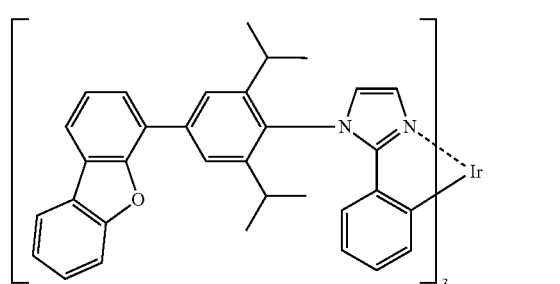
DP-45
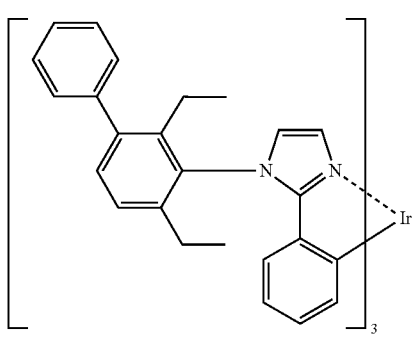
DP-46
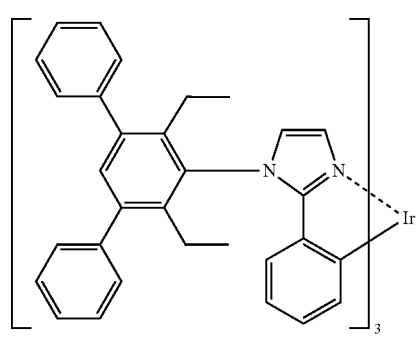
DP-47
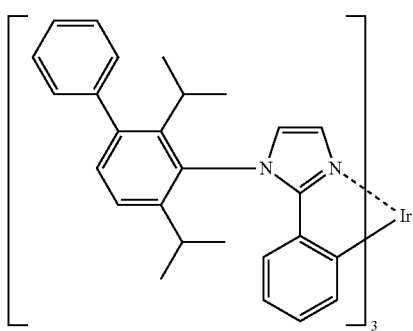
DP-48
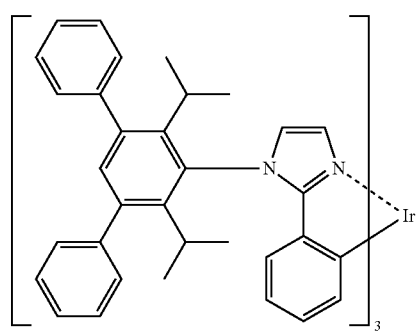

-continued
DP-49
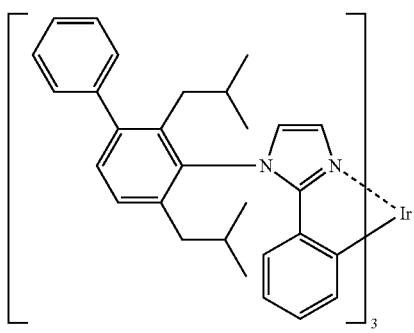
DP-50
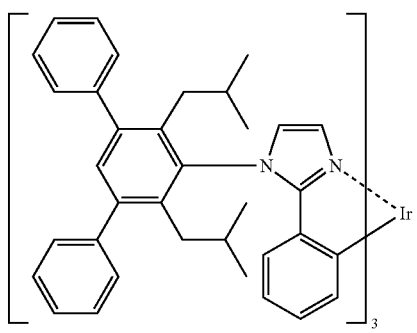
DP-51
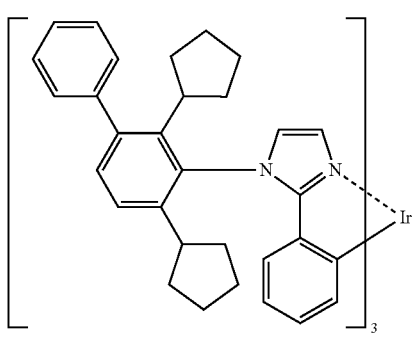
DP-52
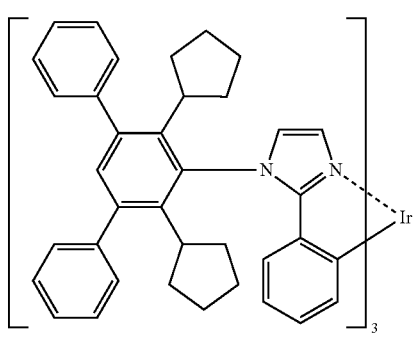
DP-53
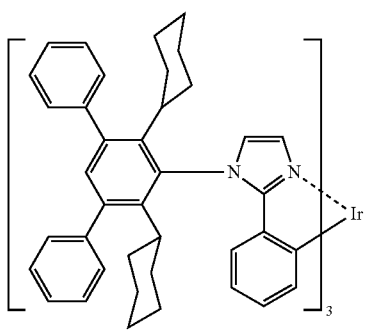
DP-54
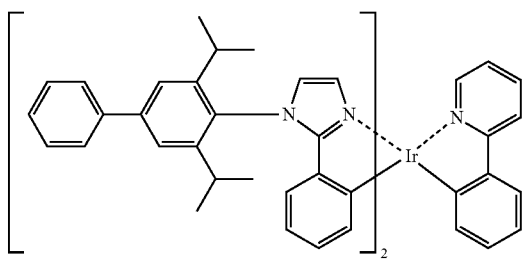
DP-55
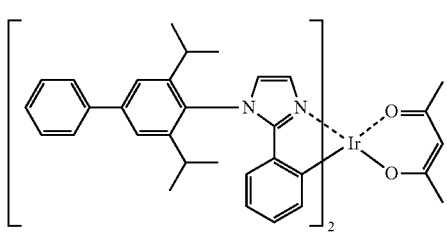
DP-56
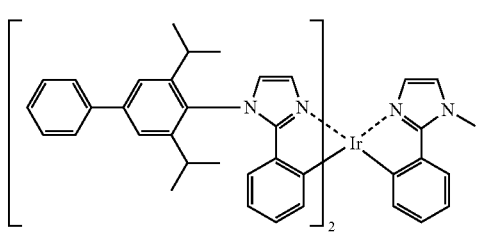
DP-57
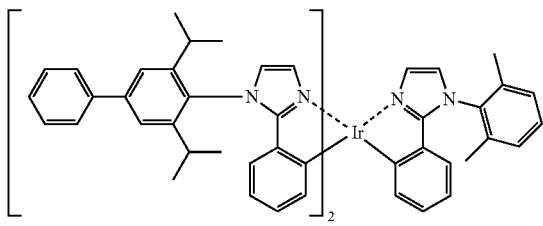
DP-58
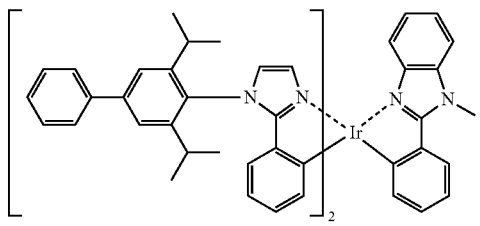

-continued
DP-59
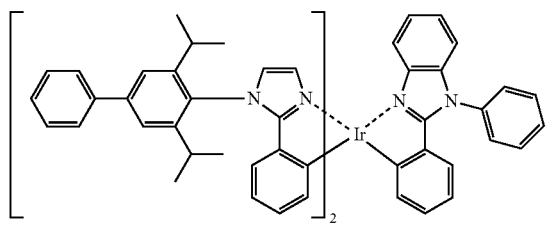
DP-60
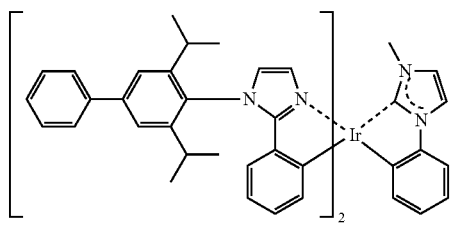
DP-61
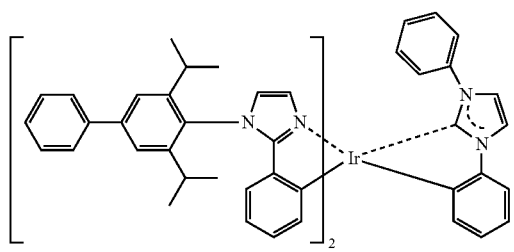
DP-62
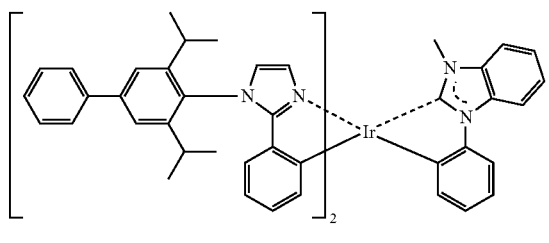
DP-63
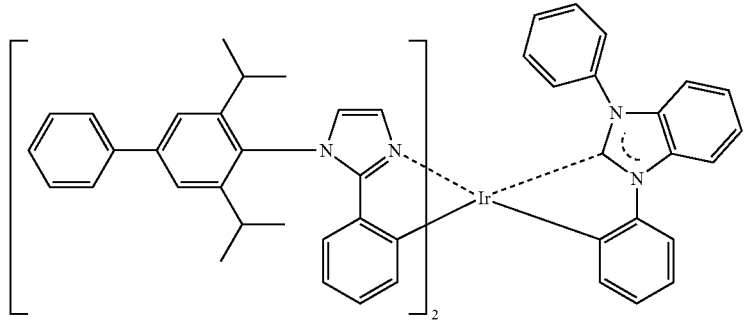
DP-64
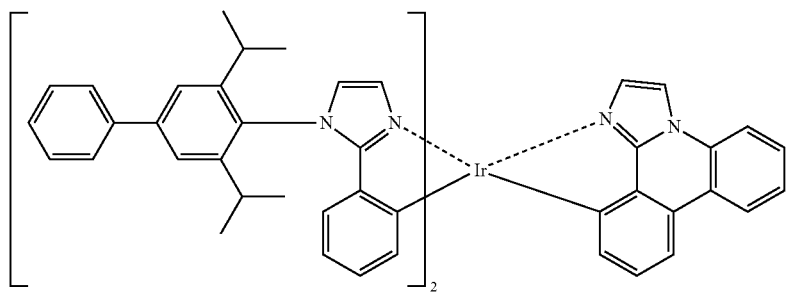
DP-65
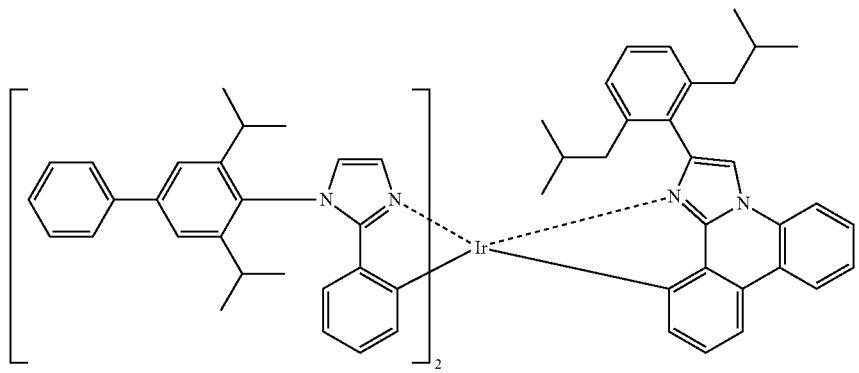

-continued
DP-66
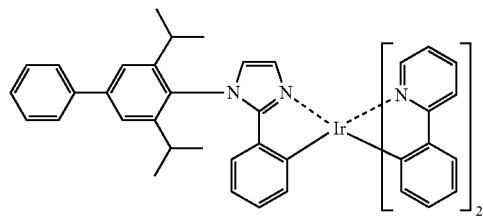
DP-67
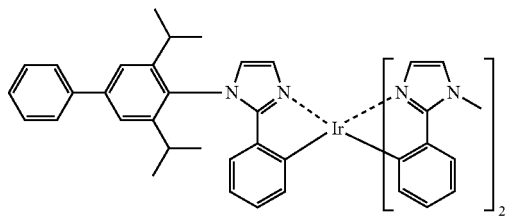
DP-68
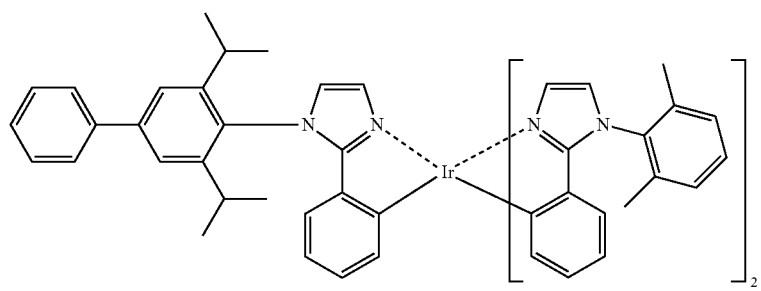
DP-69
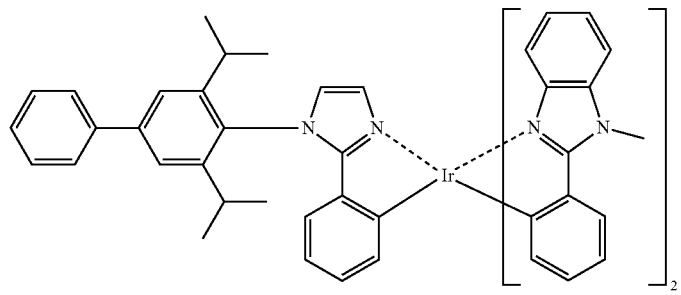
DP-70
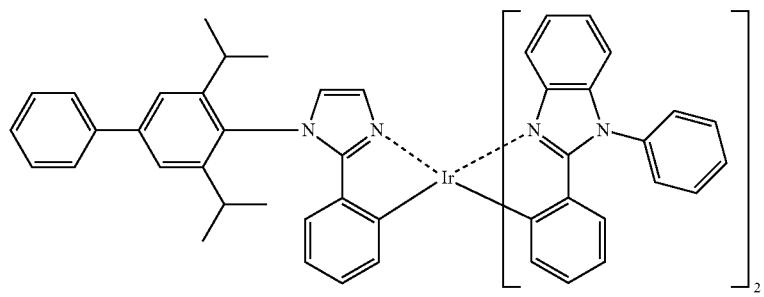
DP-71
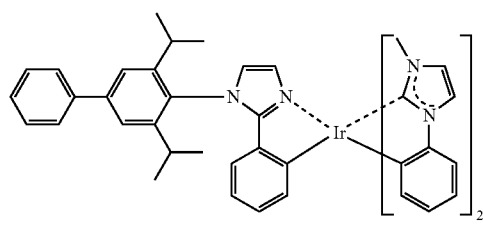
DP-72
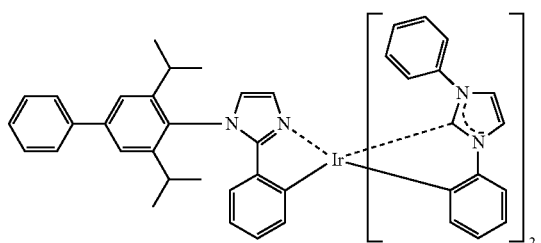

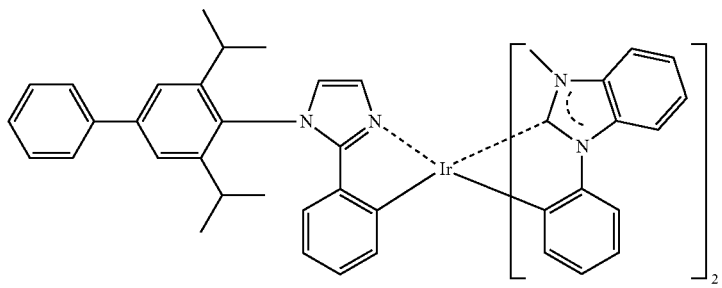

DP-73

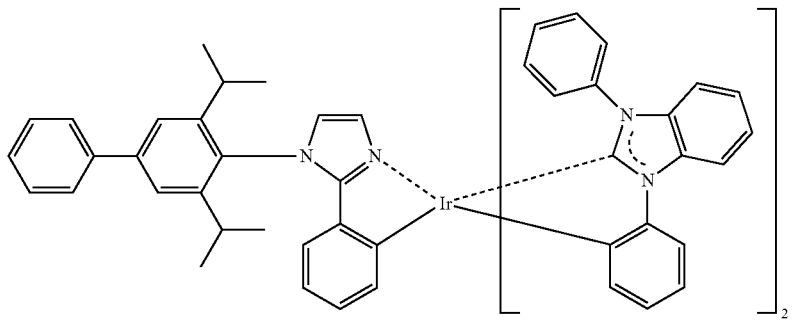

DP-74

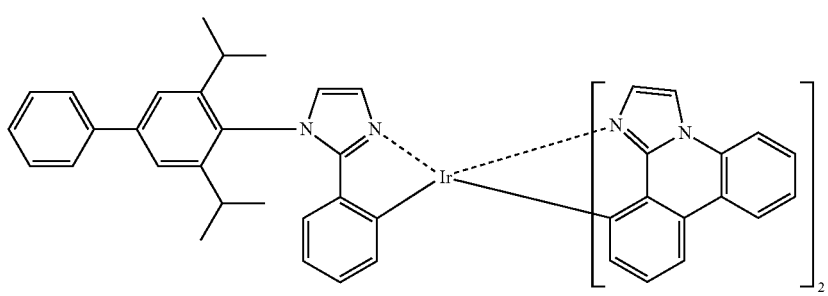

DP-75

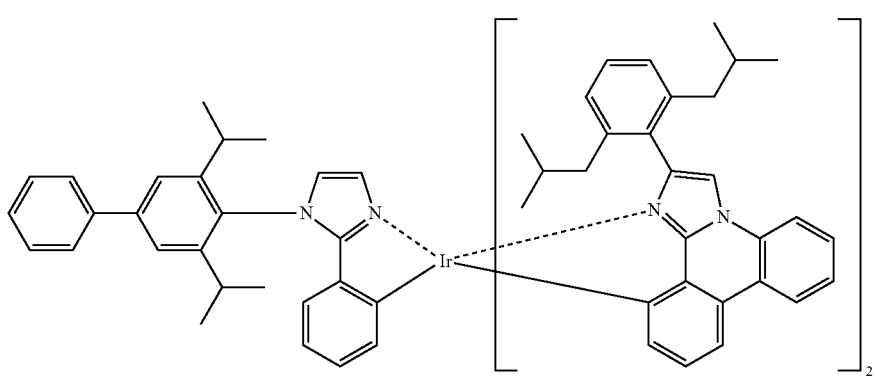

DP-76

<<Compound Represented by Formula (H1)>>

In Formula (H1), examples of an aromatic hydrocarbon ring or aromatic heterocycle which may have a substituent represented by Q are cited the same aromatic hydrocarbon ring or aromatic heterocycle represented by Ar in Formula (1).

Examples of a substituent on an aromatic hydrocarbon ring or aromatic heterocycle of Q are cited the same substituents represented by R' and R" in Formula (H2) which will be described later.

In Formula (H1), examples of a substituted or non-substituted condensed heterocycle which is represented by "L" include: an indole ring a benzimidazole ring, a benzothiazole ring, a benzoxazole ring, a quinoxaline ring, a quinazoline ring, a phthalazine ring, a thienothiophene ring, a condensed aromatic heterocycle containing 3 or more rings (here, as a condensed aromatic heterocycle containing 3 or more rings, it is preferable that it is an aromatic heterocycle containing at least one hetero atom selected from N, O and S as a constituting element to form a condensed ring), specifically, a carbazole ring, and an azacarbazole ring (indicating a ring structure in which one or plural carbon atoms in the ring constituting the aforesaid carbazole ring is replaced with one or plural nitrogen atoms), a dibenzosilole ring, a dibenzofuran ring, a dibenzothiophene ring, a ring in which one or more arbitral carbon atoms which constitutes a benzothiophene ring or a dibenzofuran ring are replaced with nitrogen atoms, a benzodifuran ring, a benzodithiophene ring, an acridine ring, a benzoquinoline ring, a phenazine ring, a phenanthridine ring, a phenanthroline ring, a cycladine ring, a quindoline ring, a thebenidine ring, a quinindoline ring, a triphenodithiazine ring, a triphenodioxazine ring, a phenanthrazine ring, an anthrazine ring, a perimidine ring, a naphthofuran ring, a naphthothiophene ring, a naphthodifuran ring, a naphthodithiophene ring, an anthrafuran ring, an anthradifuran ring, an anthrathiophene ring, an anthradithiophene ring, a thianthrene ring, a phenoxathiine ring, a dibenzocarbazole ring, an indrocarbazole ring and a dithienobenzene ring.

Examples of a substituent on a condensed aromatic heterocycle in L are cited the same substituents represented by R' and R" in Formula (H2) which will be described later.

L is preferably a condensed aromatic heterocycle formed with 3 or more rings. In particular, L is preferably an aromatic heterocycle represented by Formula (H2').

In Formula (H2'), A' represents an oxygen atom, a sulfur atom, or NR'''; $A'_{11}$ to $A'_{18}$ each respectively represent a nitrogen atom or CR''''. Preferably, all of $A'_{11}$ to $A'_{18}$ represent CR''''.

In Formula (H2'), R''' and R'''' each respectively represent a linking position, a hydrogen atom, or a substituent, provided that when there are a plurality of CR''''s, each CR'''' may be the same or different, and the plurality of CR''''s may be joined to form a ring.

Examples of a substituent represented by R''' and R'''' are cited the same substituents represented by R' and R" in Formula (H2) which will be described later.

In Formula (H1), n and m each respectively represent an integer of 1 to 3, provided that when n is 2 or more, a plurality of Ls may be the same or different with each other, when m is 2 or more, a plurality of Qs may be the same or different with each other. Preferably, m+n is equal to 3 or more.

The compound represented by Formula (H1) includes a structure represented by Formula (H2) in the molecule.

In Formula (H2), A represents an oxygen atom, a sulfur atom, NR', or CR"=CR"; and $A_{11}$ to $A_{23}$ each respectively represent a nitrogen atom or CR". Preferably, A represents an oxygen atom, a sulfur atom, or NR'. In addition, preferably, all of $A_{11}$ to $A_{23}$ represent CR".

In Formula (H2), R' and R" each respectively represent a linking position to other group, a hydrogen atom, or a substituent, provided that when there are a plurality of CR"s, each CR" may be the same or different, and the plurality of CR"s may be joined to form a ring.

In Formula (H2), examples of a substituted represented by R' and R" include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); an alkenyl group (for example, a vinyl group and an allyl group); an alkynyl group (for example, an ethynyl group and a propargyl group); a non-aromatic hydrocarbon ring with a mono valence derived from the following: a cycloalkyl group (for example, a cyclopentyl group and a cyclohexyl group), a cycloalkoxy group (for example, a cyclopentyloxy group and a cyclohexyloxy group), a cycloalkylthio group (for example, a cyclopentylthio group and a cyclohexylthio group), a tetrahydronaphthalene ring, a 9,10-dihydroanthracene ring and a biphenylene ring); a non-aromatic heterocycle with a mono valence derived from the following: an epoxy ring, an aziridine ring, a thiirane ring, an oxetane ring, an azetidine ring, a thiethane ring, a tetrahydrofuran ring, a dioxolane ring, a pyrrolidine ring, a pyrazolidine ring, an imidazolidine ring, an oxazolidine ring, a tetrahydrothiophene ring, a sulfolane ring, a thiazolidine ring, an ε-caprolactone ring, an ε-caprolactam ring, a piperidine ring, a hexahydropyridazine ring, a hexahydropyrimidine ring, a piperazine ring, a morpholine ring, a tetrahydropyran ring, a 1,3-dioxane ring, a 1,4-dioxane ring, a trioxane ring, a tetrahydrothiopyran ring, a thiomorpholine ring, a thiomorpholine-1,1-dioxide ring, a pyranose ring, a diazabicyclo [2,2,2]-octane ring, a phenoxazine ring, a phenothiazine ring, an oxanthrene ring, a thioxanthene ring, and a phenoxathiin ring; an aromatic hydrocarbon group with a mono valence derived from the following: a benzene ring, a biphenyl ring, a naphthalene ring, an azulene ring, an anthracene ring, a phenanthrene ring, a pyrene ring, a chrysene ring, a naphthacene ring, a triphenylene ring, o-terphenyl ring, m-terphenyl ring, p-terphenyl ring, an acenaphthene ring, a coronene ring, a fluorene ring, a fluoanthrene ring, a naphthacene ring, a pentacene ring, a perylene ring, a pentaphene ring, a picene ring, a pyrene ring, a pyranthrene ring and an anthraanthrene ring; an aromatic heterocycle with a mono valence derived from the following: a silole ring, a furan ring, a thiophene ring, an oxazole ring, a pyrrole ring, a pyridine ring, a pyridazine ring, a pyrimidine ring, a pyrazine ring, a triazine ring, an oxadiazole ring, a triazole ring, an imidazole ring, a pyrazole ring, a thiazole ring, an indole ring, a benzimidazole ring, a benzothiazole ring, a benzoxazole ring, a quinoxaline ring, a quinazoline ring, a phthalazine ring, a thienothiophene ring, a carbazole ring, and an azacarbazole ring (indicating a ring structure in which one or plural carbon atoms in the ring constituting the aforesaid carbazole ring is replaced with one or plural nitrogen atoms), a dibenzosilole ring, a dibenzofuran ring, a dibenzothiophene ring, a ring in which one or more arbitral carbon atoms which constitutes a benzothiophene ring or a dibenzofuran ring are replaced with nitrogen atoms, a benzodifuran ring, a benzodithiophene ring, an acridine ring, a benzoquinoline ring, a phenazine ring, a phenanthridine ring, a phenanthroline ring, a cycladine ring, a quindoline ring, a thebenidine ring, a quinindoline ring, a triphenodithiazine ring, a triphenodioxazine ring, a phenanthrazine ring, an anthrazine ring, a perimidine ring, a naphthofuran ring, a naphthothiophene ring, a naphthodifuran ring, a naphthodithiophene ring, an anthrafuran ring, an anthradifuran ring, an anthrathiophene ring, an anthradithiophene ring, a thianthrene ring, a phenoxathiine ring, a dibenzocarbazole ring, an indrocarbazole ring and a dithienobenzene ring; an alkoxyl group (for example, a methoxy group, an ethoxy group, a propyloxy group, a pentyloxy group, an hexyloxy group, an octyloxy group, and a dodecyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group, and a dodecylthio group); an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group, and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); an acyloxy group (for example, an acetyloxy group, an ethylcarbonyloxy group, a butylcarbonyloxy group, an octylcarbonyloxy group, a dodecylcarbonyloxy group, and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group, and a 2-oyridylaminoureido group); a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group); an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group, an arylsulfonyl group or a heteroarylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylamino group, a dodecylamino group, an anilino group, a naphthylamino group, and a 2-pyridylamino group); a halogen atom (for example, a fluorine atom, a chlorine atom, and a bromine atom); a fluoro hydrocarbon group (for example, a fluoromethyl group, trifluoromethyl group, a pentafluoroethyl group, and a pentafluorophenyl group); a cyano group; a nitro group; a hydroxyl group; a mercapto group; a silyl group (for example, a trimethylsilyl group, a triisopropylsilyl group, a triphenylsilyl group, and a phenyldiethylsilyl group); and a phosphono group.

The structure represented by Formula (H2) is preferably represented by Formula (H2-1) or Formula (H2-2)

Formula (H2-1)

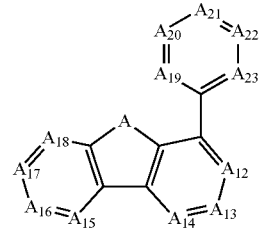

Formula (H2-2)

In Formula (H2-1) or Formula (H2-2), A and $A_{11}$ to $A_{23}$ each are synonymous with A and $A_{11}$ to $A_{23}$ in Formula (H2), respectively.

The compounds represented by Formula (H1) are preferably further represented by Formulas (H3) to (H102).

In Formulas (H3) to (H102), L and Q each are synonymous with L and Q in Formula (H1).

In Formulas (H3) to (H102), at least on of Ls is preferably a carbazole ring. Further, it is preferable that at least one of L-Q in Formulas (H1) and (H13) to (H102) is represented by any one of Formulas (H2), (H2-1) and (H2-2).

It is preferable that a host compound has a high glass transition temperature (Tg) from the viewpoints of aging stability and aptitude for producing an element. Preferably, Tg of a compound represented by Formula (H1) is 100° C. or more, more preferably, it is 120° C. or more, and still more preferably, it is 130° C. or more.

It is preferable that the compound represented by Formula (H1) has a higher excited triplet energy (T1) than the blue phosphorescence organic metal complex which is used in combination of the compound represented by Formula (H1). Preferably, T1 of the compound represented by Formula (H1) is 2.7 eV or more, more preferably, it is 2.75 eV or more, and still more preferably, it is 2.8 eV or more.

Here, T1 the compound represented by Formula (H1) is defined as a value calculated employing Gaussian98 (Gauaaian98, Revision A. 11.4, M. J. Frisch, et al., Gaussian, Inc., Pittsburgh Pa., 2002), which is a molecular orbital calculation software, produced by Gaussian Co. in the United State of America, and by employing B3LYP/6-31G* as a key word to obtain an optimized structure, then the value (in terms of corresponding eV unit) is computed. The background, in which the resulting calculated values are effective, is that the calculated values obtained by the above method exhibit high relationship with the experimental values.

The molecular weight of the compound represented by Formula (H1) is preferably 500 to 2,000, and it is more preferably 700 to 1,500.

Specific examples of a compound represented by Formulas (H3) to (H102) of the present invention are shown below, however, the present invention is not limited to these.

HS-1

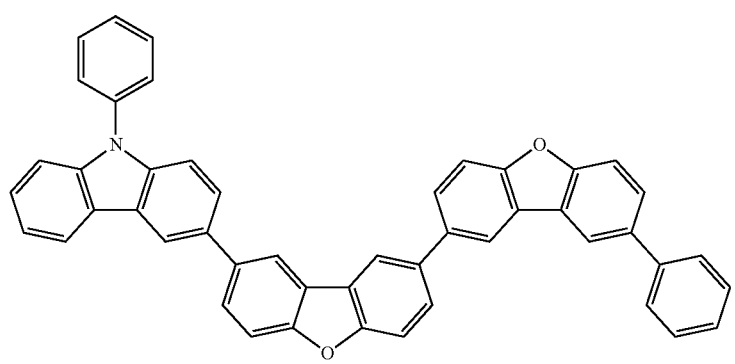

-continued
HS-2
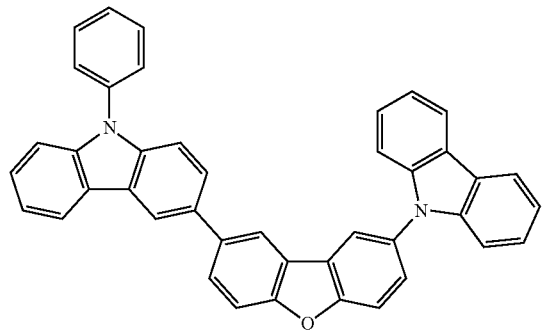
HS-3
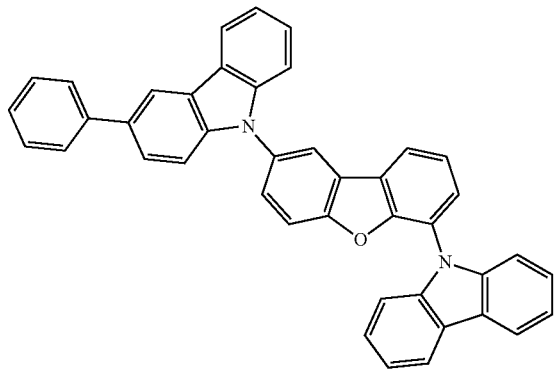
HS-4
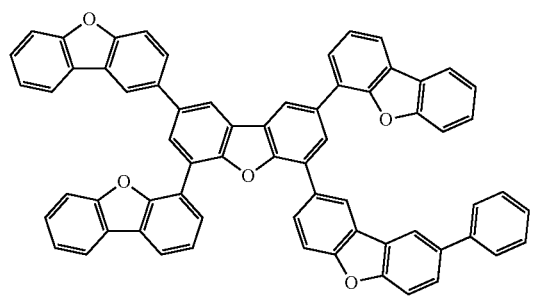
HS-5
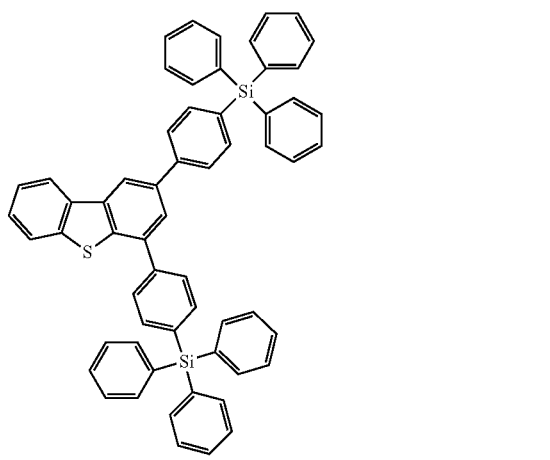
HS-6
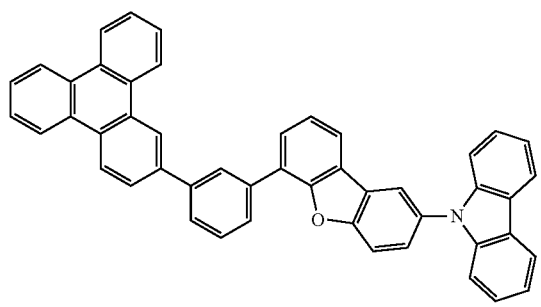
HS-7
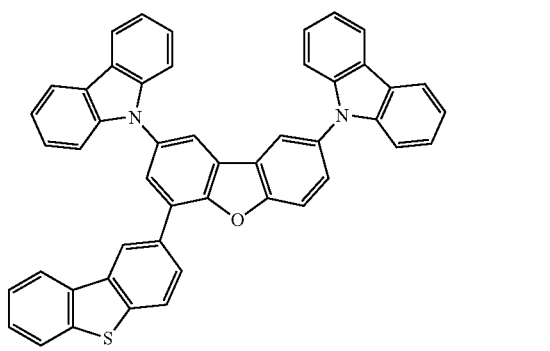
HS-8
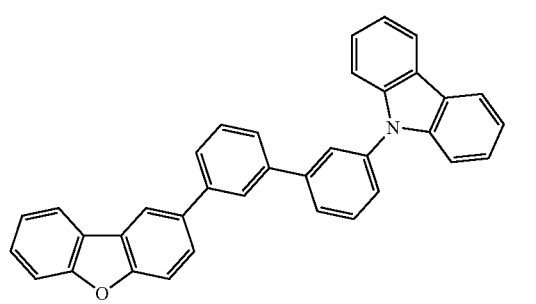
HS-9
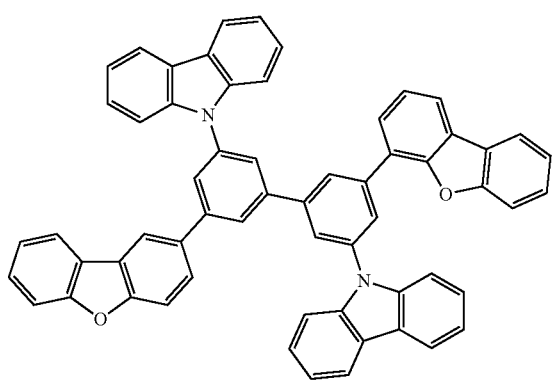

-continued
HS-10
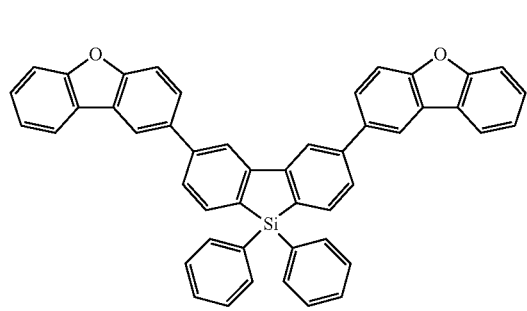
HS-11
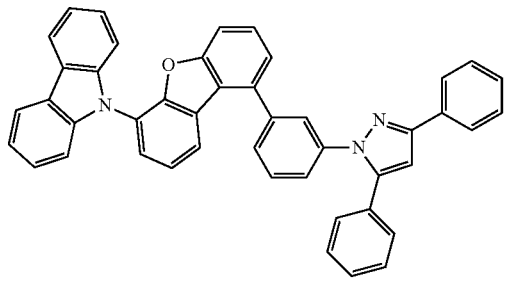
HS-12
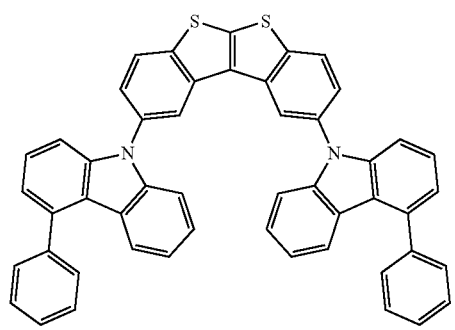
HS-13
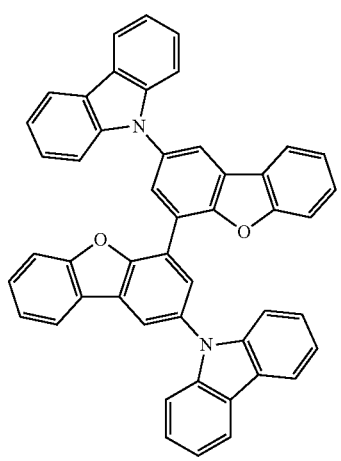
HS-14
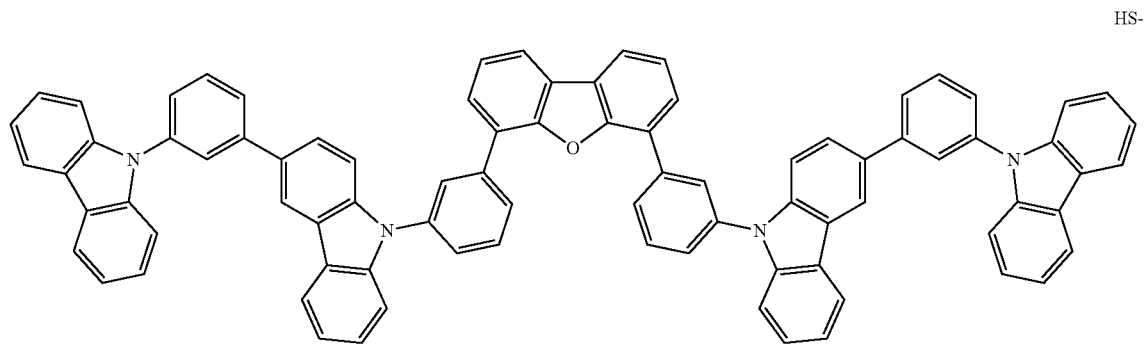

-continued
HS-15
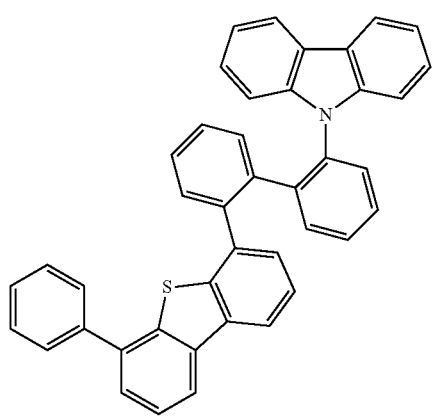
HS-16
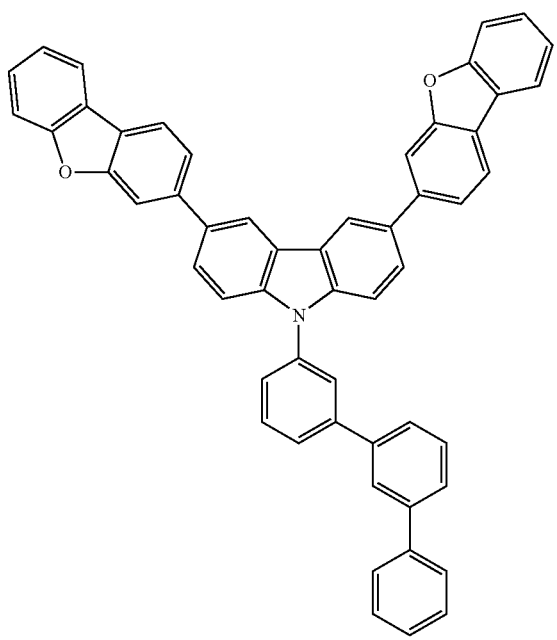
HS-17
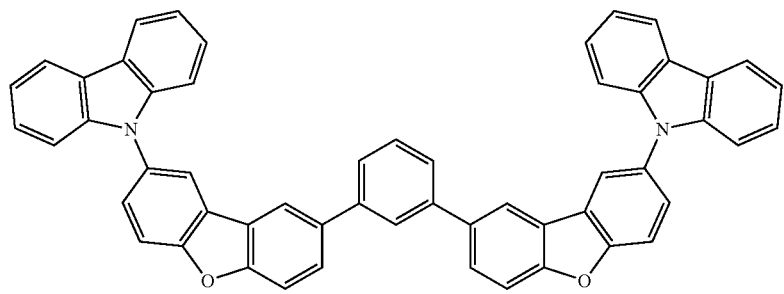
HS-18
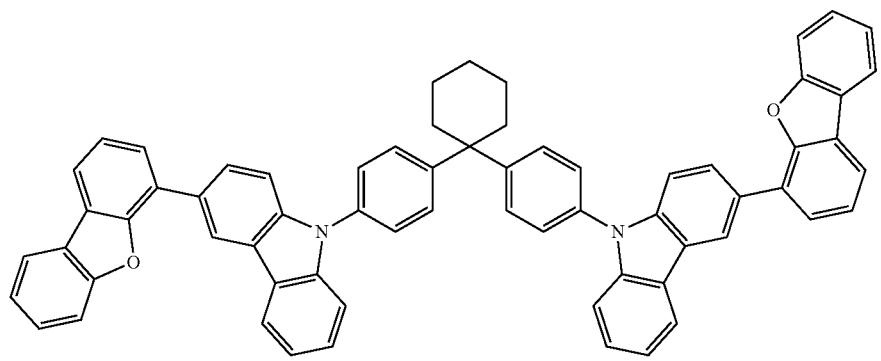

-continued
HS-19
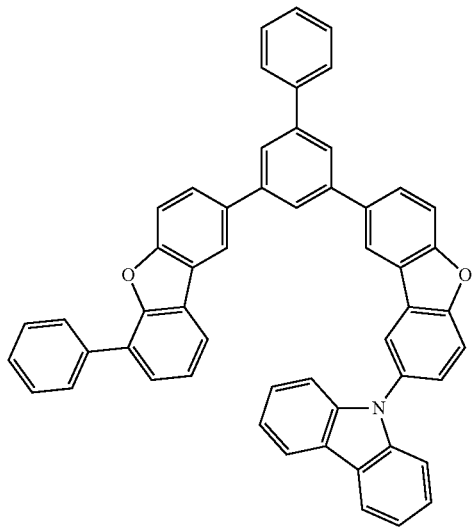
HS-20
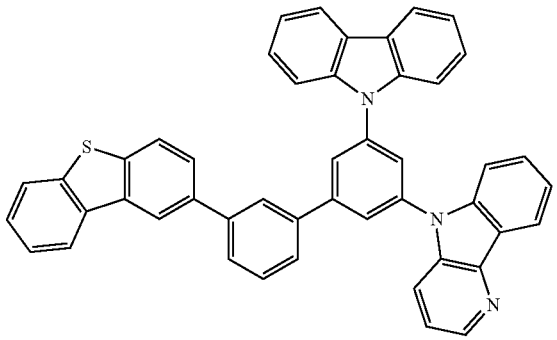
HS-21
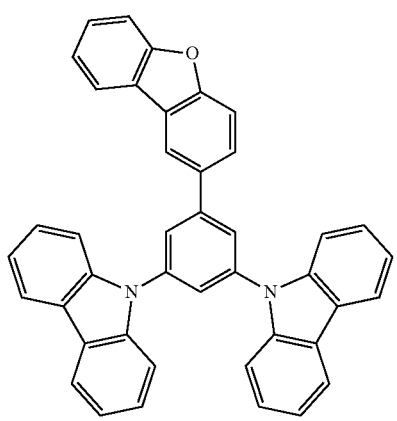
HS-22
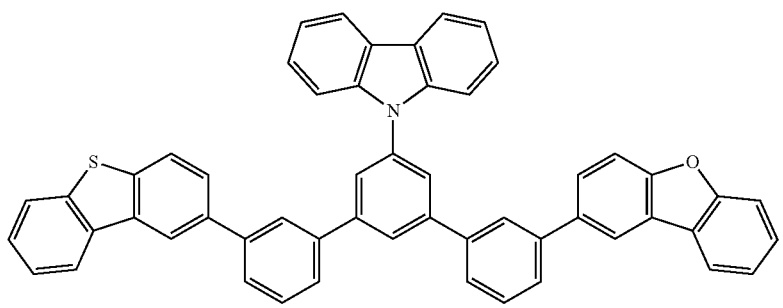
HS-23
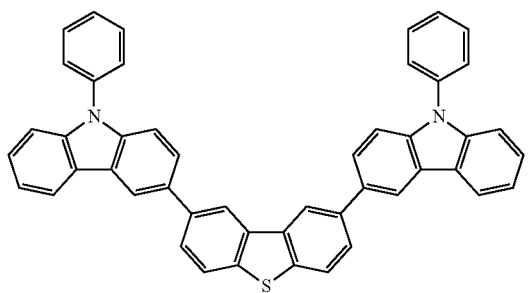
HS-24
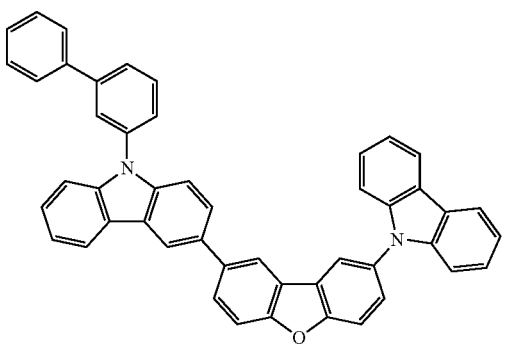

-continued
HS-25
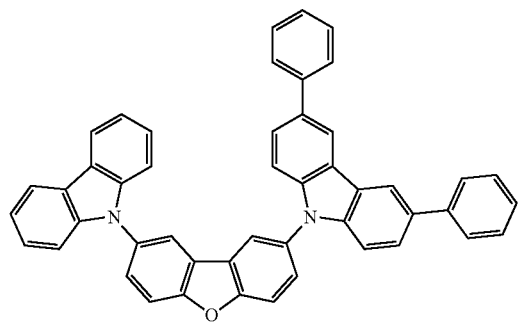
HS-26
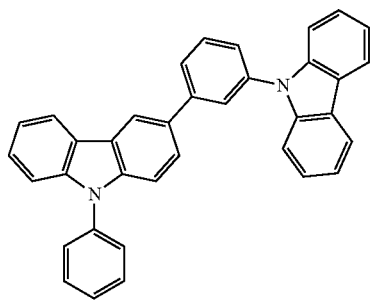
HS-27
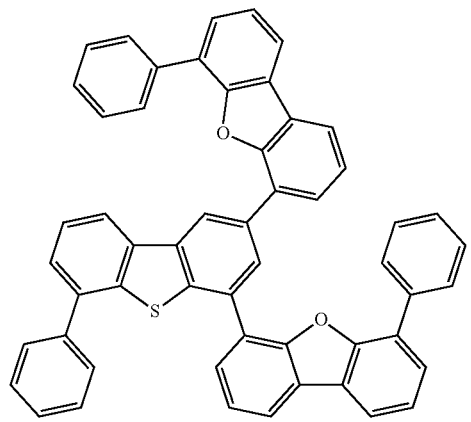
HS-28
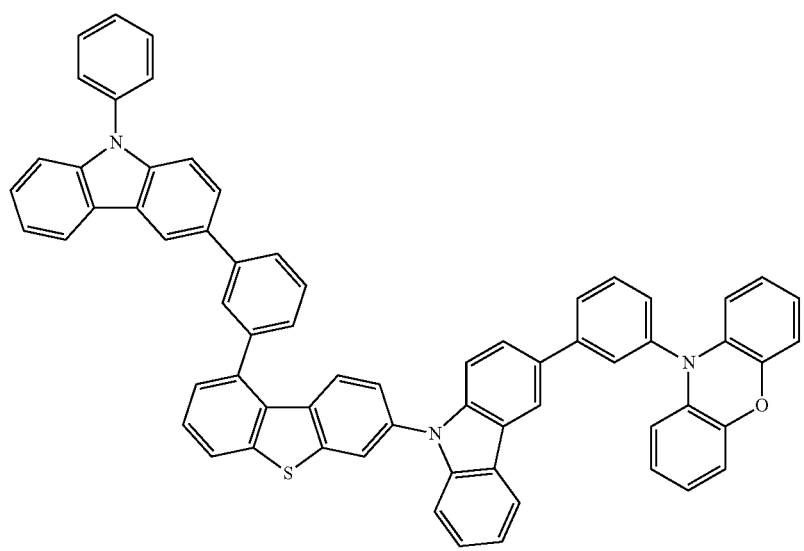

-continued
HS-29
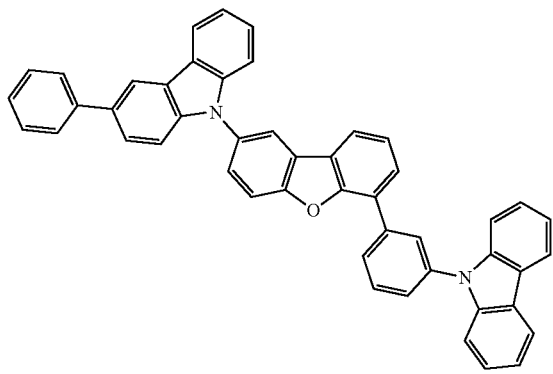
HS-30
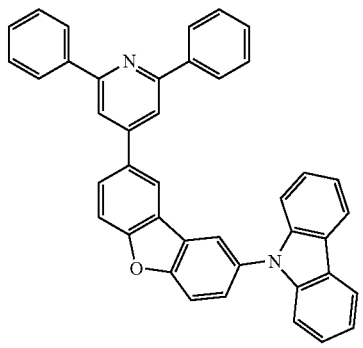
HS-31
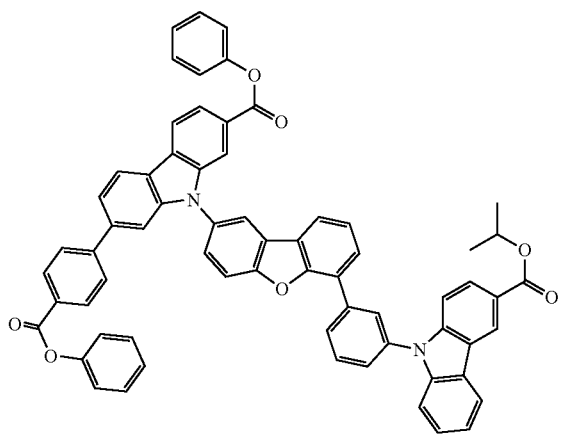
HS-32
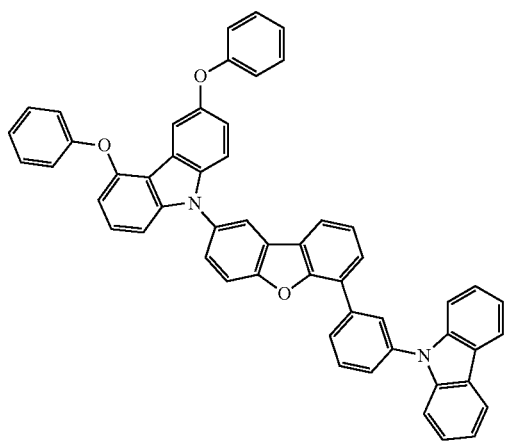
HS-33
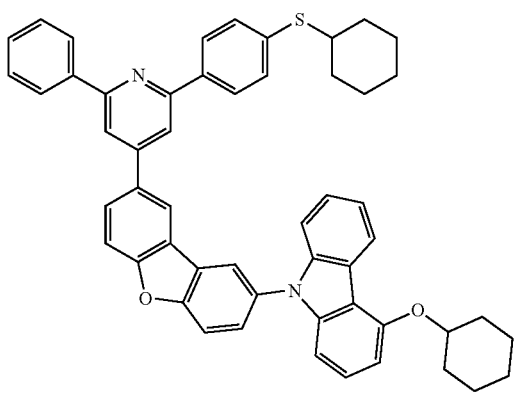
HS-34
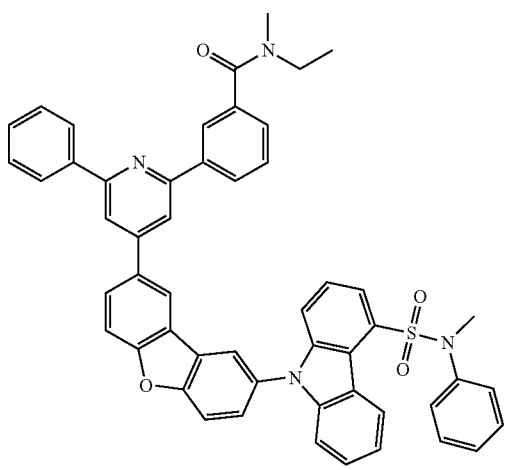

-continued
HS-35
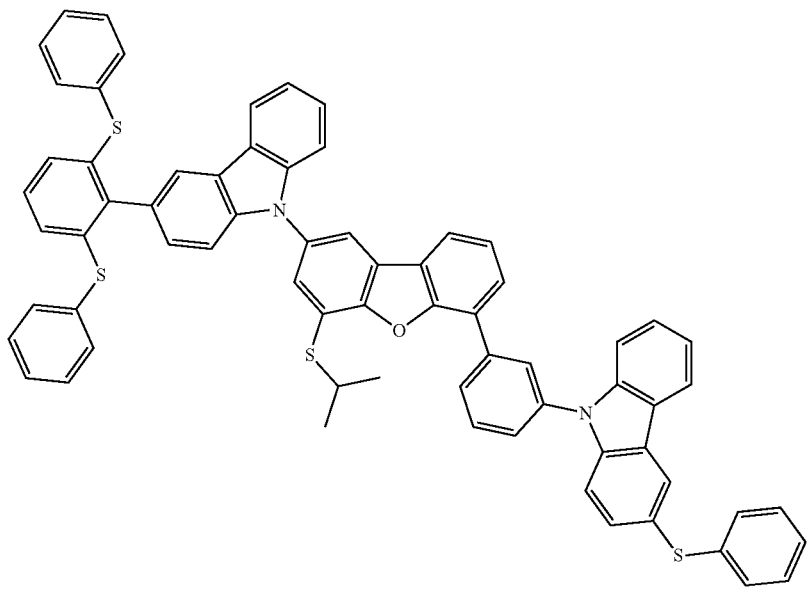
HS-36
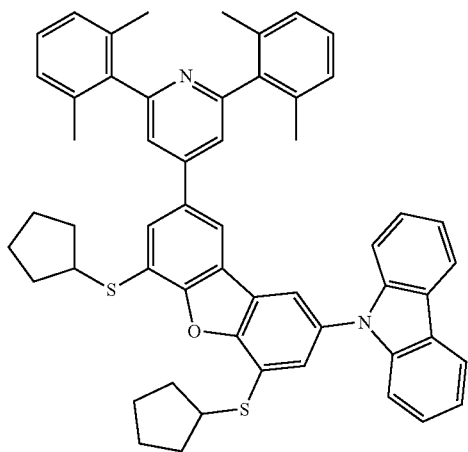
HS-37
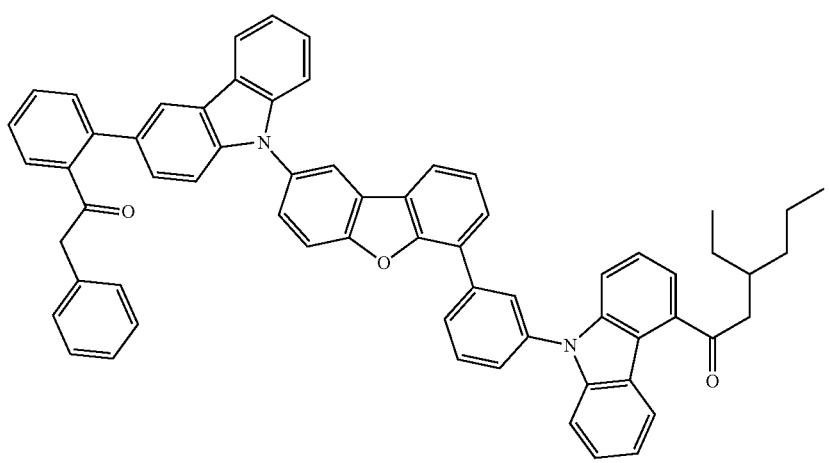

-continued
HS-38
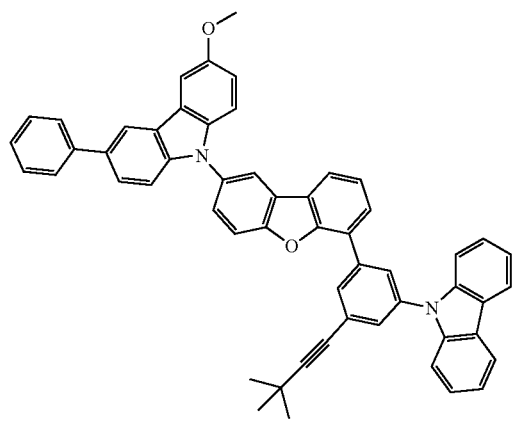
HS-39
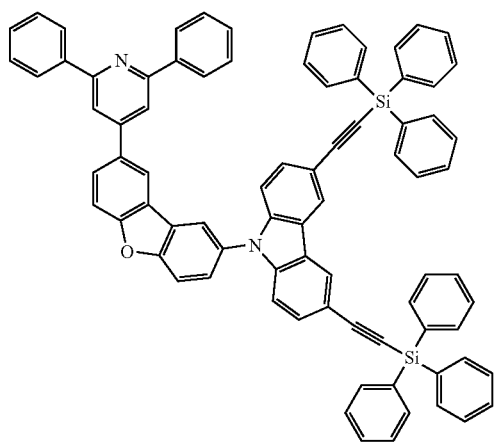
HS-40
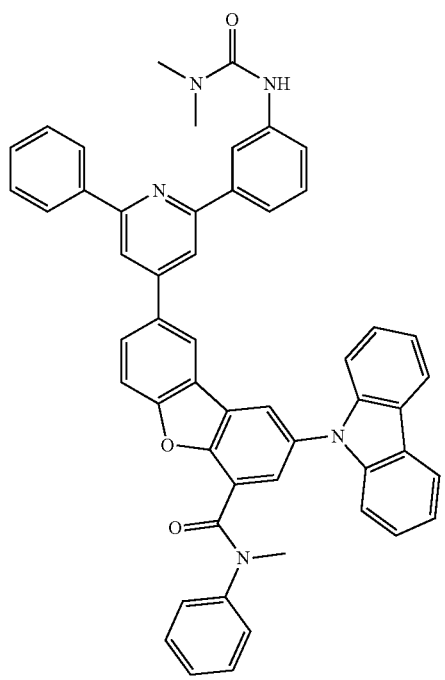
HS-41
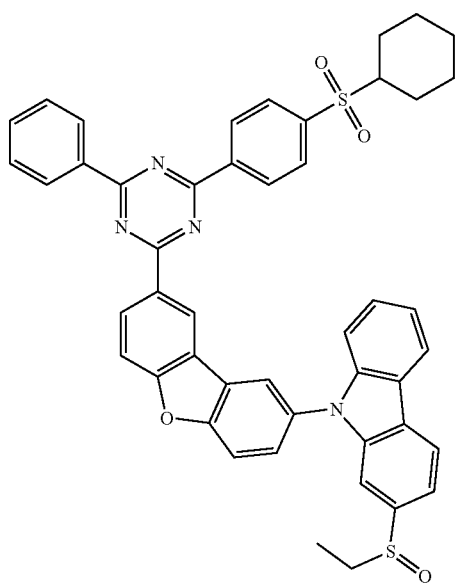
HS-42
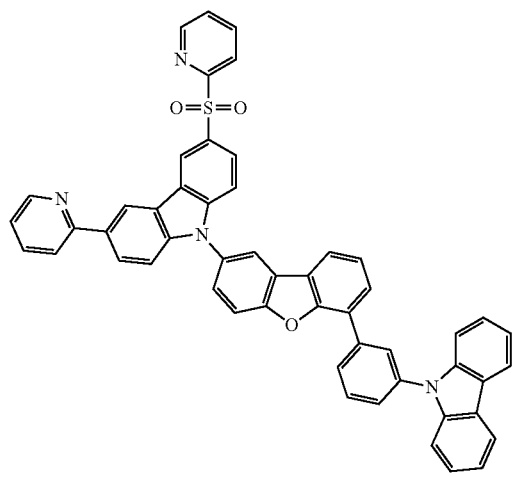
HS-43
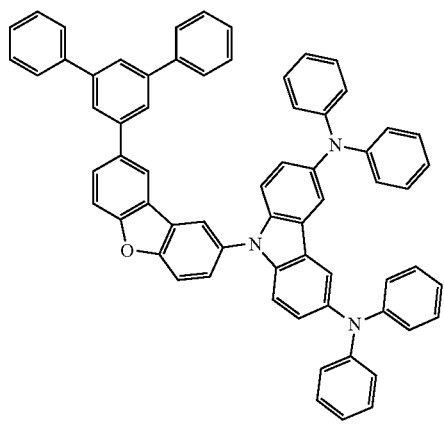

HS-44
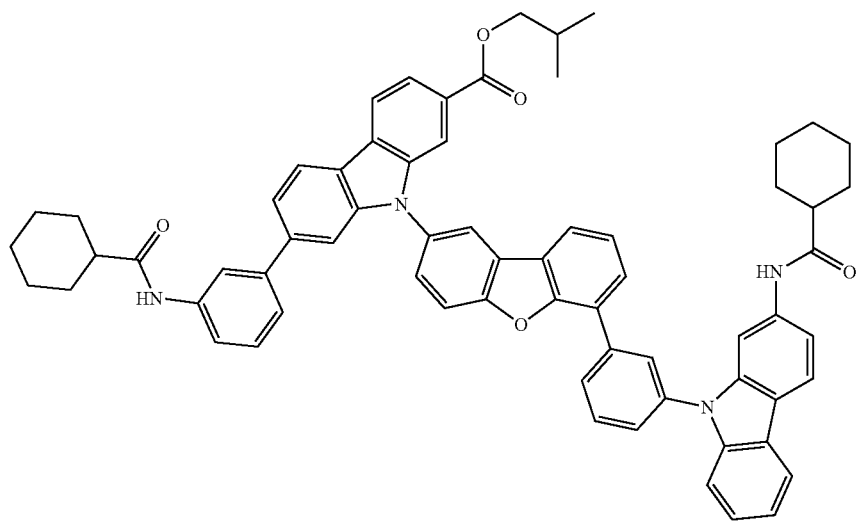
HS-45
HS-46
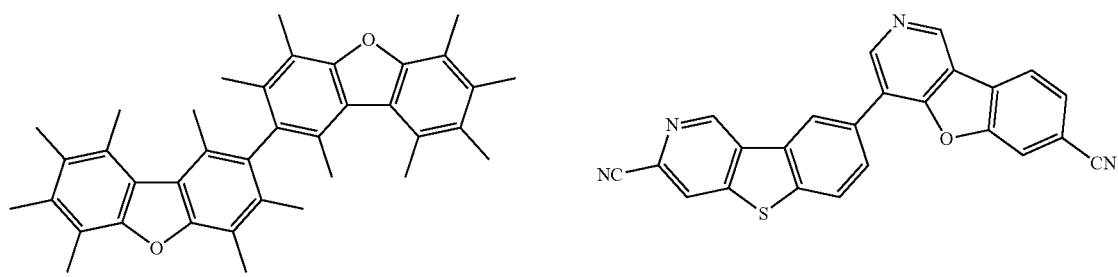
HS-47
HS-48
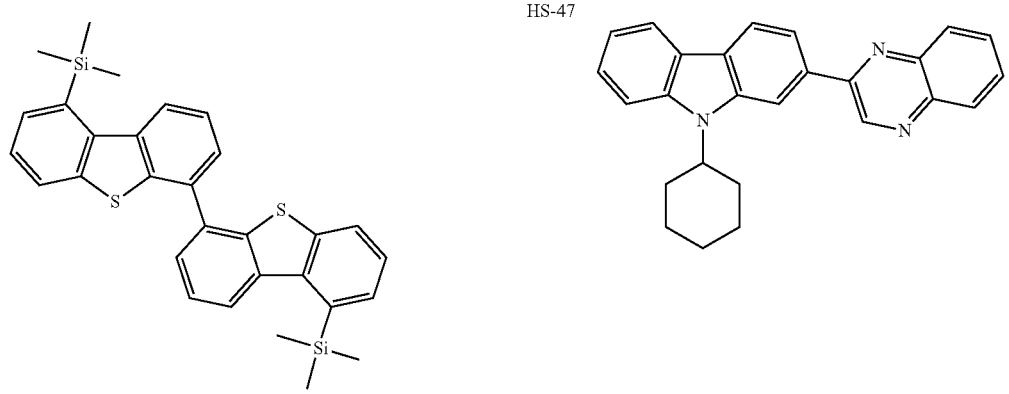
HS-49
HS-50
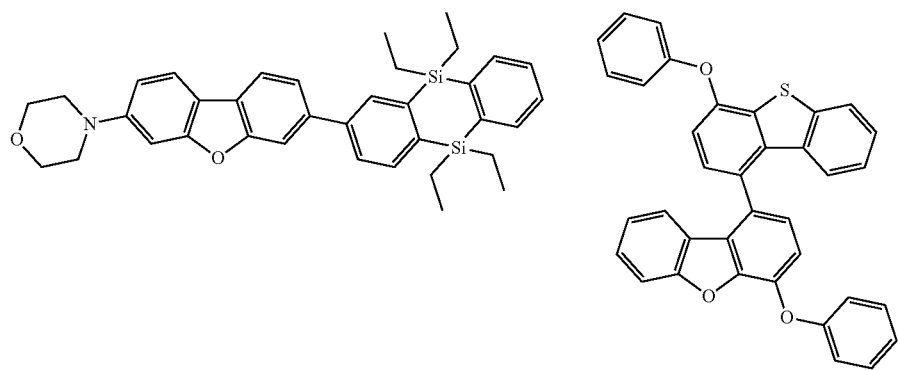

-continued
HS-51
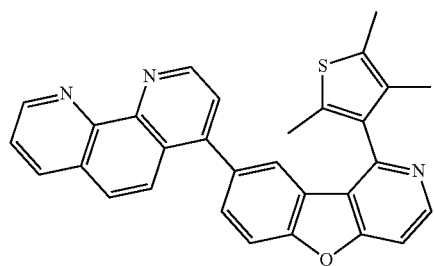
HS-52
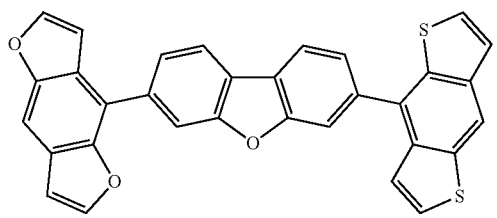
HS-53
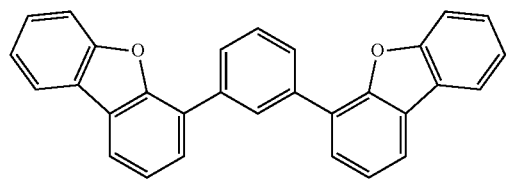
HS-54
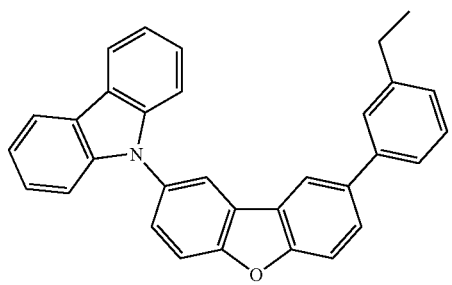
HS-55
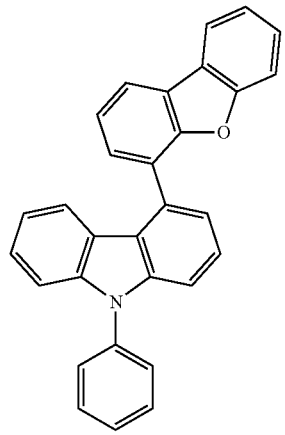
HS-56
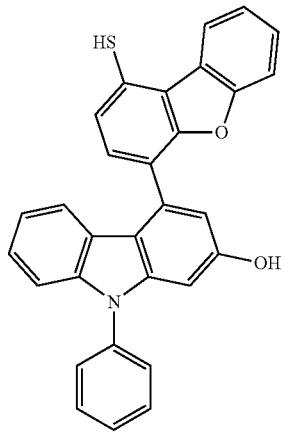
HS-57
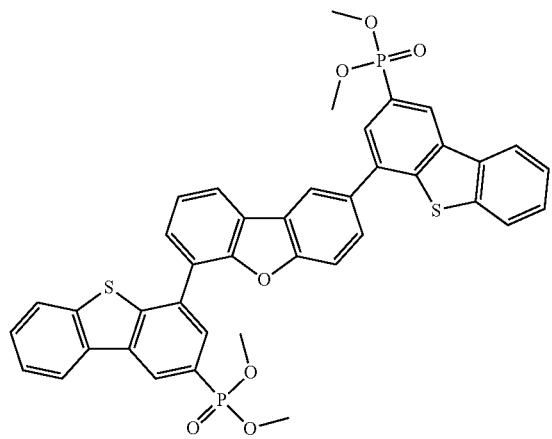
HS-58
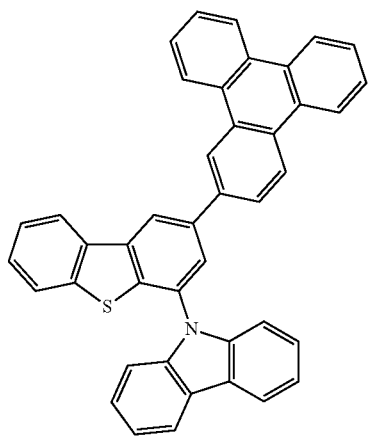

-continued
HS-59
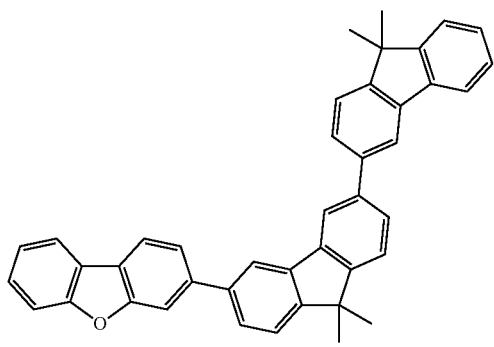
HS-60
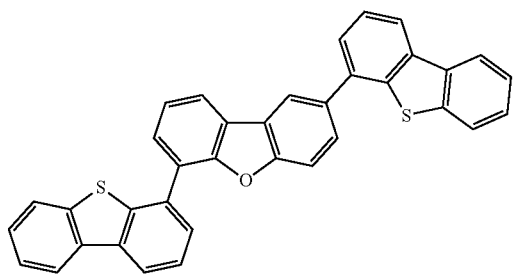
HS-61
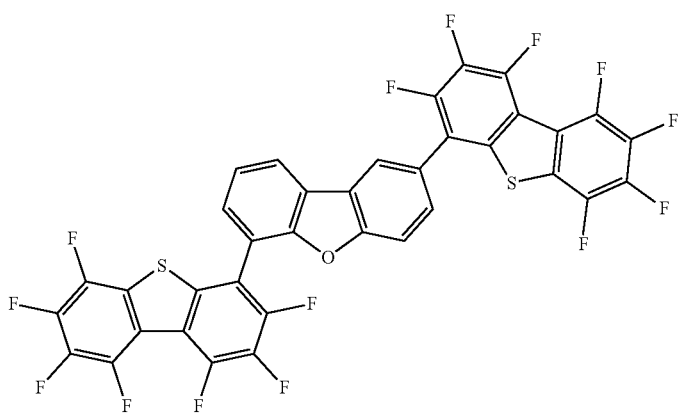
HS-62
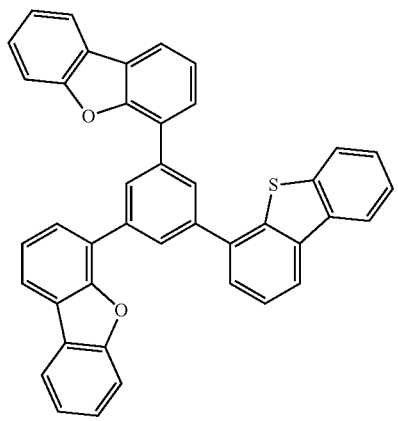
HS-63
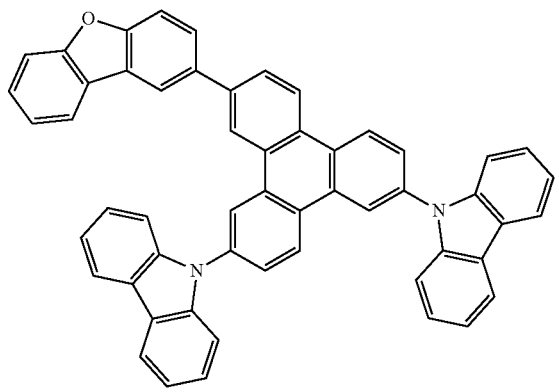

-continued
HS-64
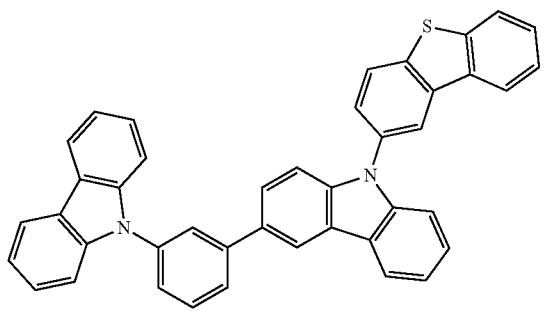
HS-65
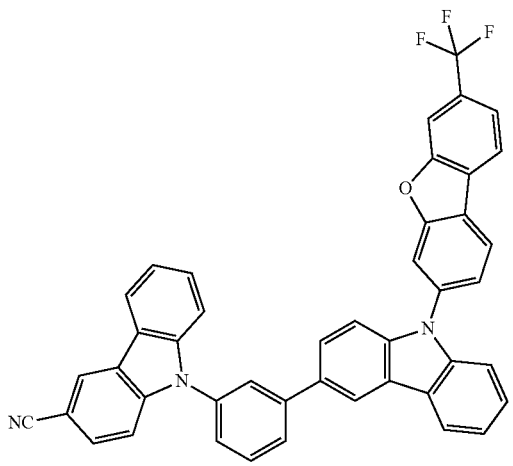
HS-66
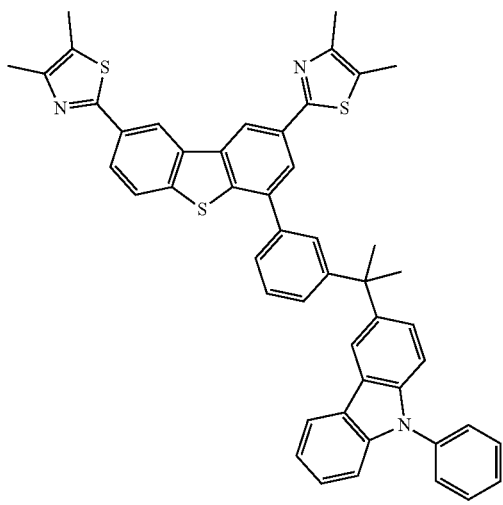
HS-67
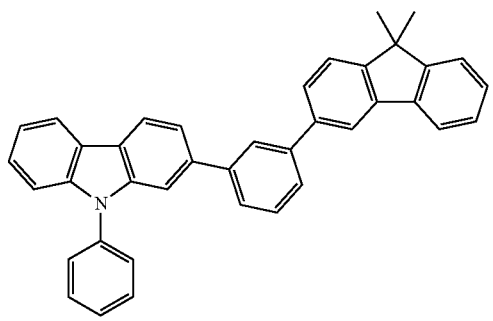
HS-68
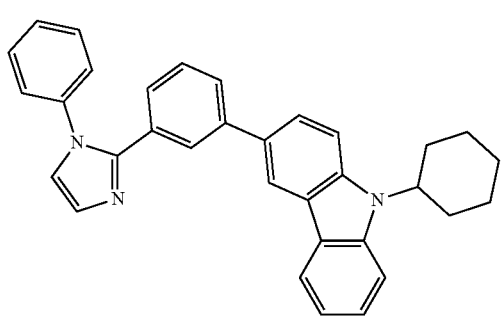
HS-69
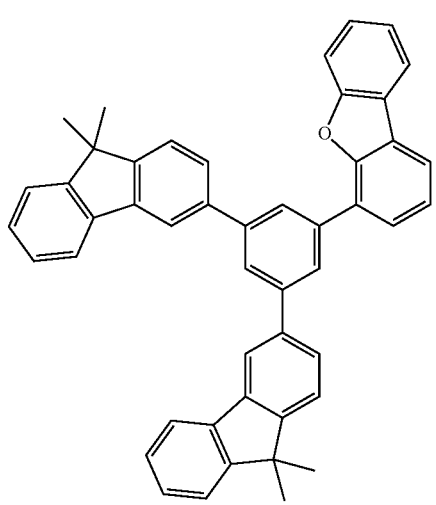

-continued
HS-70
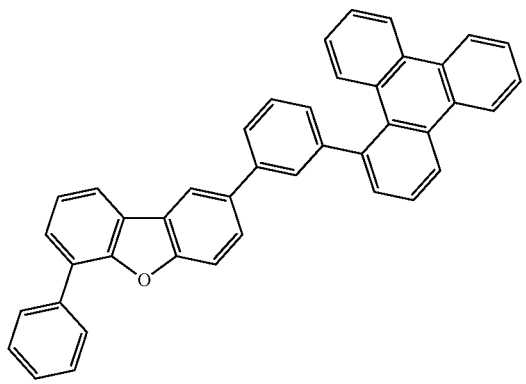
HS-71
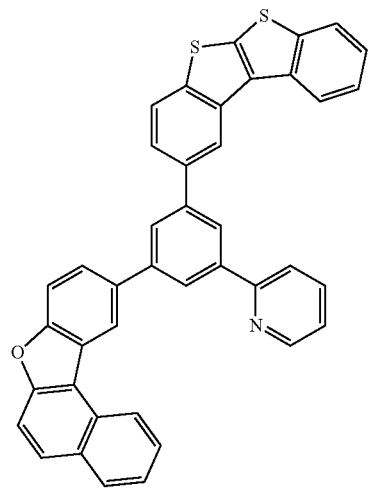
HS-72
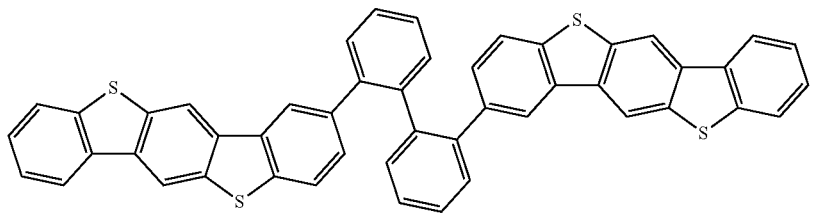
HS-73
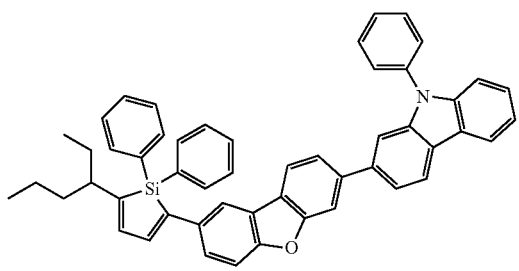
HS-74
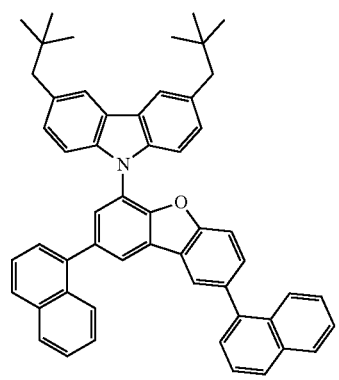
HS-75
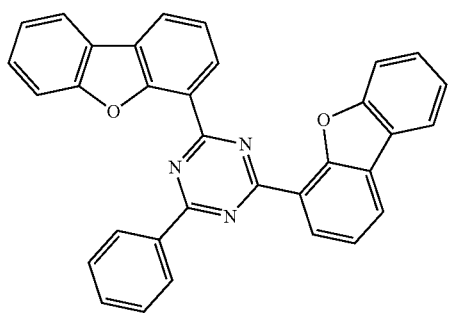
HS-76
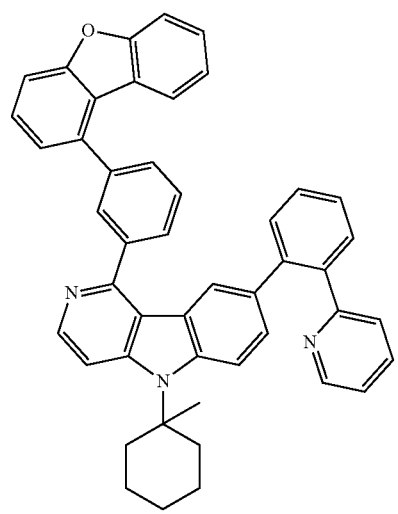

HS-77
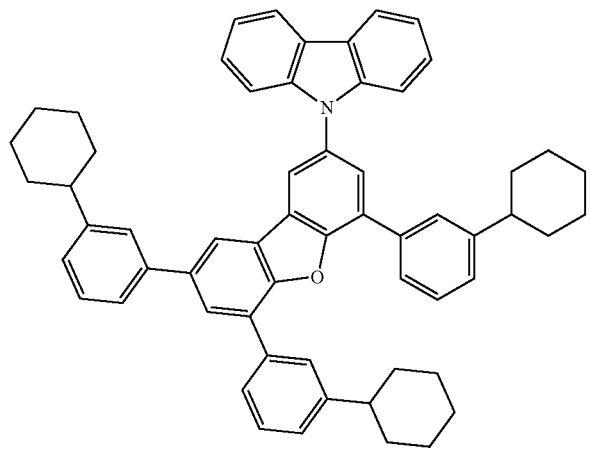
HS-78
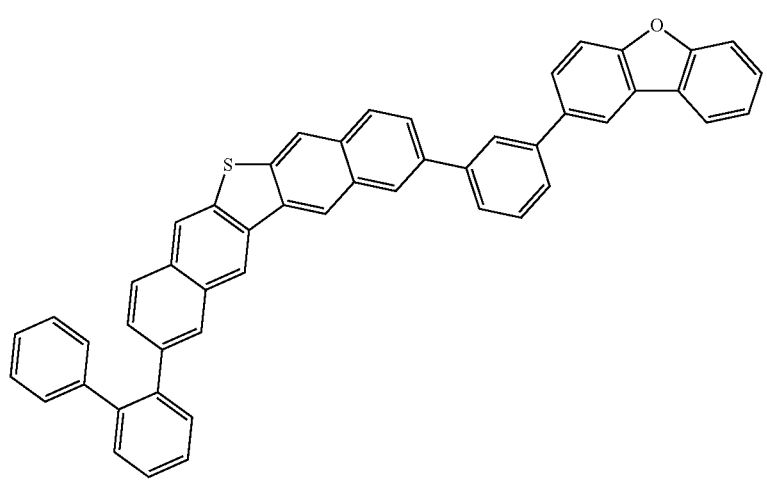
HS-79
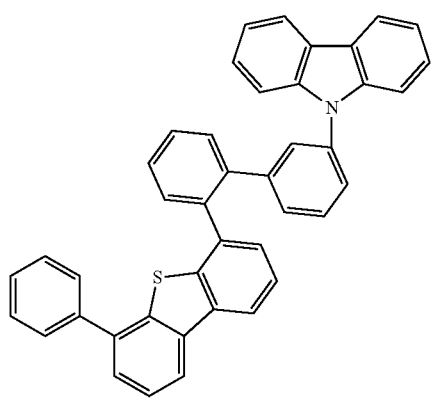
HS-80
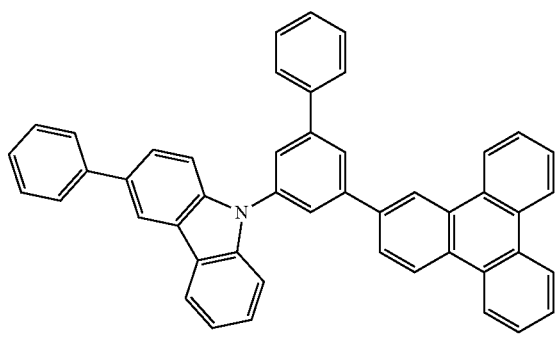

-continued
HS-81
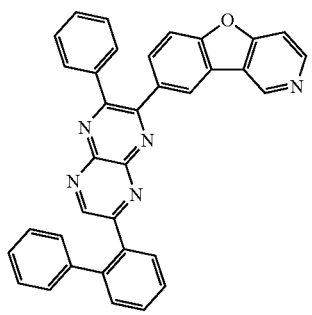
HS-82
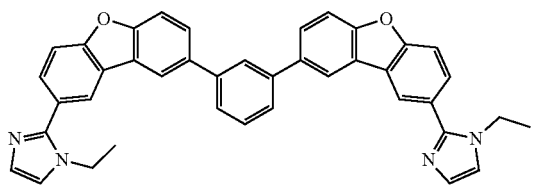
HS-83
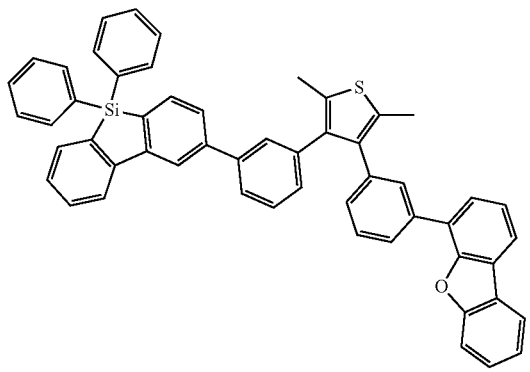
HS-84
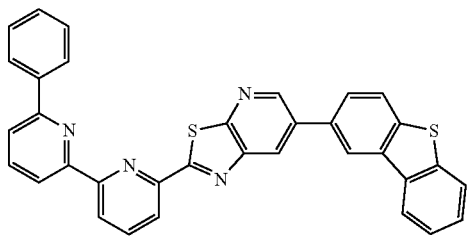
HS-85
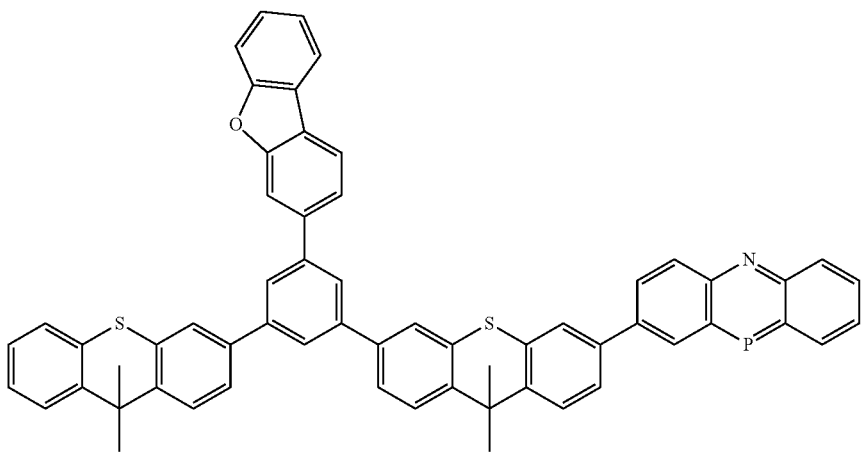
HS-86
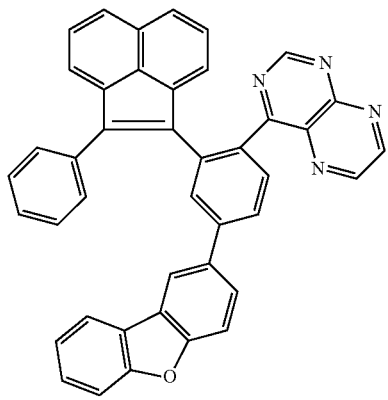
HS-87
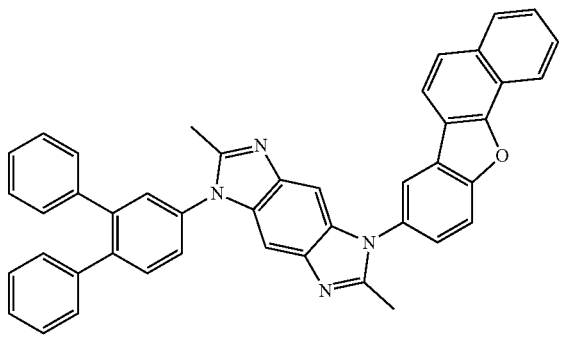

-continued
HS-88
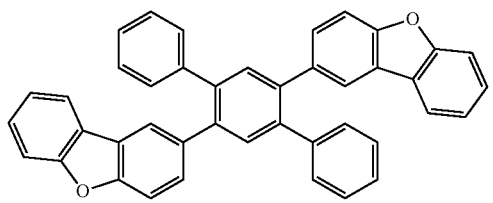
HS-89
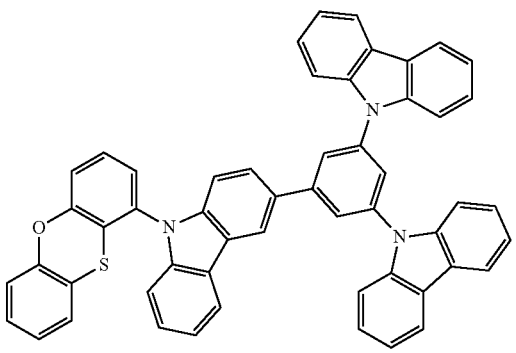
HS-90
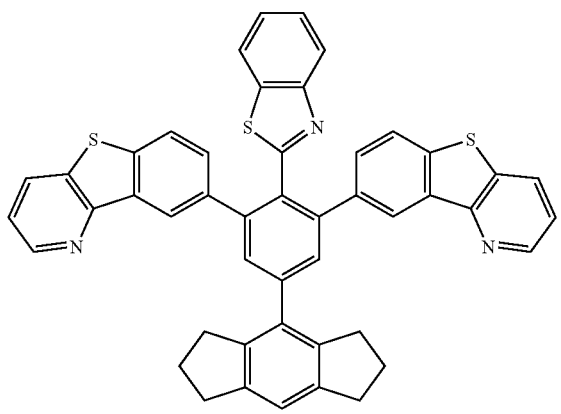
HS-91
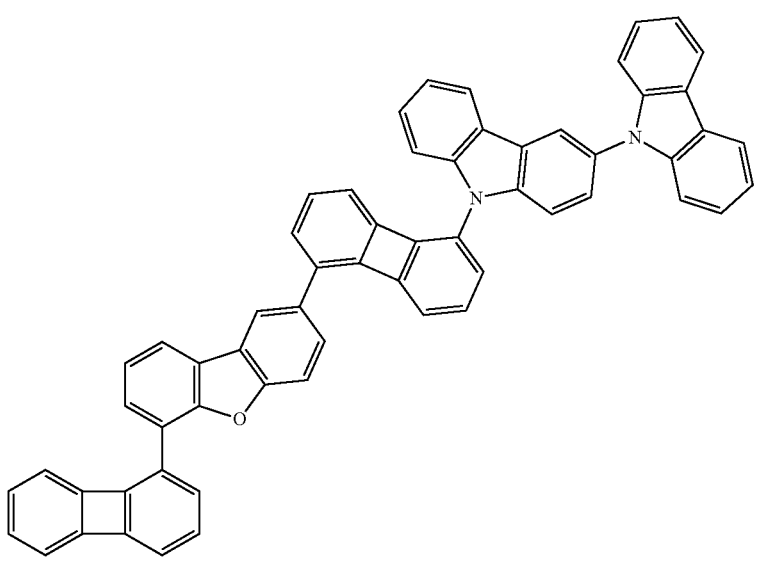
HS-92
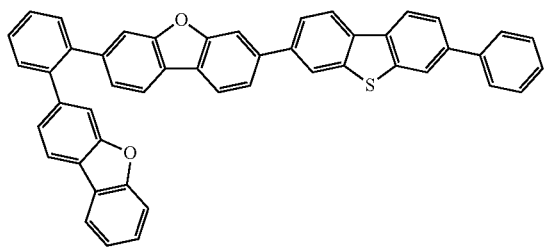
HS-93
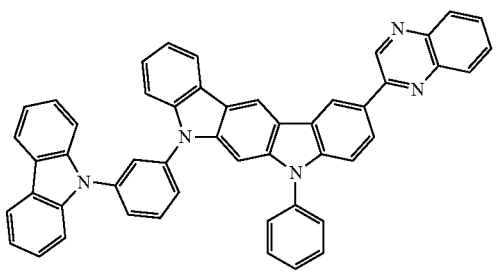

-continued
HS-94
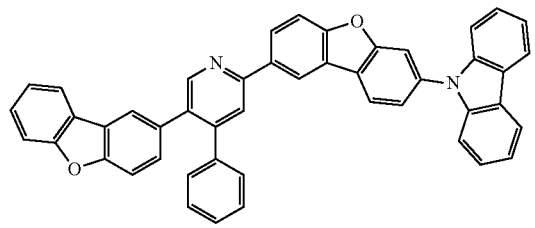
HS-95
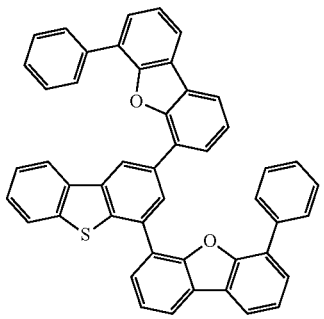
HS-96
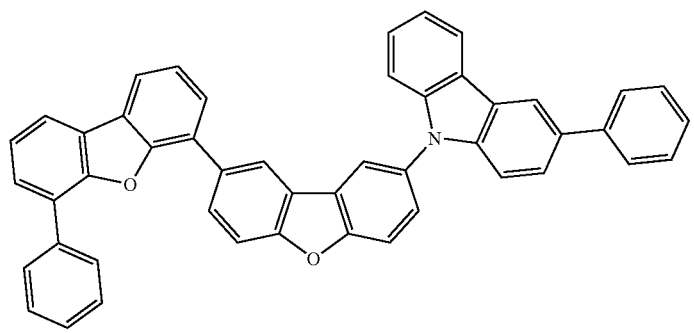
HS-97
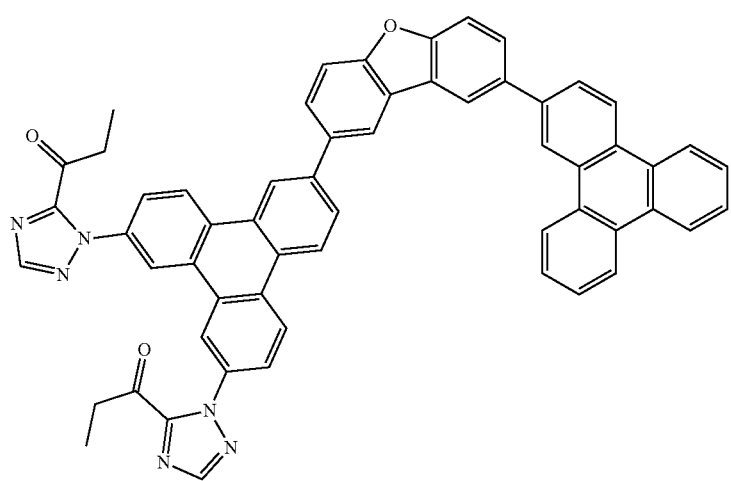

-continued
HS-98
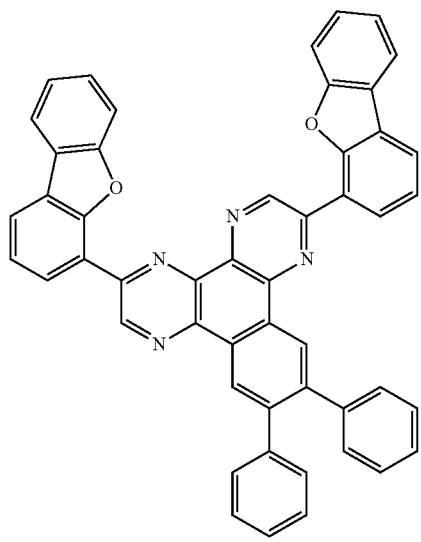
HS-99
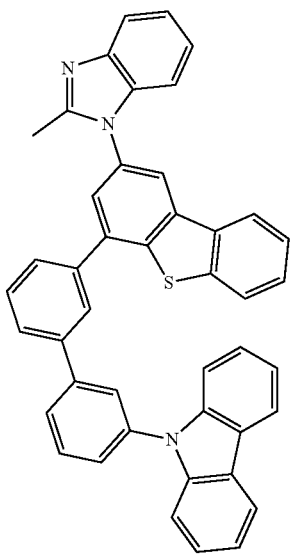
HS-100
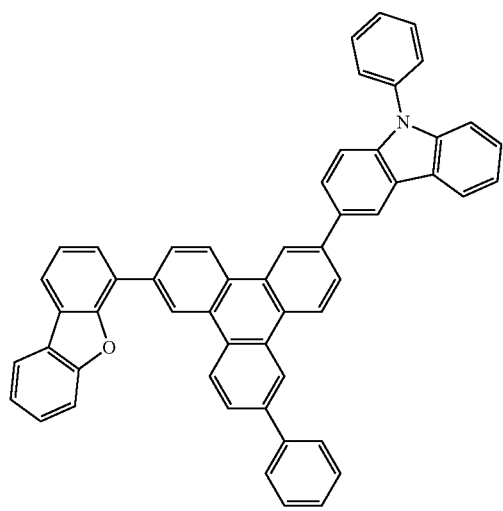
HS-101
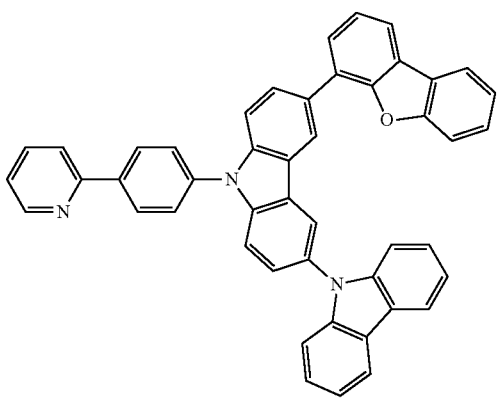
HS-102
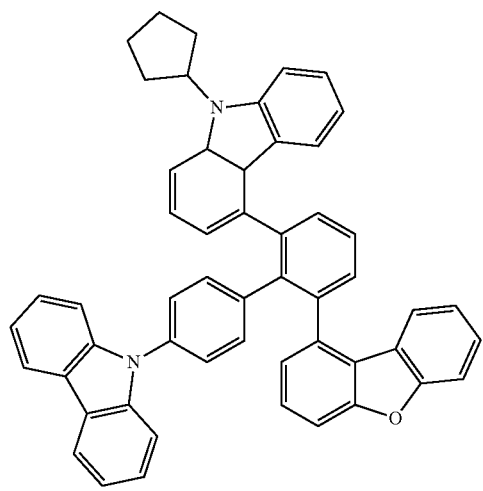

-continued
HS-103
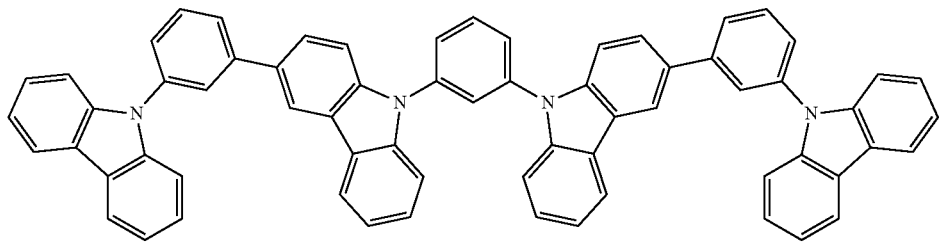
HS-104
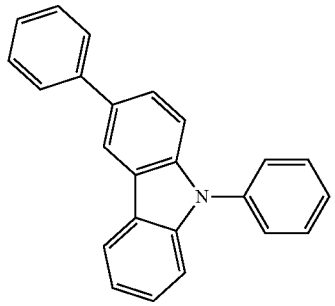
HS-105
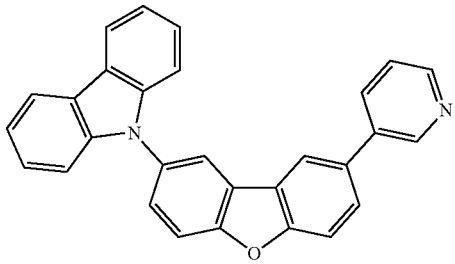
HS-106
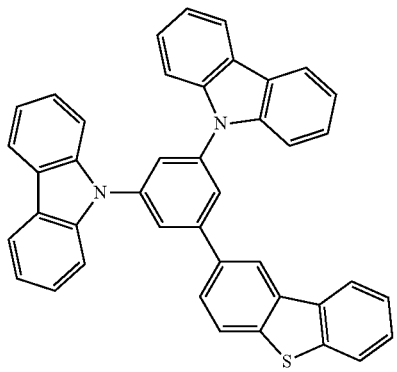
HS-107
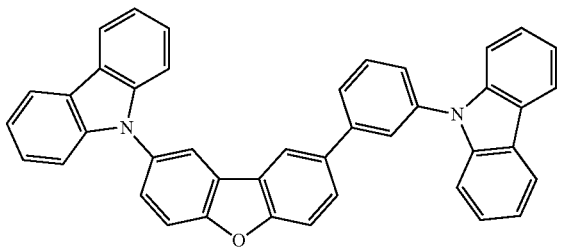
HS-108
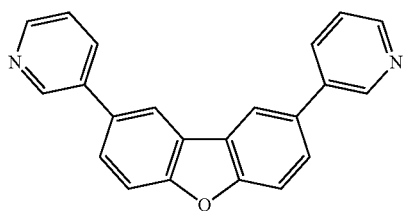
HS-109
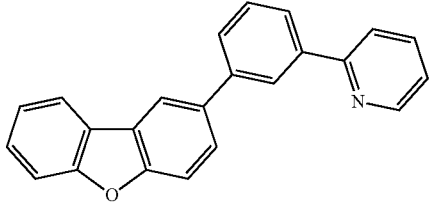
HS-110
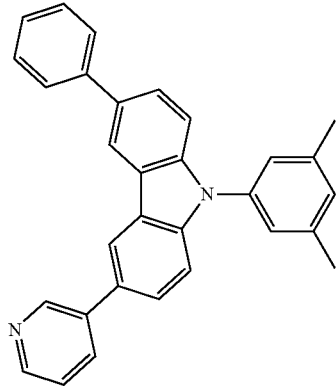
HS-111
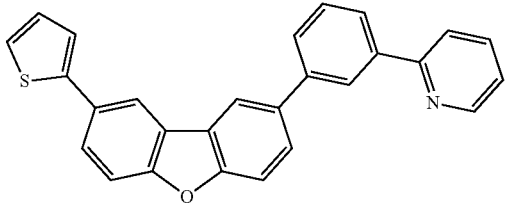

-continued
HS-112
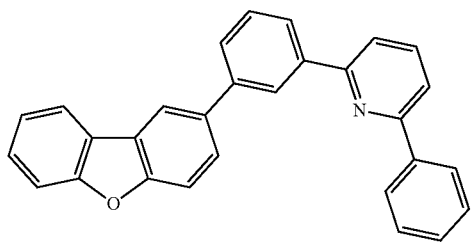
HS-113
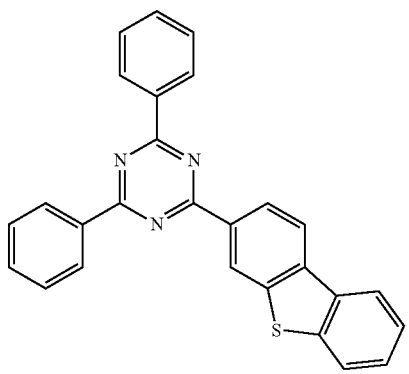
HS-114
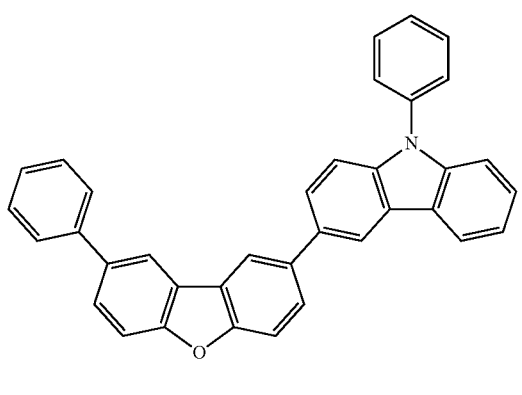
HS-115
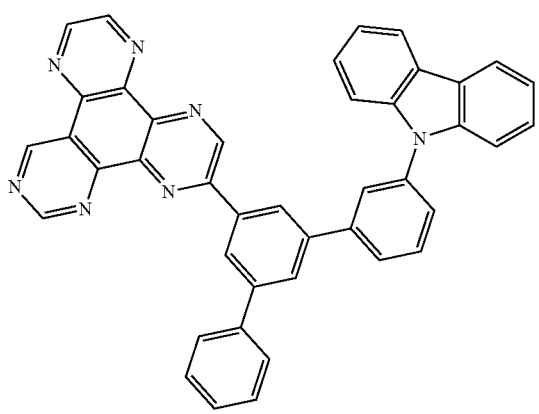
HS-116
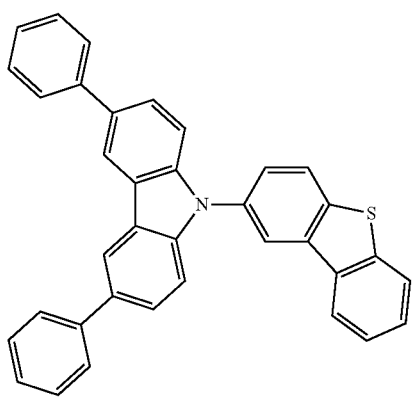
HS-117
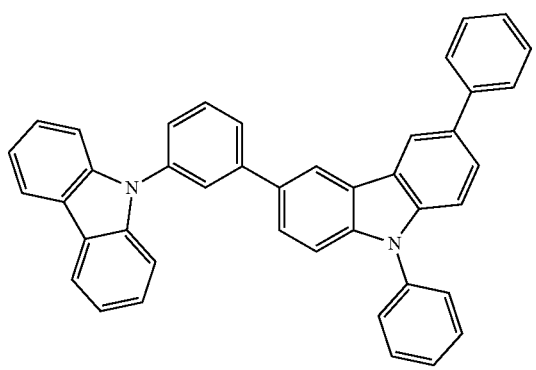
HS-118
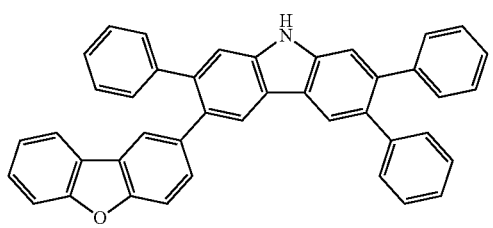
HS-119
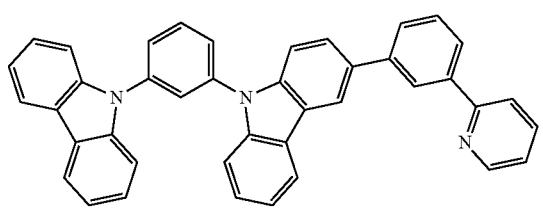

-continued
HS-120
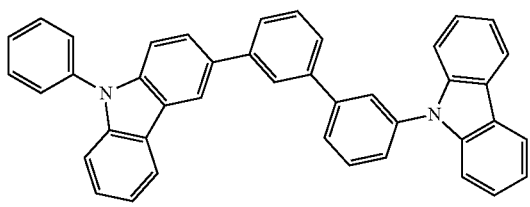
HS-121
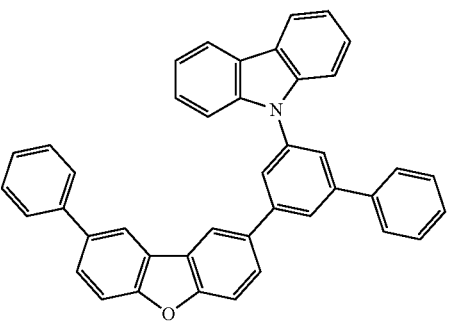
HS-122
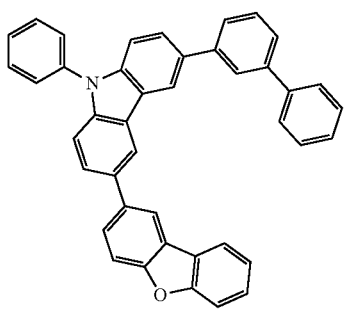
HS-123
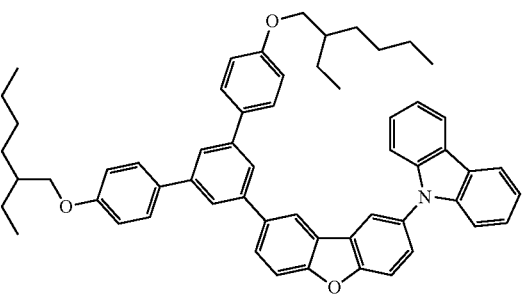
HS-124
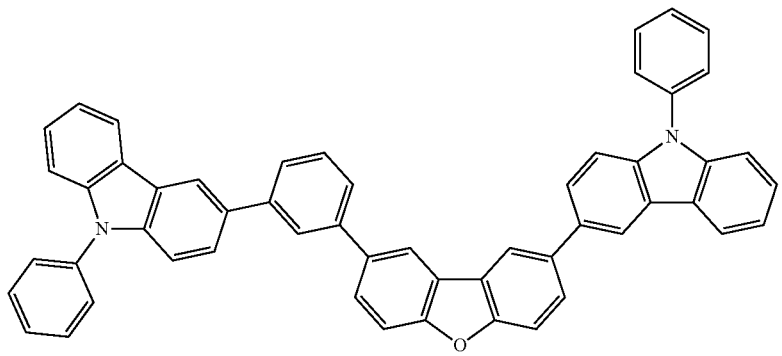
HS-125
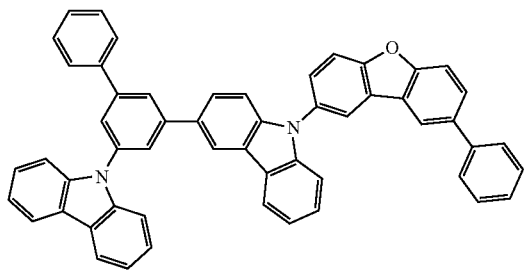
HS-126
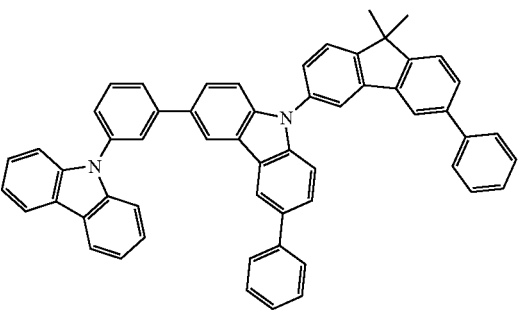

-continued
HS-127
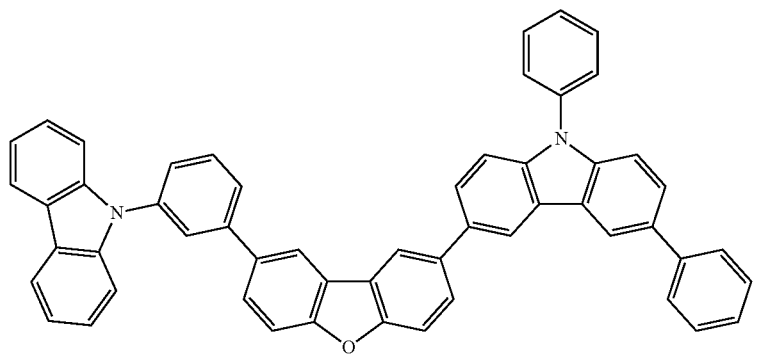
HS-128
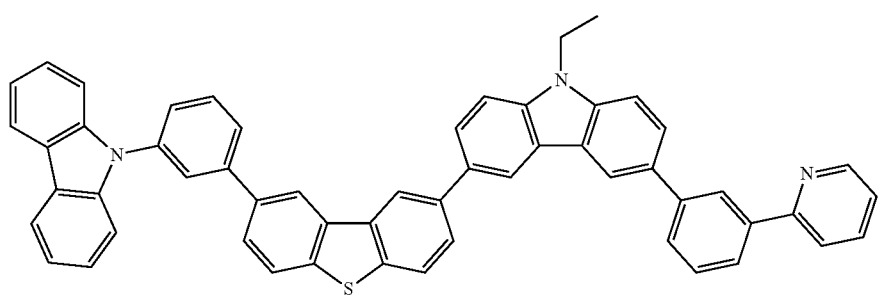
HS-129
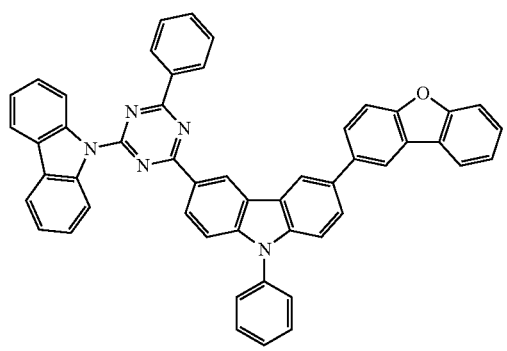
HS-130
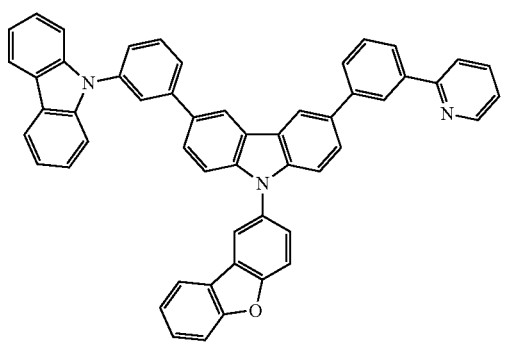
HS-131
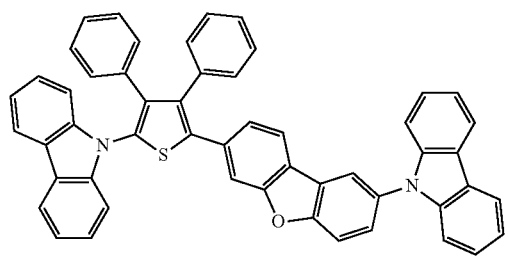
HS-132
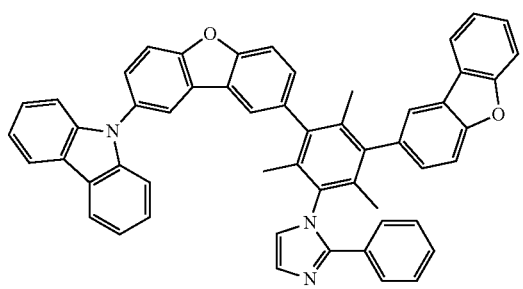
HS-133
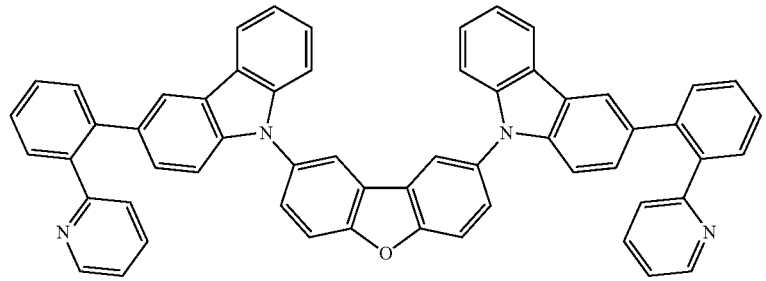

-continued
HS-134
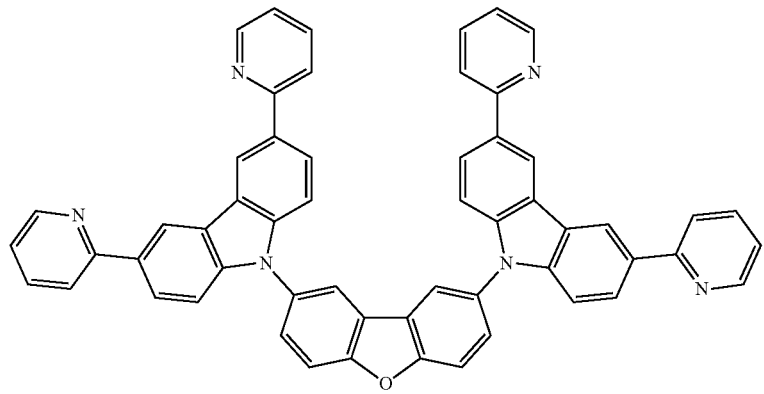
HS-135
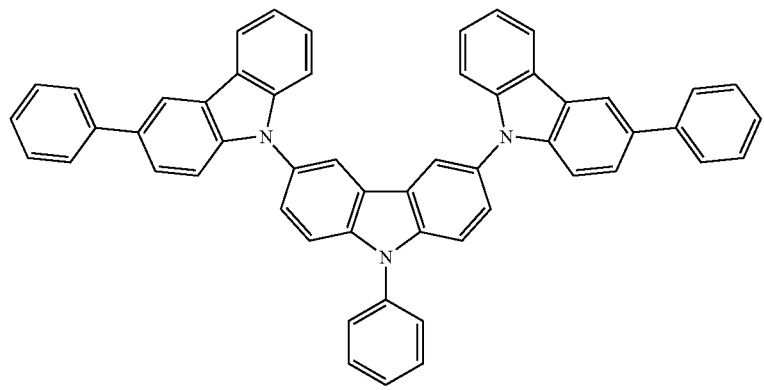
HS-136
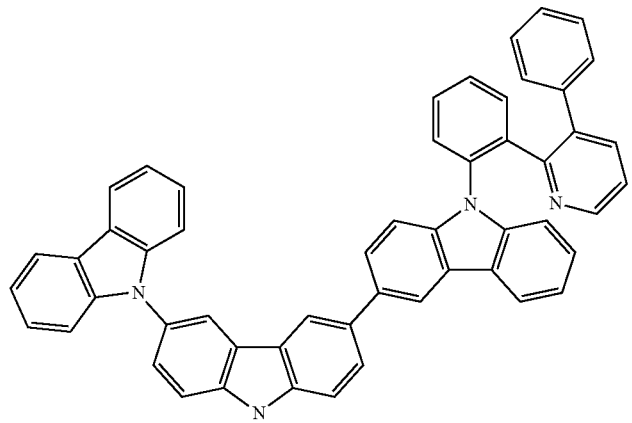
HS-137
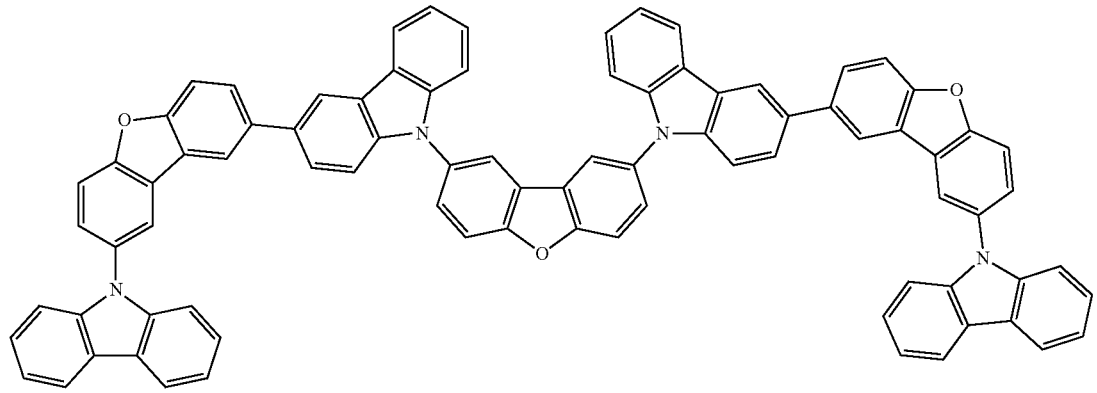

-continued
HS-138
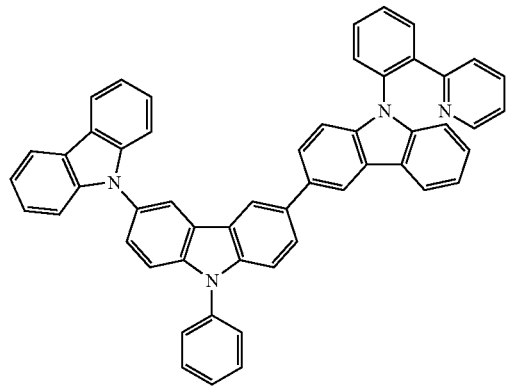
HS-139
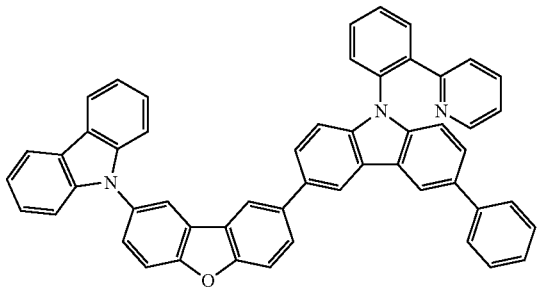
HS-140
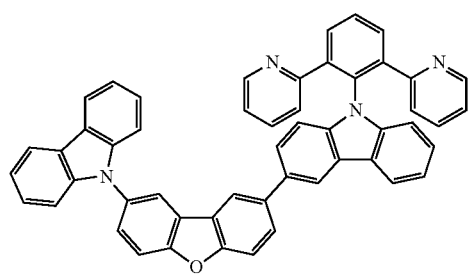
HS-141
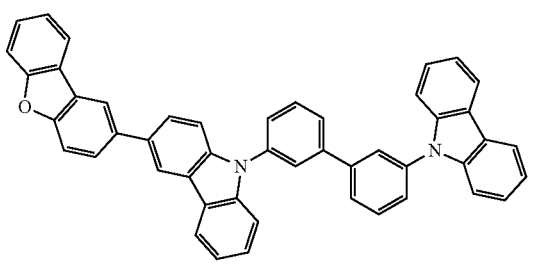
HS-142
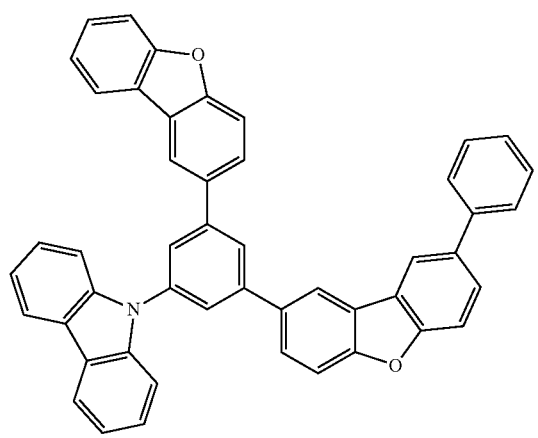
HS-143
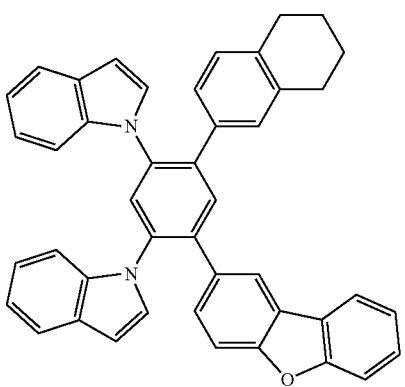
HS-144
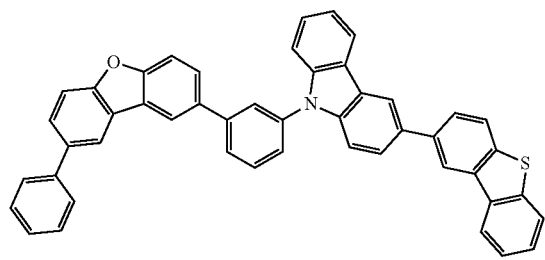
HS-145
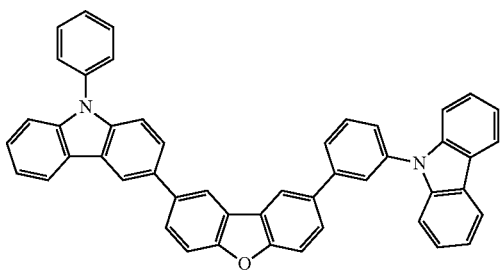

HS-146
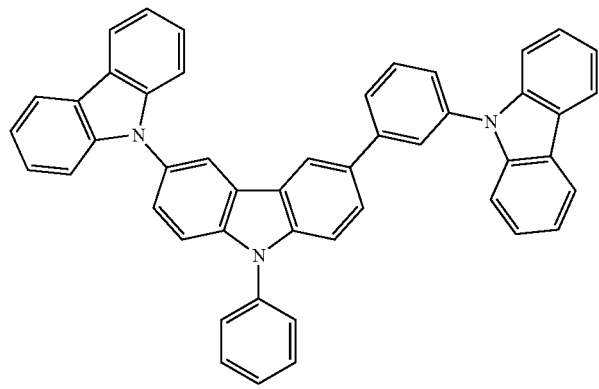
HS-147
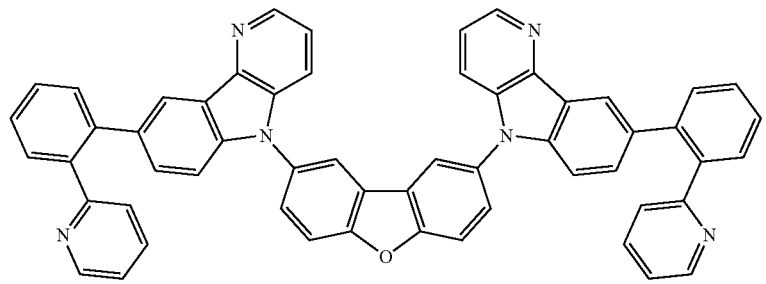
HS-148
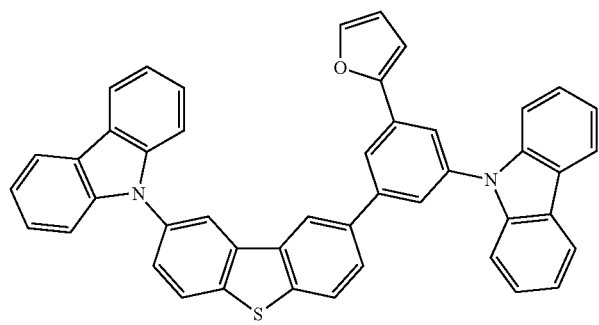
HS-149
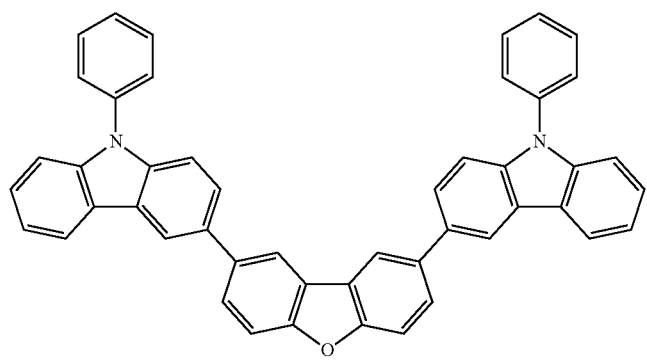

HS-150
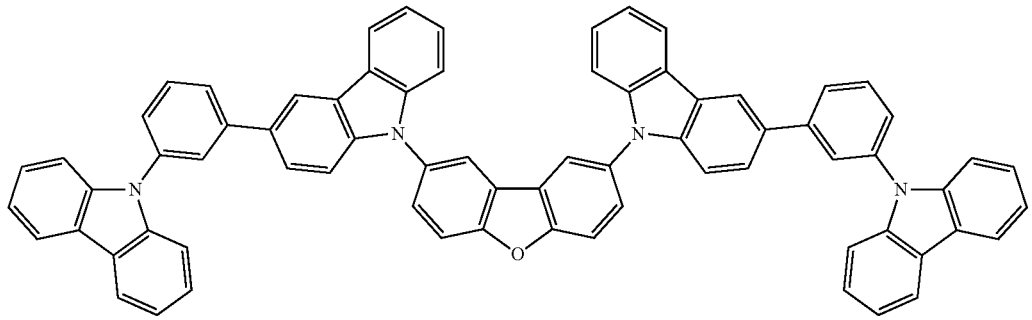
HS-151
HS-152
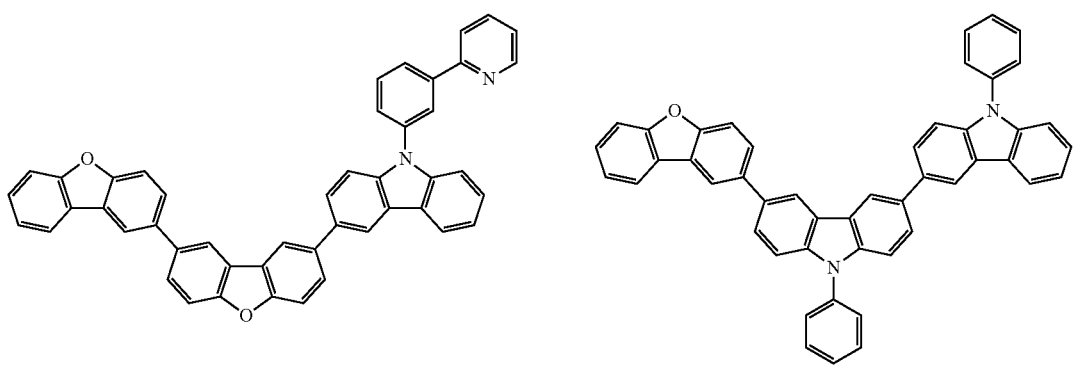
HS-153
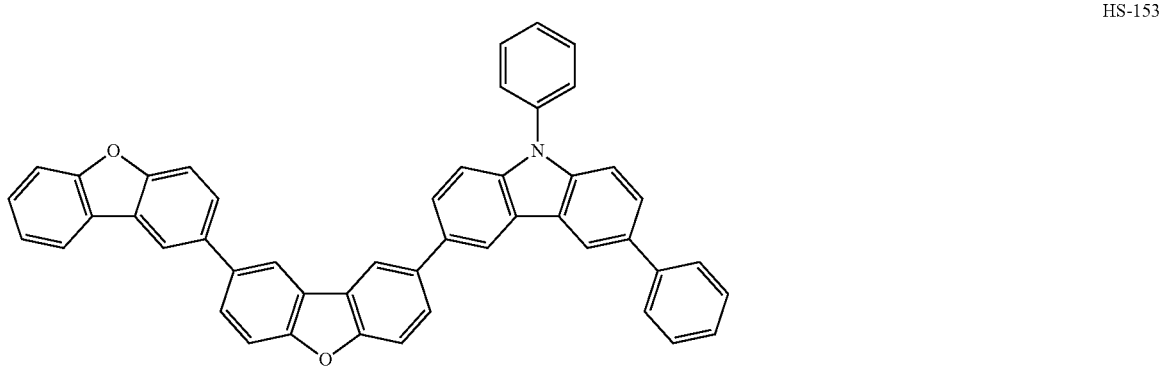
HS-154
HS-155
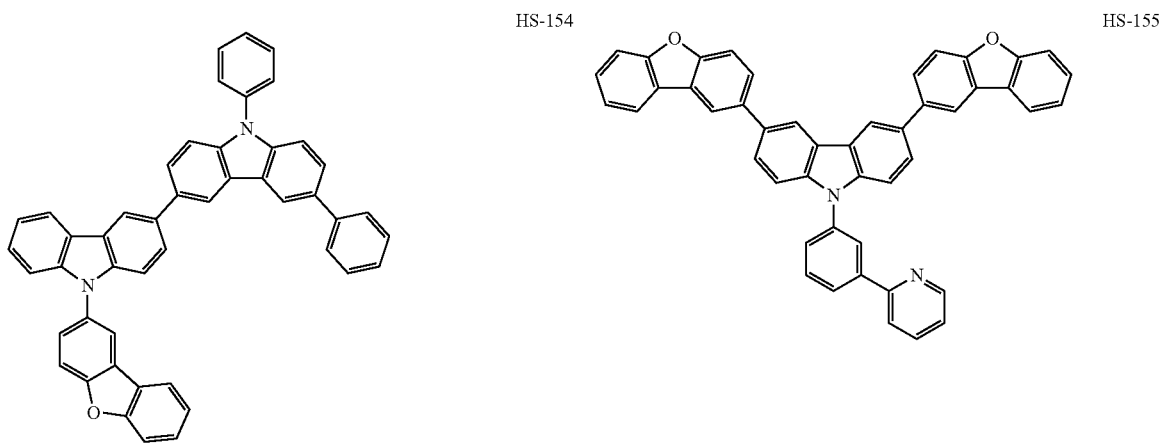

-continued
HS-156
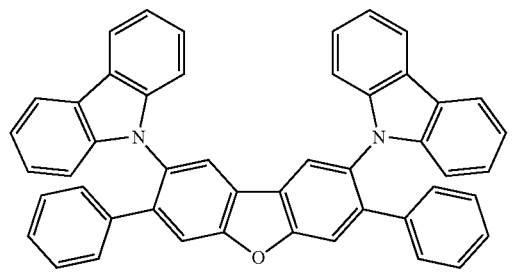
HS-157
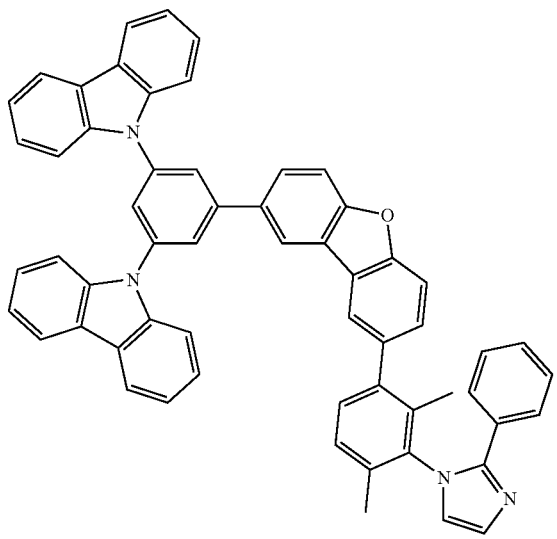
HS-158
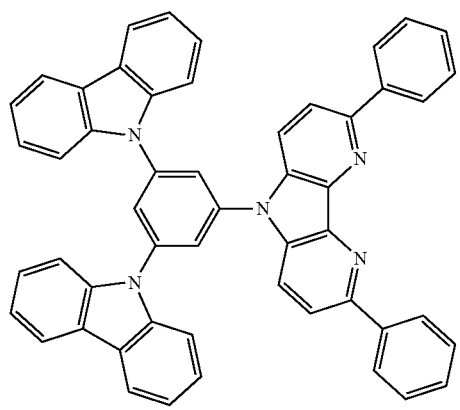
HS-159
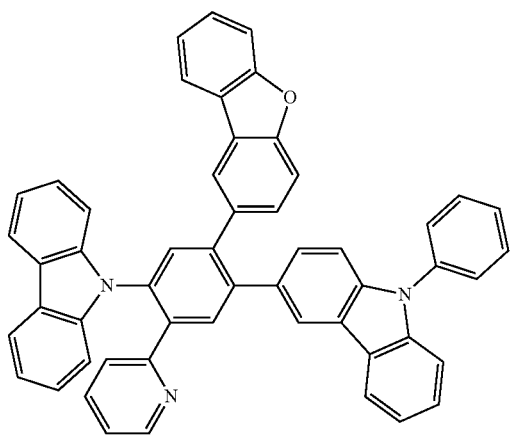
HS-160
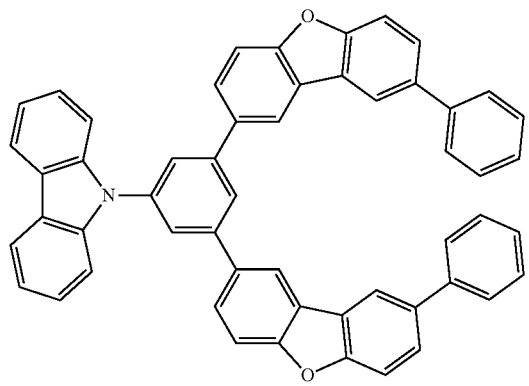

-continued
HS-161
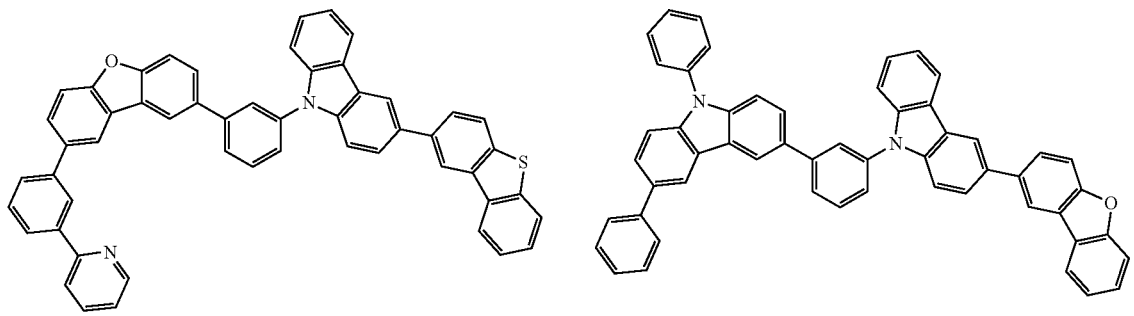
HS-162
HS-163
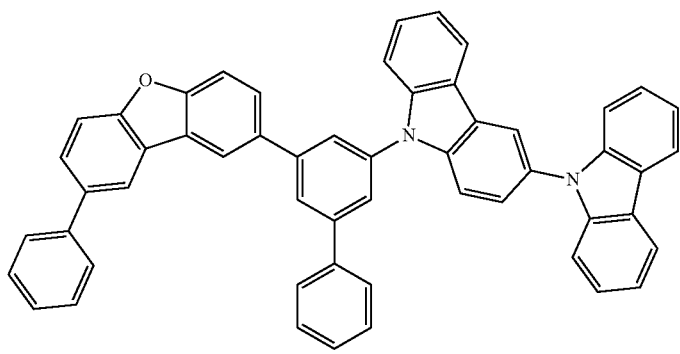
HS-164
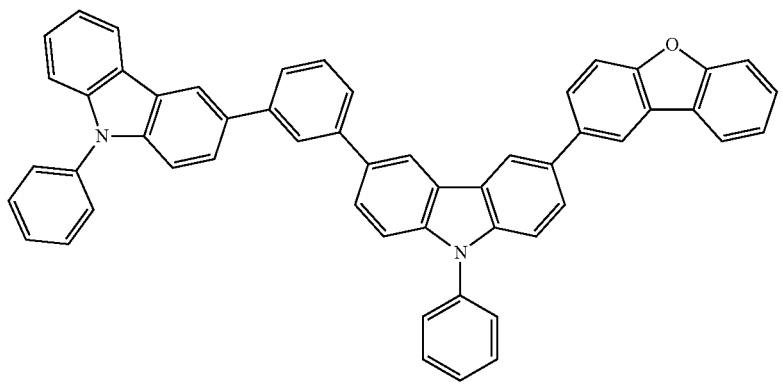
HS-165
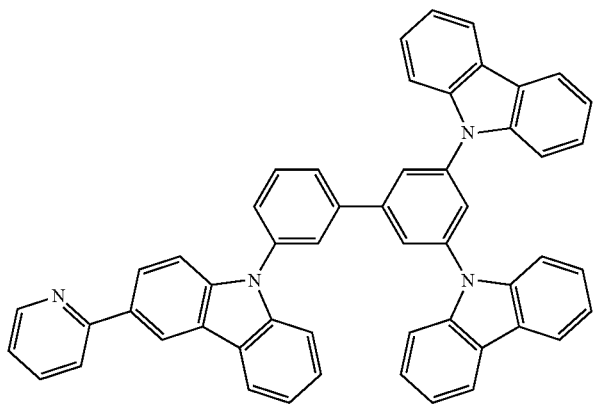

-continued
HS-166
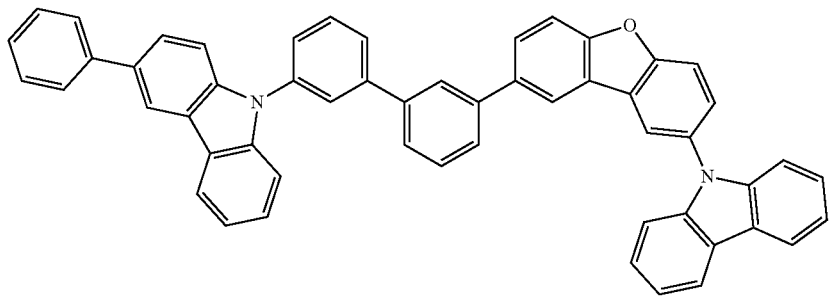
HS-167
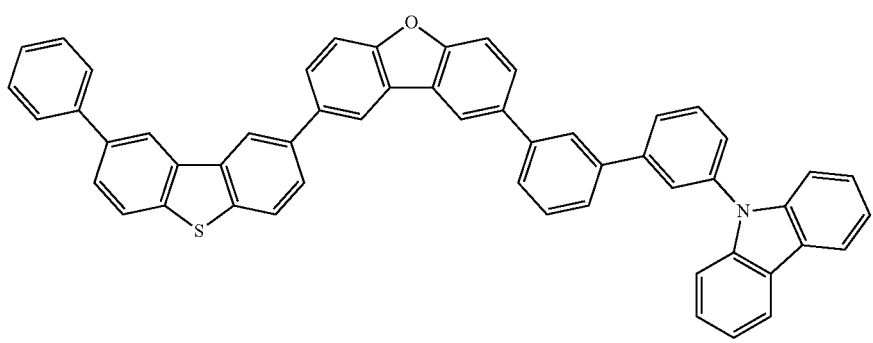
HS-168
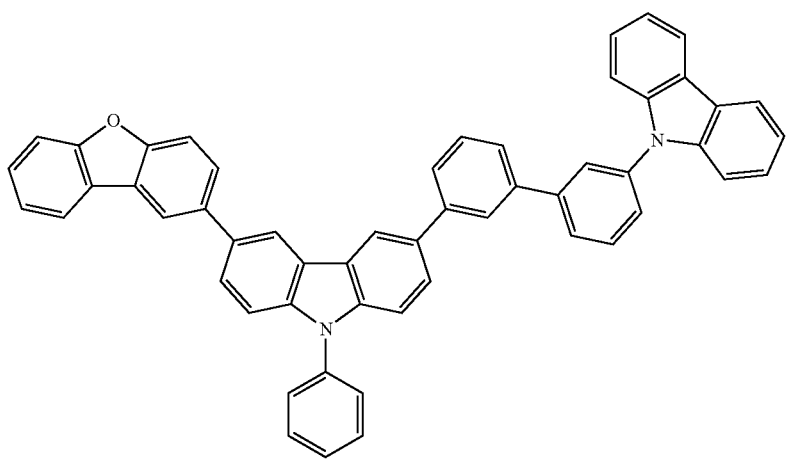
HS-169
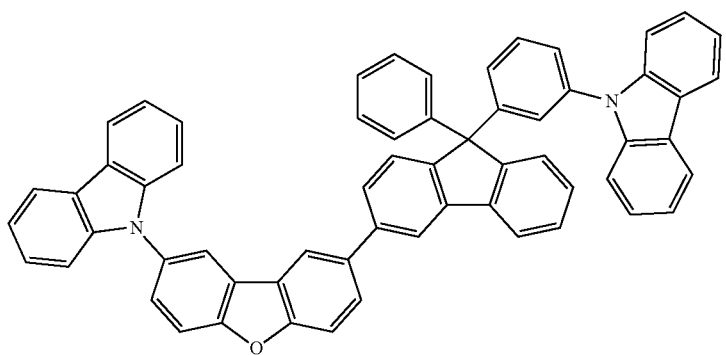

-continued
HS-170
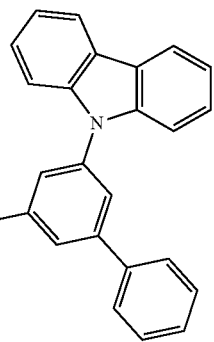
HS-171
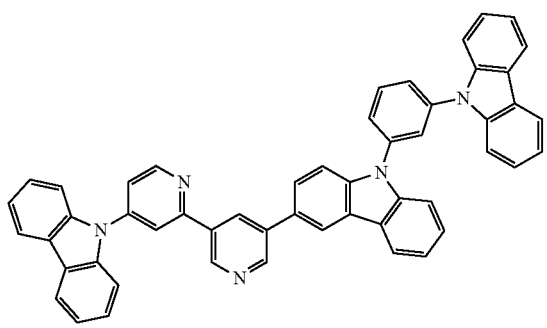
HS-172
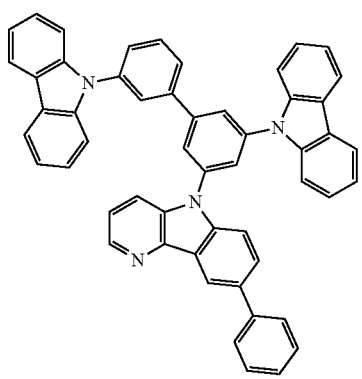
HS-173
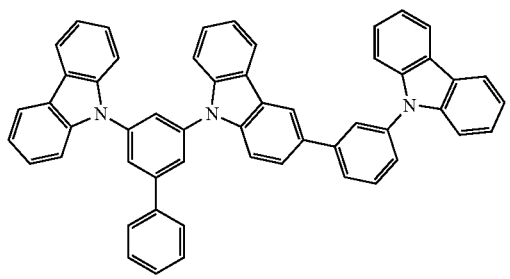
HS-174
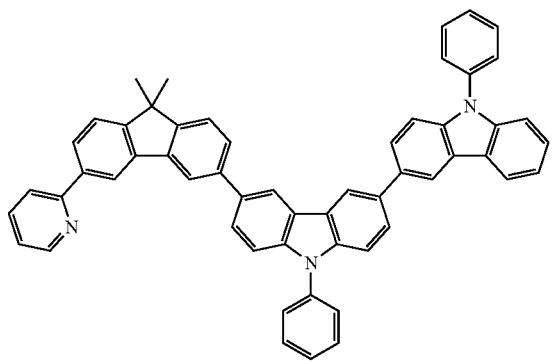
HS-175
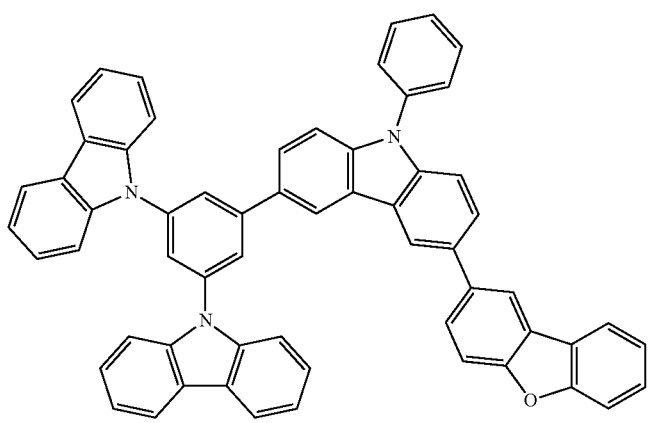

HS-176
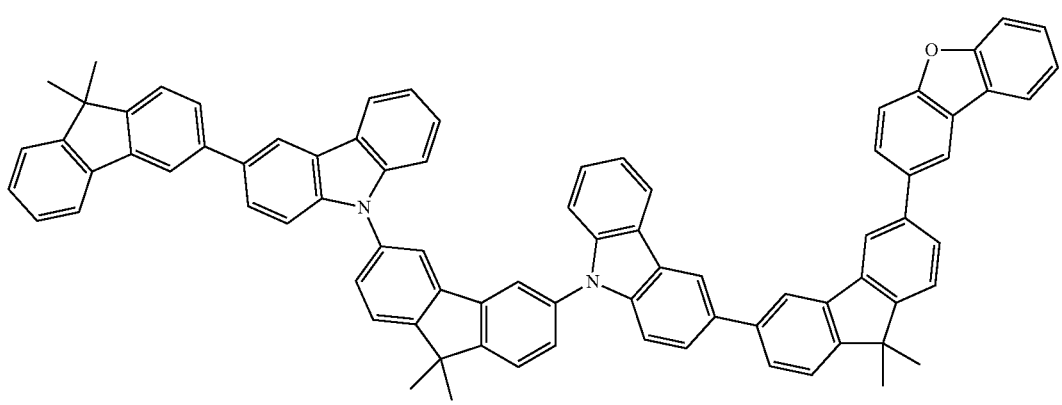
HS-177
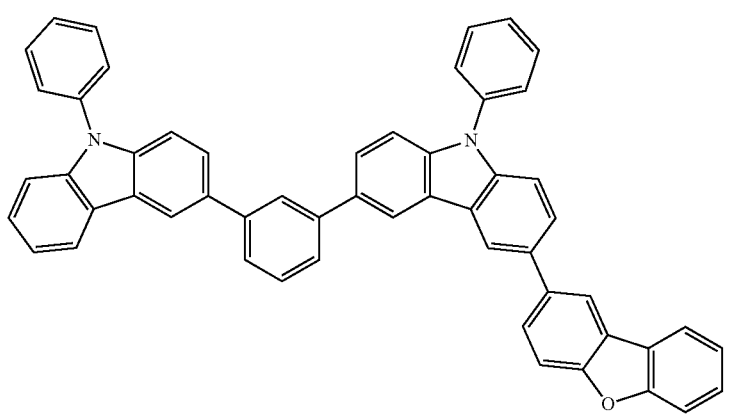
HS-178
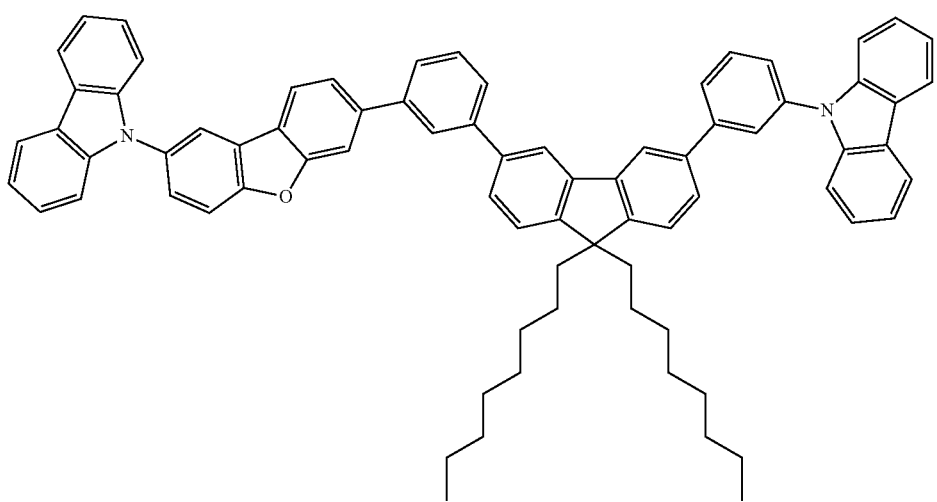

-continued
HS-179
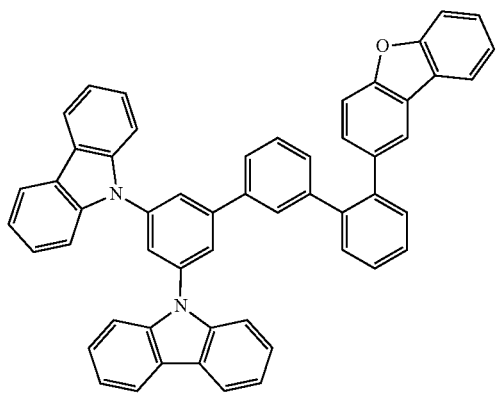
HS-180
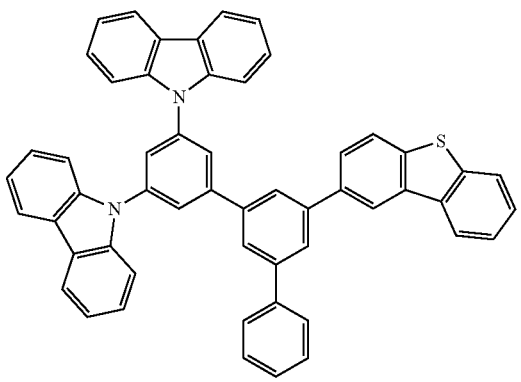
HS-181
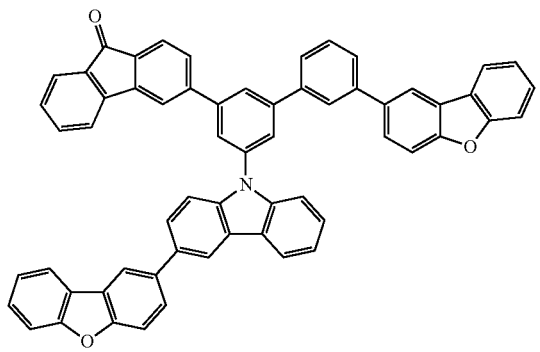
HS-182
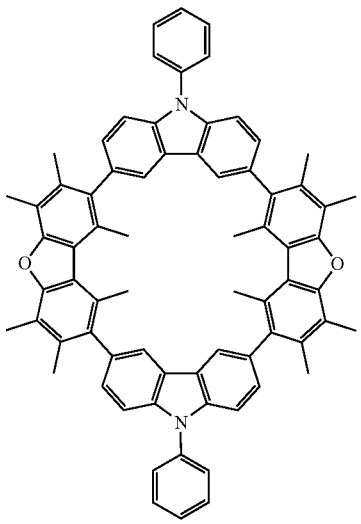
HS-183
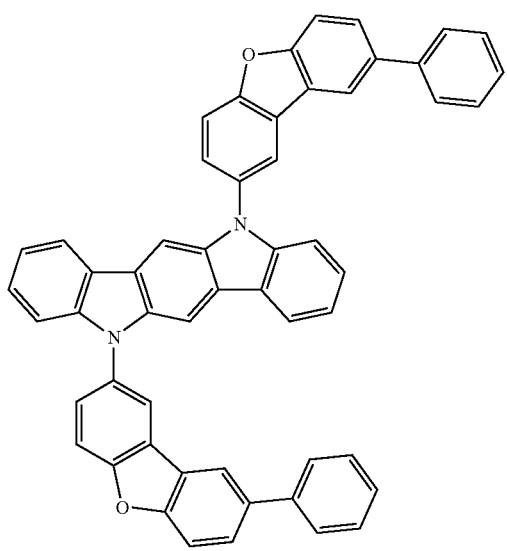

HS-184
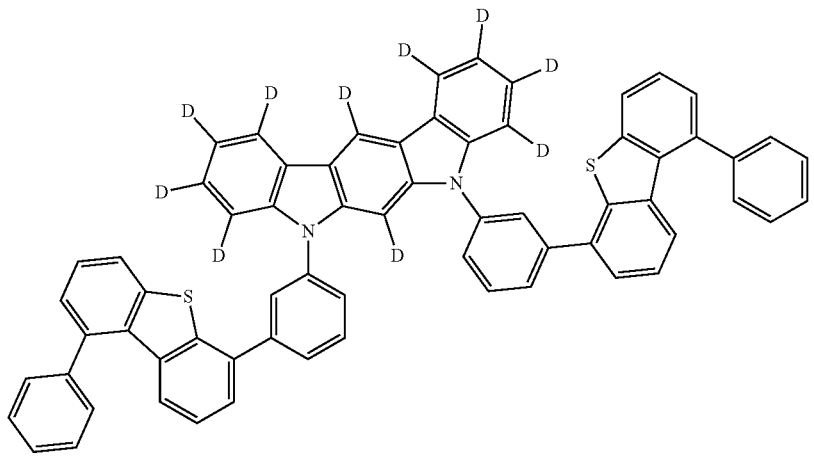
HS-185 HS-186
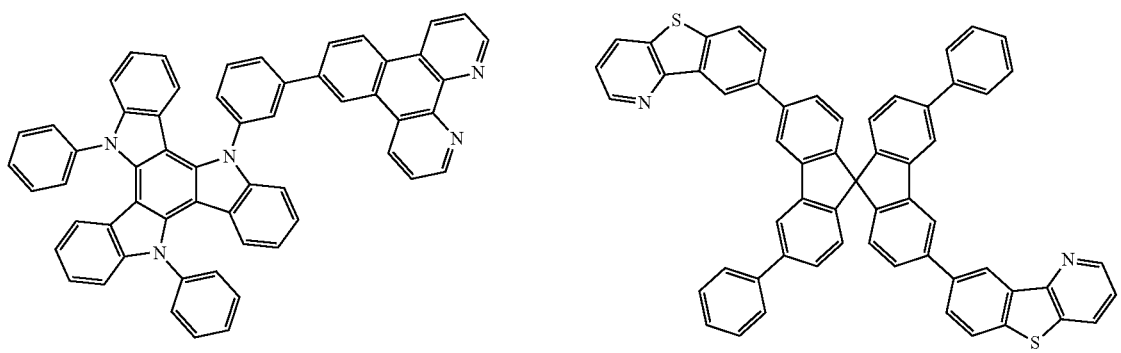
HS-187 HS-188
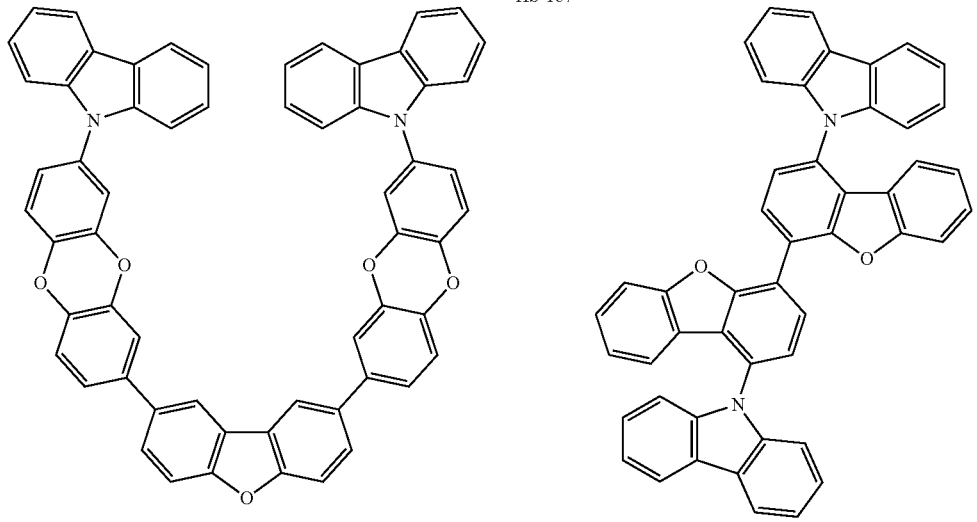

-continued
HS-189
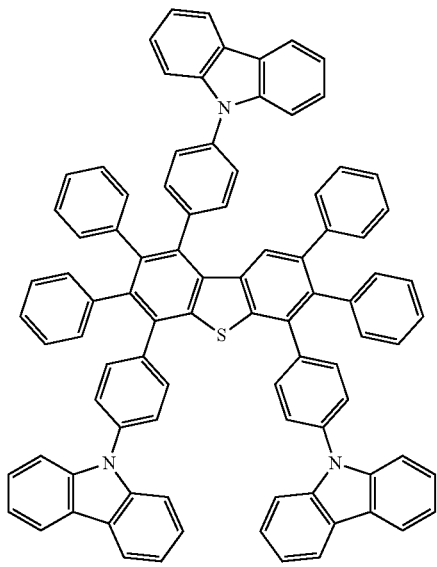
HS-190
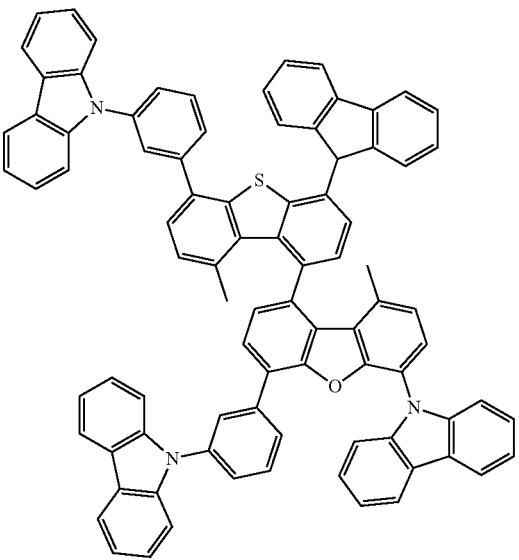
HS-191
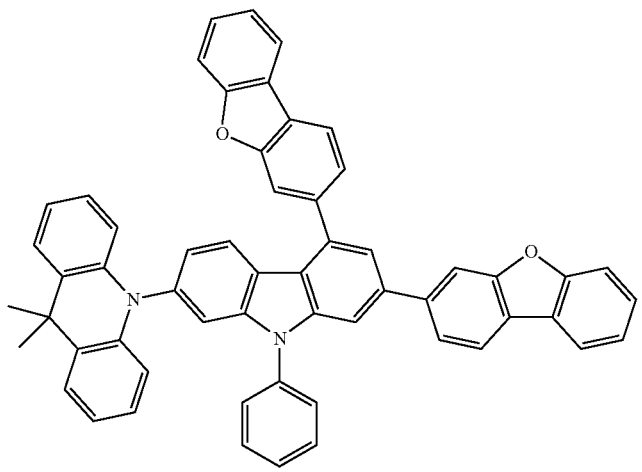
HS-192
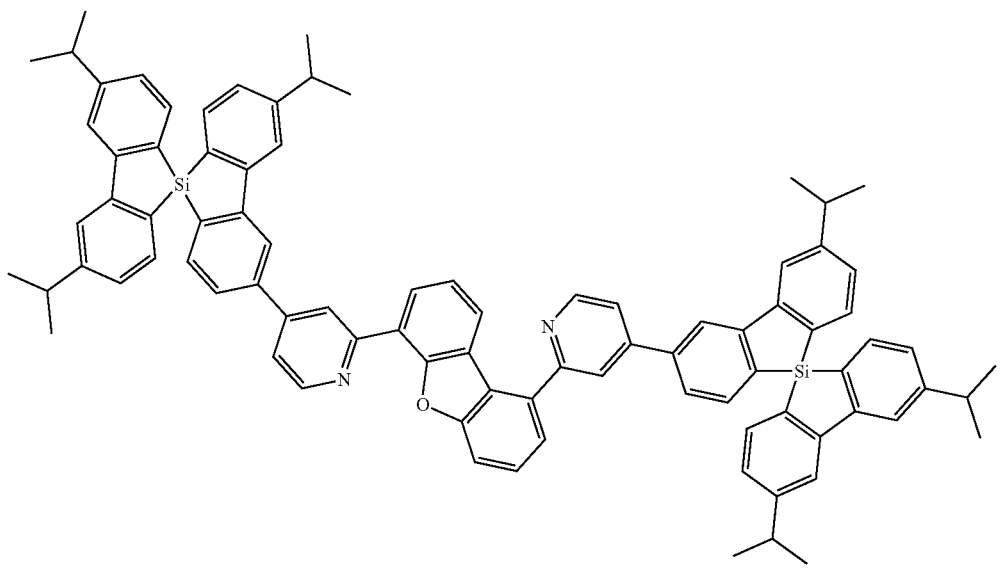

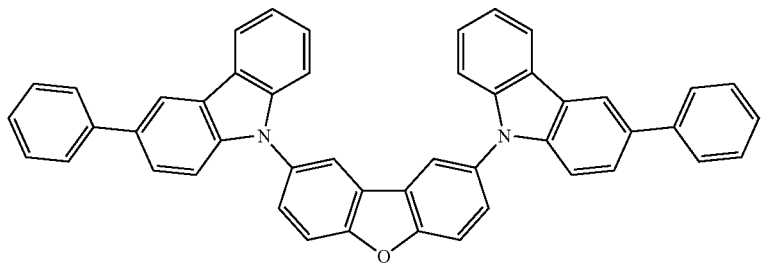

HS-193

<<Constituting Layers of Organic EL Element>>

The layers which constitute the organic EL element of the present invention will now be detailed. Preferred embodiments of the organic EL element of the present invention will be described below, however, the present invention is not limited to these.
(i) Anode/light emitting layer/electron transport layer/cathode
(ii) Anode/hole transport layer/light emitting layer/electron transport layer/cathode
(iii) Anode/hole transport layer/light emitting layer/hole blocking layer/electron transport layer/cathode
(iv) Anode/hole transport layer/light emitting layer/hole blocking layer/electron transport layer/cathode buffer layer/cathode
(v) Anode/anode buffer layer/hole transport layer/light emitting layer/hole blocking layer/electron transport layer/cathode buffer layer/cathode
(vi) Anode/hole transport layer/anode buffer layer/light emitting layer/hole blocking layer/electron transport layer/cathode buffer layer/cathode
(vii) Anode/anode buffer layer/hole transport layer/light emitting layer/electron transport layer/cathode buffer layer/cathode Further, it may be provided with a non-light emitting intermediate layer between the light emitting layers when plural light emitting layers are incorporated. In addition, it is possible to make a light emitting unit composed of organic layers including a light emitting layer excluding an anode and a cathode among the above-described constituting layers, and it is possible to laminate a plurality of light emitting units. In the plurality of light emitting units laminated, it may be provided with a non-light emitting intermediate layer between the light emitting units, and the intermediate layer may contain a charge generating layer.

The organic EL element of the present invention have preferably a white light emitting layer, and a lighting device employing this element is preferred.

Each of the layers which constitute the organic EL elements of the present invention will now be detailed.

<<Light Emitting Layer>>

The light emitting layer of the present invention is a layer, which emits light via recombination of electrons and holes injected from an electrode or a layer such as an electron transport layer or a hole transport layer. The light emission portion may be present either within the light emitting layer or at the interface between the light emitting layer and an adjacent layer thereof.

The total thickness of the light emitting layer is not particularly limited. However, in view of the layer homogeneity, the minimization of application of unnecessary high voltage during light emission, and the stability enhancement of the emitted light color against the drive electric current, the layer thickness is regulated preferably in the range of 2 nm-5 µm, more preferably in the range of 2 nm-200 nm, but most preferably in the range of 5 nm-100 nm.

The light emitting layer can be prepared by forming a thin layer made of a light emitting dopant and a host compound, which will be described later, with a vacuum evaporation method or a wet preparation method. A wet preparation method is also called as a wet process, and examples of this include: a spin coating method, a cast method, a die coating method, a blade coating method, a roll coating method, an inkjet method, a printing method, a spray coating method, a curtain coating method, and a LB method (Langmuir Blodgett method).

It is preferable that the light emitting layer of the organic EL element of the present invention incorporates at least two kinds of compounds: one is a light emitting dopant compound (a phosphorescent emitting dopant (or it is called as a phosphorescence dopant or a phosphorescence emitting dopant group) or a fluorescent dopant) and the other is a light emitting host compound. At least one of the light emitting dopants is a blue phosphorescence organic metal complex represented by the aforementioned Formula (1) or Formula (2), and at least one of the light emitting host compounds is a compound represented by the aforementioned Formula (H1).

(Light Emitting Dopant Compound)

The light emitting dopant compounds (it may be called as the light emitting dopants) of the present invention will now be described.

As light emitting dopants according to the present invention, it can be employed fluorescent dopants (also referred to as fluorescent compounds) and phosphorescent dopants (also referred to as phosphorescent emitting materials, phosphorescent compounds or phosphorescence emitting compounds).

(Phosphorescent Dopant (Also Referred to as Phosphorescence Emitting Dopant))

A phosphorescence dopant of the present invention will be described.

The phosphorescent dopant of the present invention is a compound, wherein emission from an excited triplet state thereof is observed, specifically, emitting phosphorescence at room temperature (25° C.) and exhibiting a phosphorescence quantum yield of 0.01 or more at 25° C. The phosphorescence quantum yield is preferably 0.1 or more.

The phosphorescence quantum yield can be determined via a method described in page 398 of Bunko II of Dai 4 Han Jikken Kagaku Koza 7 (Spectroscopy II of 4th Edition Lecture of Experimental Chemistry 7) (1992, published by Maruzen Co., Ltd.). The phosphorescence quantum yield in a solution can be determined using appropriate solvents. However, it is only necessary for the phosphorescent dopant of the present invention to exhibit the above phosphorescence quantum yield (0.01 or more) using any of the appropriate solvents.

Two kinds of principles regarding emission of a phosphorescent dopant are cited. One is an energy transfer-type, wherein carriers recombine on a host compound on which the carriers are transferred to produce an excited state of the host compound, and then via transfer of this energy to a phosphorescent dopant, emission from the phosphorescence-emitting dopant is realized. The other is a carrier trap-type, wherein a phosphorescence-emitting dopant serves as a carrier trap and then carriers recombine on the phosphorescent dopant to generate emission from the phosphorescent dopant. In each case, the excited state energy of the phosphorescent dopant is required to be lower than that of the host compound.

The light emitting layer of the present invention may further incorporate the compounds described in the following patent documents.

The patent documents are: WO 00/70655, JP-A Nos. 2002-280178, 2001-181616, 2002-280179, 2001-181617, 2002-280180, 2001-247859, 2002-299060, 2001-313178, 2002-302671, 2001-345183 and 2002-324679, WO 02/15645, JP-A Nos. 2002-332291, 2002-50484, 2002-322292 and 2002-83684, Japanese Translation of PCT International Application Publication No. 2002-540572, JP-A Nos. 2002-117978, 2002-338588, 2002-170684 and 2002-352960, WO 01/93642, JP-A Nos. 2002-50483, 2002-100476, 2002-173674, 2002-359082, 2002-175884, 2002-363552, 2002-184582 and 2003-7469, Japanese Translation of PCT International Application Publication No. 2002-525808, JP-A No. 2003-7471, Japanese Translation of PCT International Application Publication No. 2002-525833, JP-A Nos. 2003-31366, 2002-226495, 2002-234894, 2002-235076, 2002-241751, 2001-319779, 2001-319780, 2002-62824, 2002-100474, 2002-203679, 2002-343572 and 2002-203678.

(Fluorescent Dopant (Also Referred to as Fluorescent Compound))

As fluorescent dopants, listed are compounds exhibiting a high fluorescent quantum efficiency such as: coumarin based dyes, pyran based dyes, cyanine based dyes, croconium based dyes, squarylium based dyes, oxobenzanthracene based dyes, fluorescein based dyes, Rhodamine based dyes, pyrylium based dyes, perylene based dyes, stilbene based dyes, polythiophene based dyes, rare earth complex based fluorescent materials, or laser dyes.

Moreover, two or more sorts of compounds may be combined together and used for the light emitting dopants of the present invention. It is possible to use in combination with phosphorescence dopants each having a different structure or to use in combination of a fluorescence dopant and a phosphorescence dopant.

Specific examples of a phosphorescent dopant compound which can be preferably used in the present invention will be listed. However, the present invention is not limited to these.

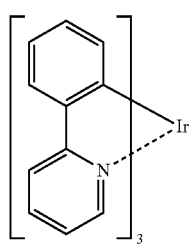

D-1

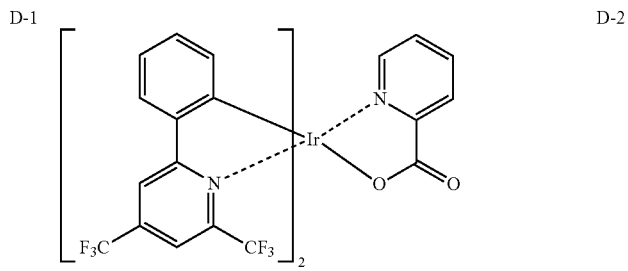

D-2

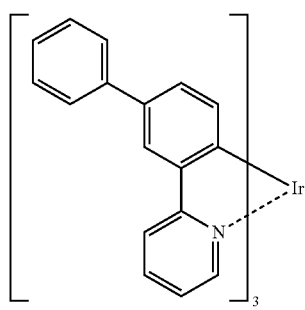

D-3

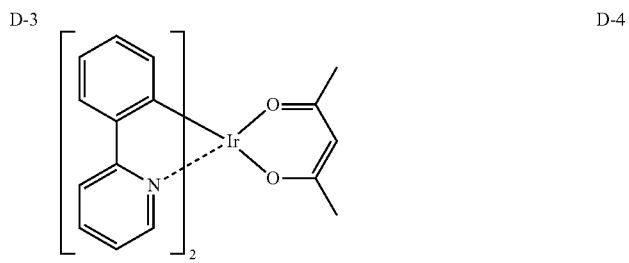

D-4

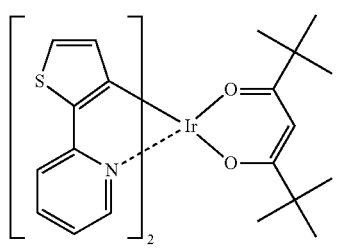

D-5

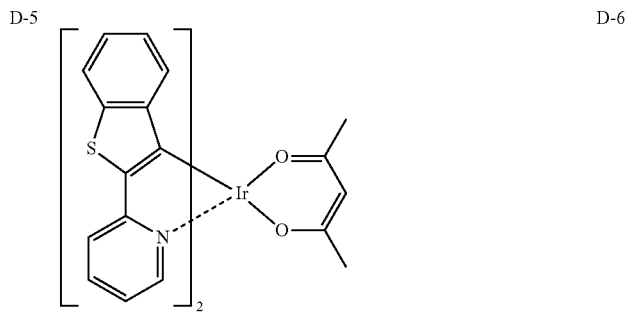

D-6

-continued
D-7
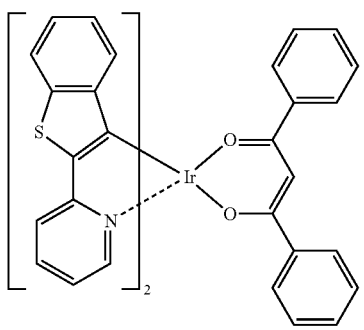
D-8
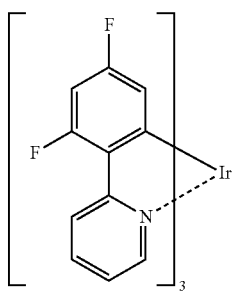
D-9
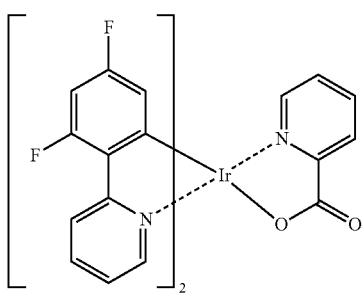
D-10
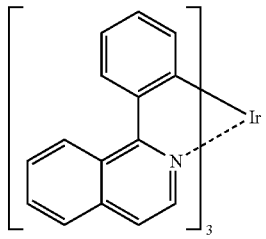
D-11
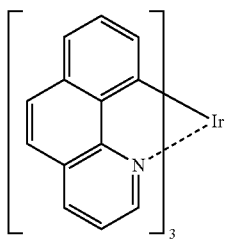
D-12
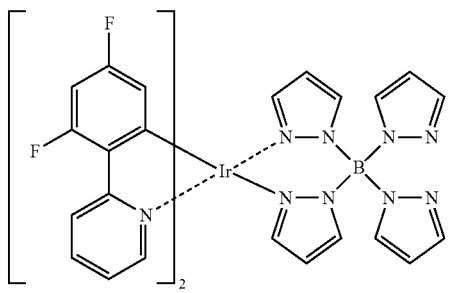
D-13
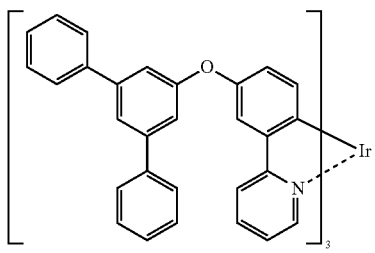
D-14
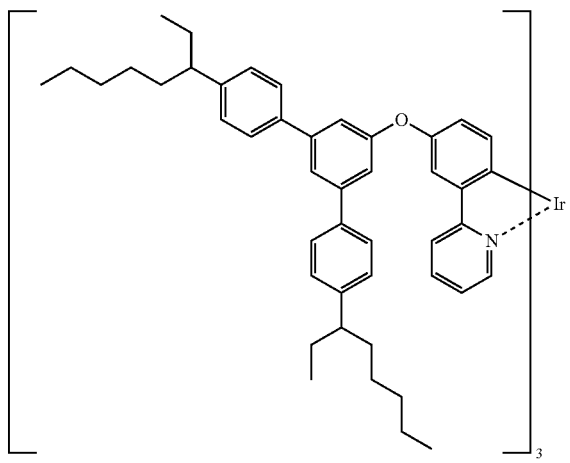

-continued
D-15
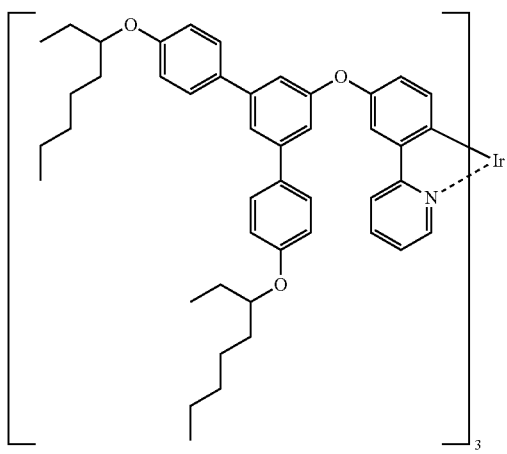
D-16
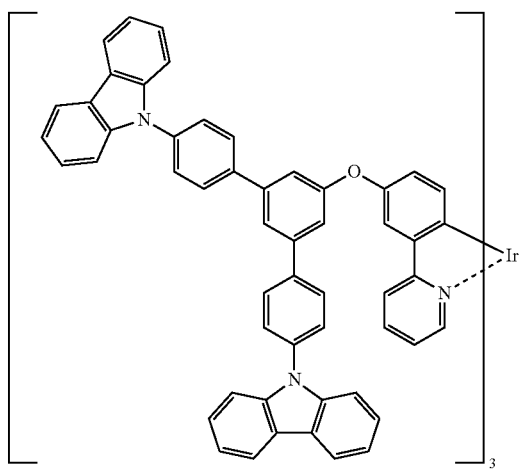
D-17
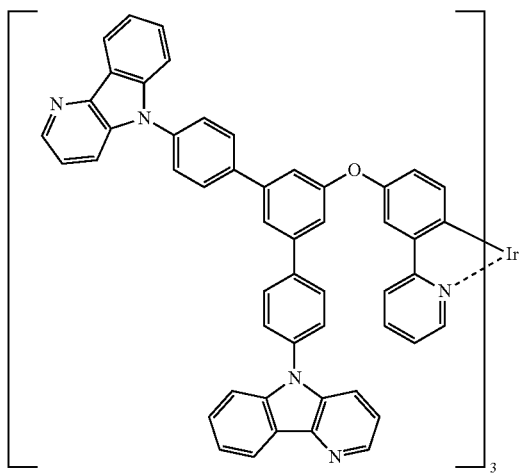
D-18
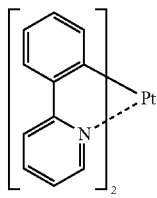
D-20
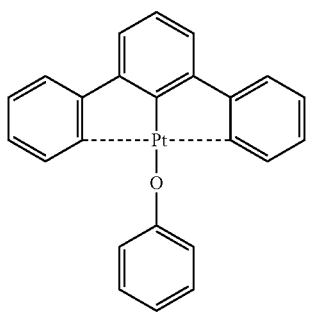
D-19
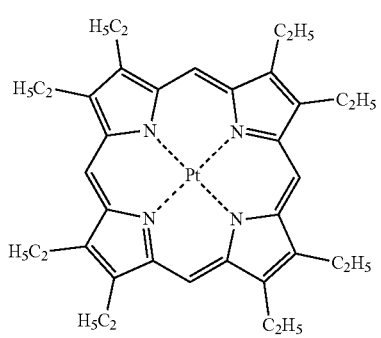
D-21
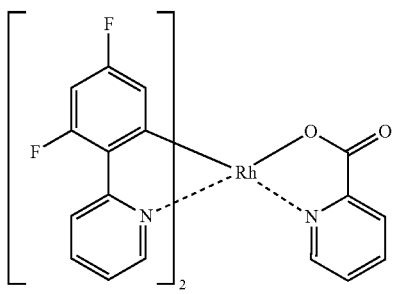
D-22
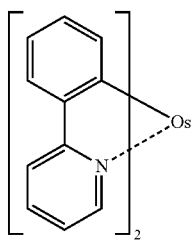

-continued
| | |
|---|---|
| D-23 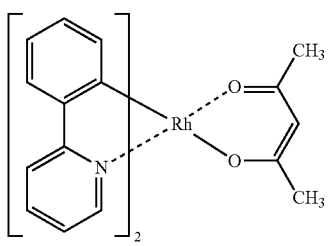 | D-24 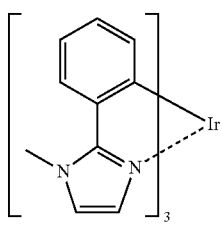 |
| D-25 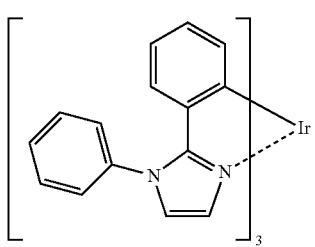 | D-26 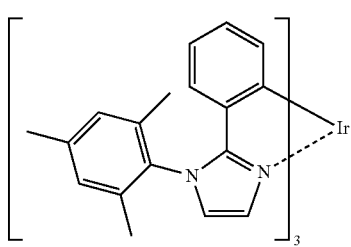 |
| D-27 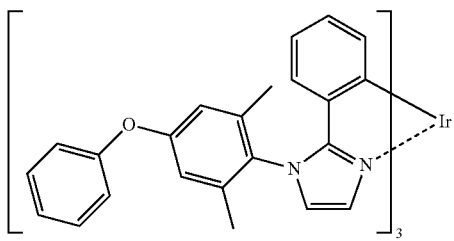 | D-28 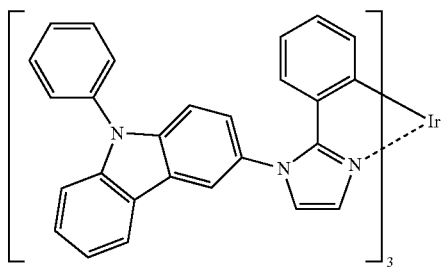 |
| D-29 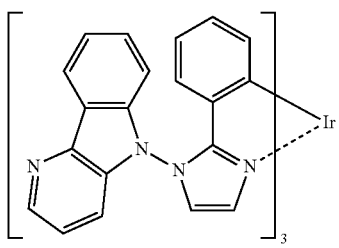 | D-30 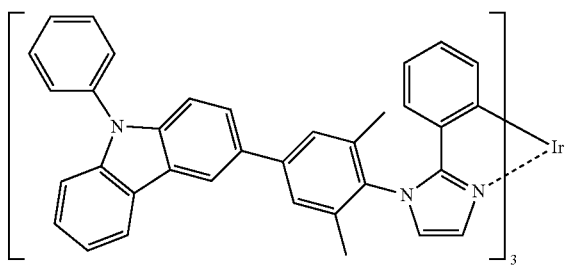 |
| D-31 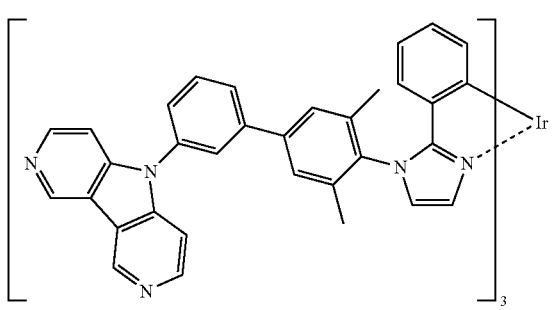 | |

-continued
D-32
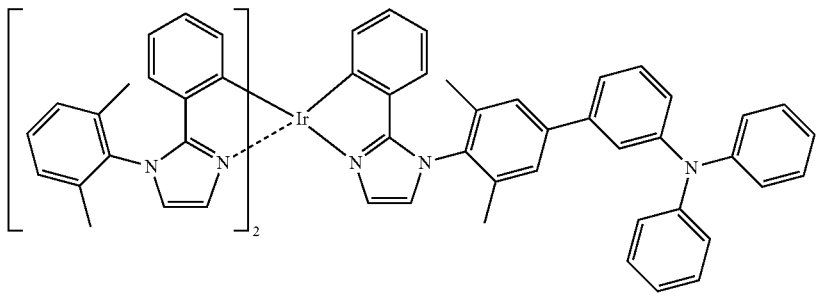
D-33
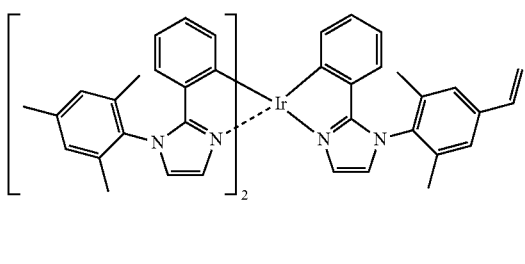
D-34
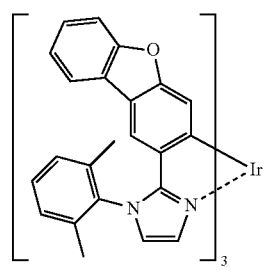
D-35
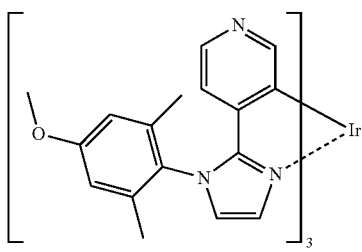
D-36
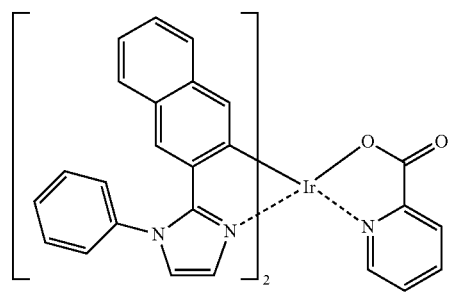
D-37
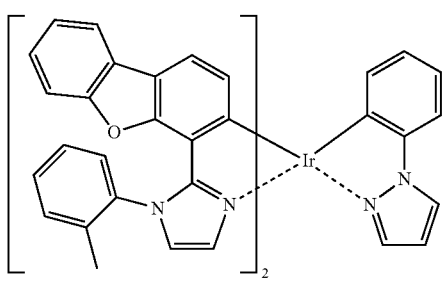
D-38
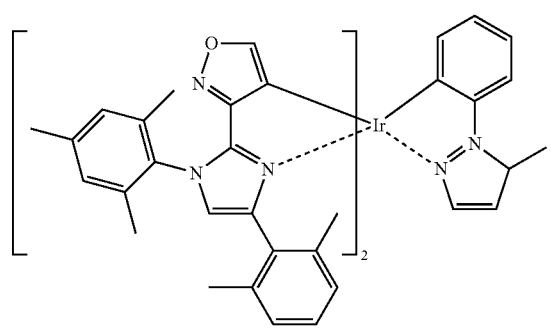

-continued
D-39
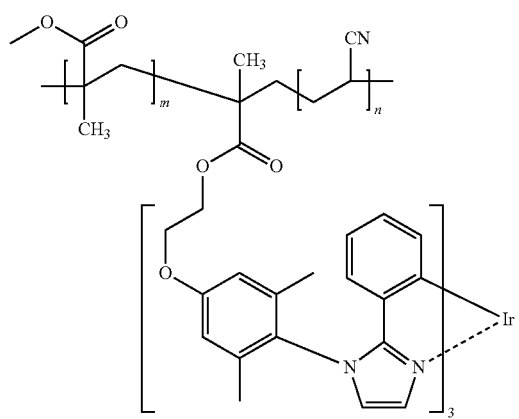
D-40
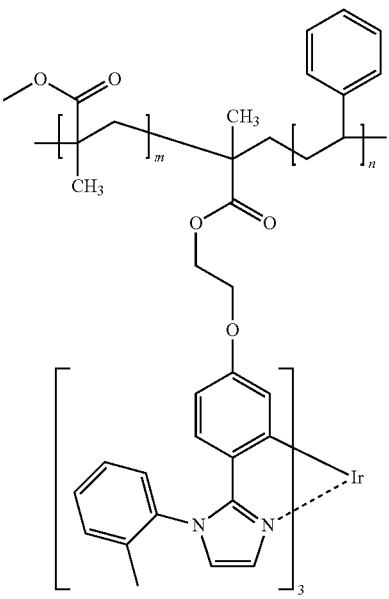
D-41
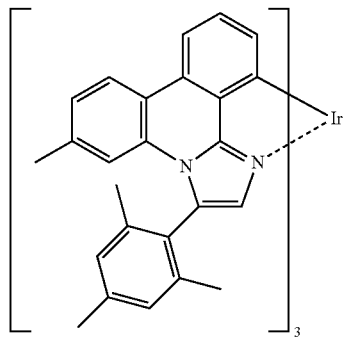
D-42
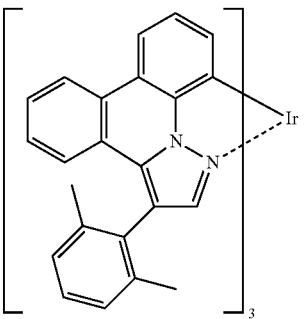
D-43
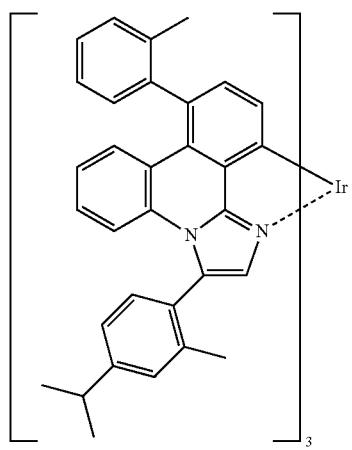
D-44
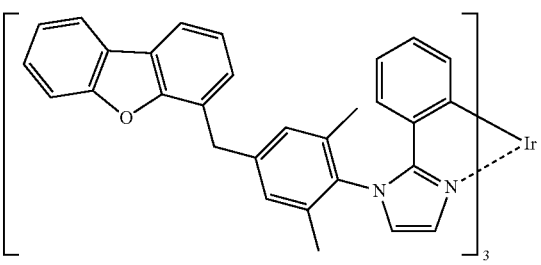

D-45
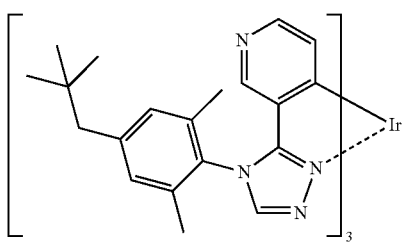

D-46
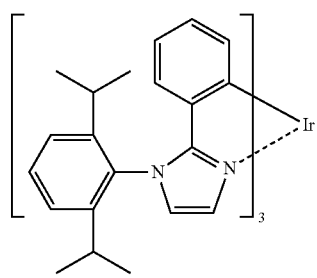

D-47
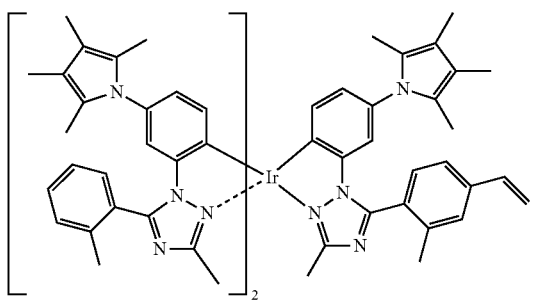

D-48
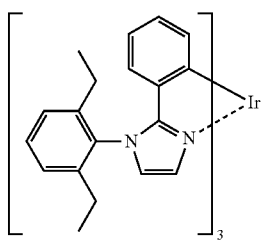

D-49
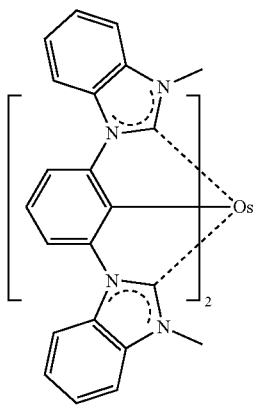

(Light Emitting Host Compound (Also Referred to as Light Emitting Host))

"Host compounds", as described in the present invention, are defined as compounds, incorporated in a light emitting layer, which result in a weight ratio of 20% or more in the above layer and also result in a phosphorescent quantum yield of the phosphorescence emission of less than 0.1 at room temperature (25° C.). Preferably, the phosphorescent quantum yield is less than 0.01. Further, among the compounds incorporated in the light emitting layer, it is preferable that the weight ratio of the host compound in the aforesaid layer is 20% or more.

The light emitting hosts which can be employed in the present invention are not particularly limited. Although the conventionally known host compounds in organic EL elements can be used, particularly preferable host compound used with the blue phosphorescence compound in the light emitting layer of the present invention is a compound represented by the aforementioned Formula (H1) relating to the present invention.

The conventionally known host compounds may be used with the in organic EL elements can be used with the compound represented by Formula (H1) relating to the present invention. Representative compounds include those having a basic skeleton such as carbazole derivatives, triarylamine derivatives, aromatic compound derivatives, nitrogen-containing heterocyclic compounds, thiophene derivatives, furan derivatives, oligoarylene compounds, carboline derivatives, or diazacarbazole derivatives (here, "a diazacarbazole derivative" indicates a compound having a structure in which at least one of the carbon atoms in a hydrocarbon ring constituting the carboline ring is replaced with a nitrogen atom).

A known light emitting host (or emission host) which may be used in the present invention is preferably a compound having a hole transporting ability and an electron transporting ability, as well as preventing elongation of an emission wavelength and having a high Tg (a glass transition temperature). Preferably, the host compound has Tg of 100° C. or more.

It is possible to control the transfer of charges by making use of a plurality of host compounds, which results in high efficiency of an organic EL element.

In addition, it is possible to mix a different emission lights by making use of a plurality of known phosphorescent dopants as described above. Any required emission color can be obtained thereby.

Further, an emission host used in the present invention may be either a low molecular weight compound or a polymer compound having a repeating unit, in addition to a low molecular weight compound provided with a polymerizing group such as a vinyl group and an epoxy group (an polymerizable emission host). These compounds may be used singly or in combination of two or more compounds.

As specific examples of a known emission host compound, the compounds described in the following documents are preferable.

For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

Specific known compounds used as an emission host in the light emitting layer of the organic EL element of the present invention are compounds described in WO 2011/132493, paragraphs [0100] to [0110], for example. However, the present invention is not limited to these.

<<Injection Layer: Hole Injection Layer (Mode Buffer Layer) and Electron Injection Layer (Cathode Buffer Layer)>>

An injection layer is appropriately provided and there are two types: an electron injection layer and a hole injection layer, which may be arranged between an anode and a light emitting layer or a hole transport layer, and between a cathode and a light emitting layer or an electron transport layer, as described above.

An injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)", and includes a hole injection layer (an anode buffer layer) and an electron injection layer (a cathode buffer layer).

An anode buffer layer (a hole injection layer) is also detailed in such as JP-A Nos. 9-45479, 9-260062 and 8-288069, and specific examples include: a phthalocyanine buffer layer comprising such as copper phthalocyanine; an oxide buffer layer comprising such as vanadium oxide; an amorphous carbon buffer layer; a polymer buffer layer employing conductive polymer such as polyaniline (or called as emeraldine) or polythiophene; and an orthometalated complex layer comprising such as an iridium complex. Further, an azatriphenylene derivative described in JP-A Nos. 2003-519432 and 2006-135145 can be also used as a hole injection material.

A cathode buffer layer (an electron injection layer) is detailed in JP-A Nos. 6-325871, 9-17574, and 10-74586. Examples of a cathode buffer layer (an electron injection layer) include: a metal buffer layer made of such as strontium and aluminum; an alkaline metal buffer layer made of such as lithium fluoride, sodium fluoride, or potassium fluoride; an alkaline earth metal buffer layer made of such as magnesium fluoride; and an oxide buffer layer made of such as aluminum oxide. The above-described buffer layer (injection layer) is preferably a very thin layer, and the layer thickness is preferably in the range of 0.1 nm-5 μm, although it depends on a raw material.

The material used for an anode buffer layer or for a cathode buffer layer can be used in combination with other material. For example, it is possible to use by mixing in a hole transport layer or in an electron transport layer.

<<Hole Transport Layer>>

A hole transport layer contains a material having a function of transporting a hole, and in a broad meaning, a hole injection layer and an electron blocking layer are also included in a hole transport layer. A single layer of or plural layers of a hole transport layer may be provided.

A hole transport material is those having any one of a property to inject or transport a hole or a barrier property to an electron, and may be either an organic substance or an inorganic substance. For example, listed are a triazole derivative, an oxadiazole derivative, an imidazole derivative, a polyarylalkane derivative, a pyrazolone derivative, a phenylenediamine derivative, an arylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer and specifically preferably such as thiophene oligomer. Further, an azatriphenylene derivative described in JP-A Nos. 2003-519432 and 2006-135145 can be also used as a hole transport material.

As a hole transport material, those described above can be utilized, however, it is preferable to utilized a porphyrin compound, an aromatic tertiary amine compound and a styrylamine compound, and specifically preferably an aromatic tertiary amine compound.

Typical examples of an aromatic tertiary amine compound and a styrylamine compound include: N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quadriphenyl; N,N,N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N,N-diphenylaminostilbene; and N-phenylcarbazole, in addition to those having two condensed aromatic rings in the molecule described in U.S. Pat. No. 5,061,569, such as 4,4'-bis[N-(1-naphthyl)-N-phenylamino]biphenyl (NDP), and 4,4',4"-tris[N-(3-methylphenyl)-N-phenylamino]triphenylamine (MDTDATA), in which three of triphenylamine units are bonded in a star burst form, described in JP-A No. 4-308688.

Polymer materials, in which these materials are introduced in a polymer chain or constitute the main chain of polymer, can be also utilized.

Further, an inorganic compound such as a p type-Si and a p type-SiC can be utilized as a hole injection material and a hole transport material.

Moreover, it can be used a cyclometalated complex and an orthometalated complex such as Copper phthalocyanine and tris(2-phenylpyridine) iridium as a hole transport material.

Further, it is possible to employ so-called p type hole transport materials, as described in Japanese Patent Publication Open to Public Inspection (referred to as JP-A) No. 11-251067, and J. Huang et al. reference (Applied Physics Letters 80 (2002), p. 139). In the present invention, since high efficiency light emitting elements are prepared, it is preferable to employ these materials.

This hole transport layer can be prepared by forming a thin layer made of the above-described hole transport material according to a method well known in the art such as a vacuum evaporation method, a spin coating method, a cast method, an inkjet method and a LB method.

The layer thickness of a hole transport layer is not specifically limited, however, it is generally 5 nm-5 μm, and preferably 5 nm-200 nm. This hole transport layer may have a single layer structure comprised of one or plural types of the above described materials.

Further, it is possible to employ a hole transport layer of a higher p property which is doped with impurities. As its example, listed are those described in each of JP-A Nos. 4-297076, 2000-196140, 2001-102175, as well as in J. Appl. Phys., 95, 5773 (2004).

In the present invention, it is preferable to employ a hole transport layer of such a high p property, since it is possible to produce an element of lower electric power consumption.

There are given examples of the compound preferably used for formation of the hole transport layer of the organic EL element of the present invention. However, the present invention is not limited to these.

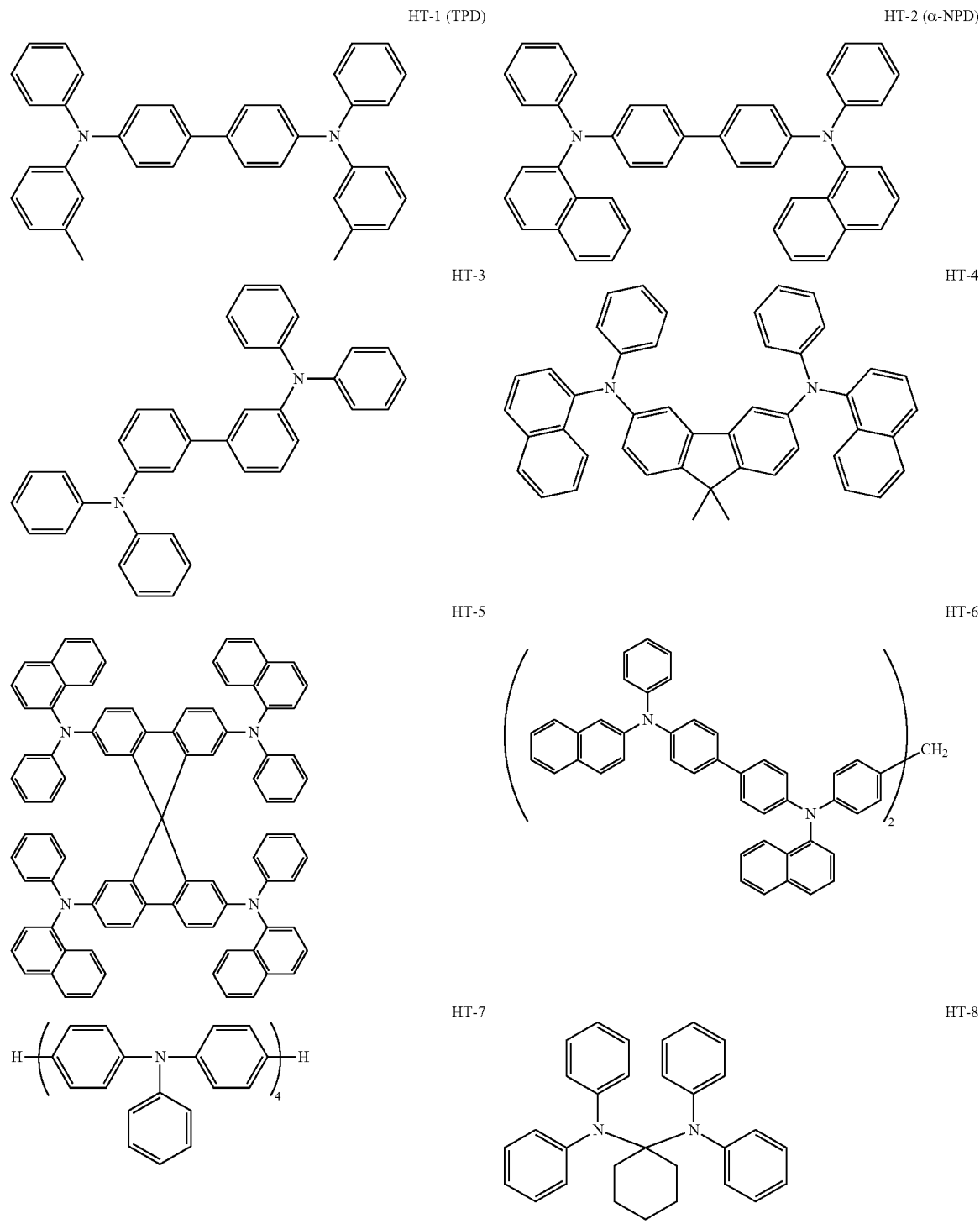

-continued
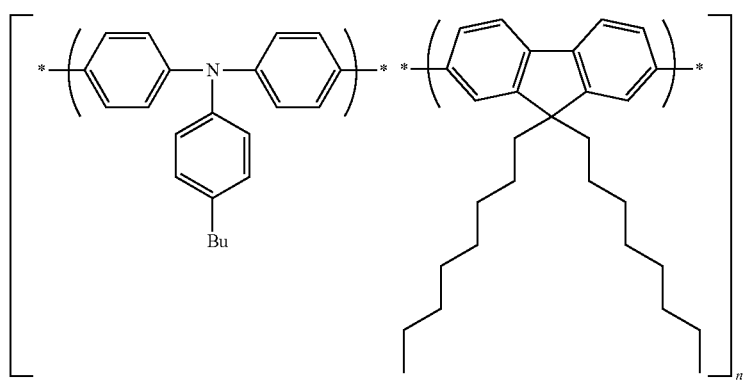
HT-9 (F8-TFB)
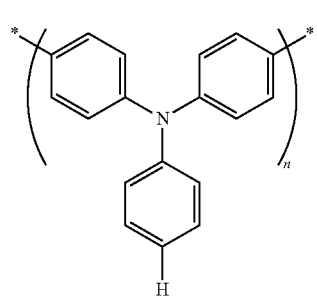
HT-10
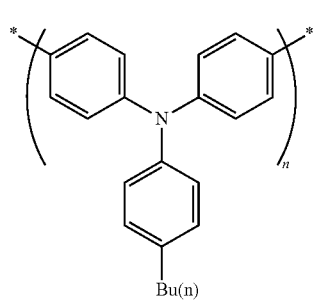
HT-11
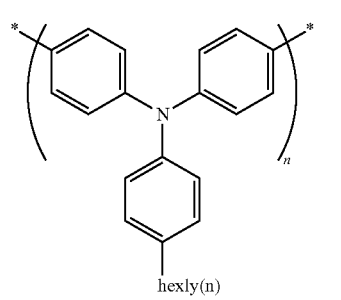
HT-12
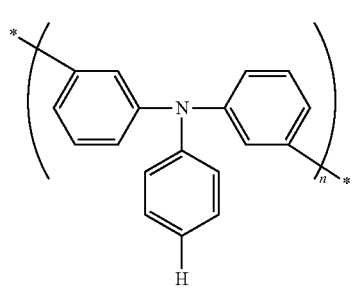
HT-13
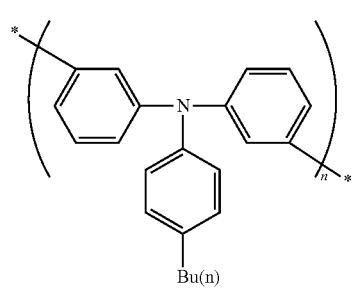
HT-14
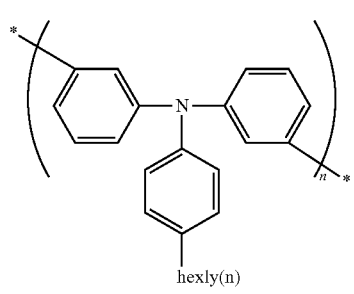
HT-15
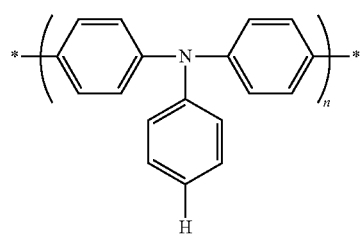
HT-16
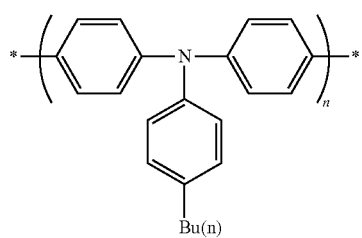
HT-17

-continued
HT-18
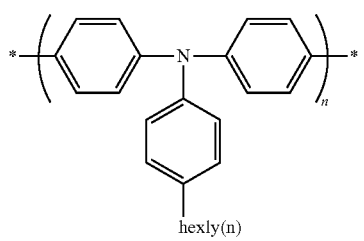
HT-19
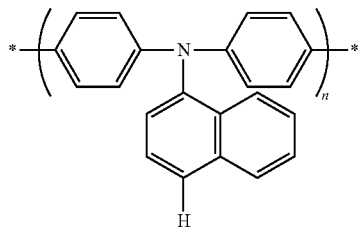
HT-20
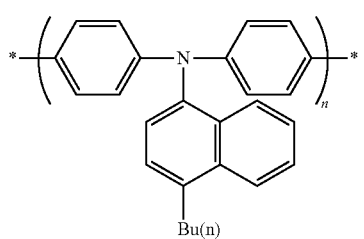
HT-21
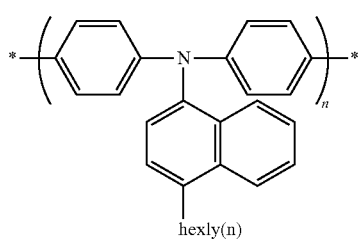
HT-22
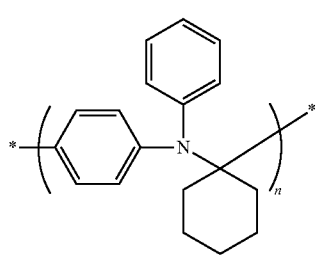
HT-23
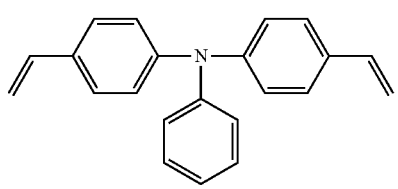
HT-24
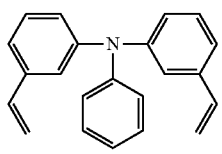
HT-25
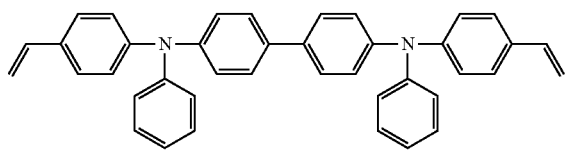
HT-26
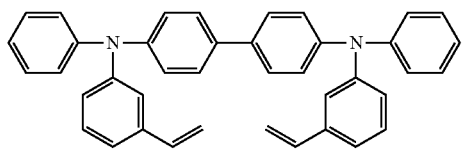
HT-27
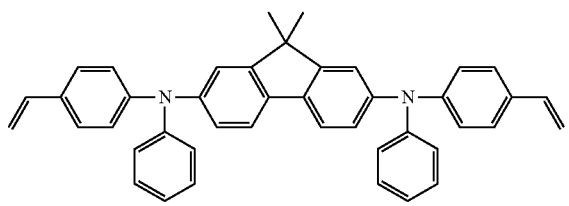
HT-28
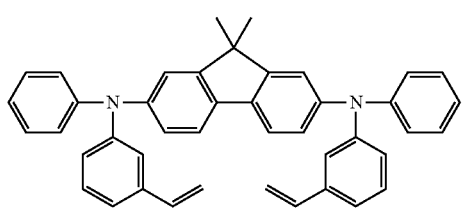
HT-29
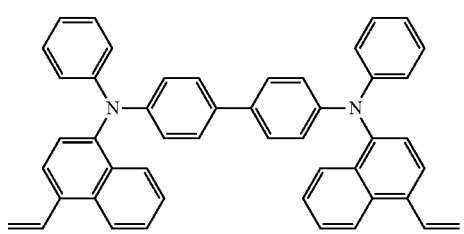

-continued
HT-30
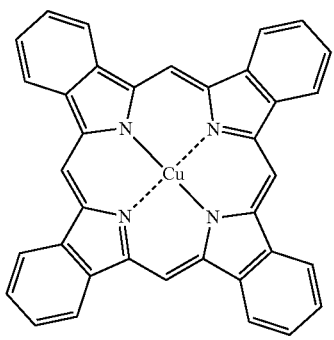
HT-31
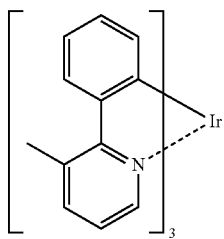
HT-32
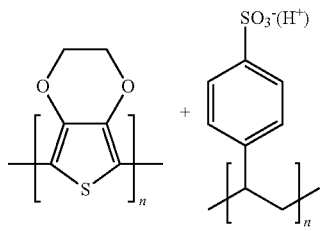
HT-33
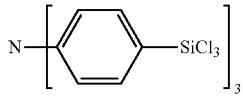
HT-34
HT-35
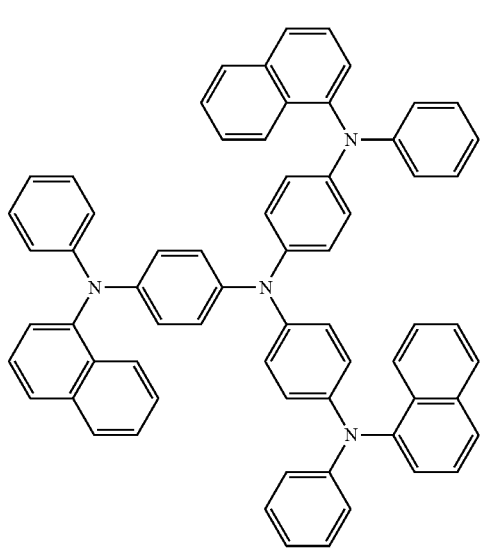
HT-36
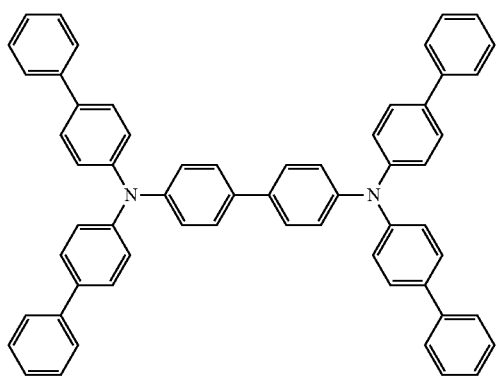
HT-37
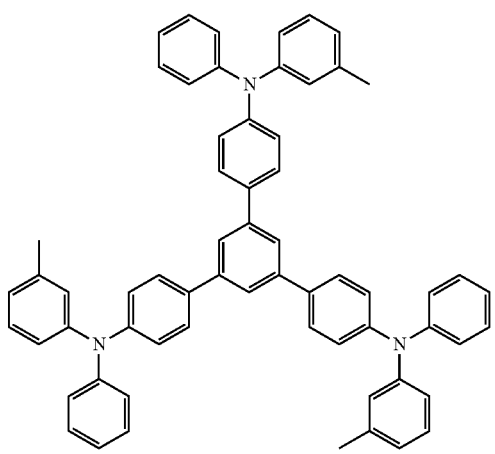

-continued
HT-38
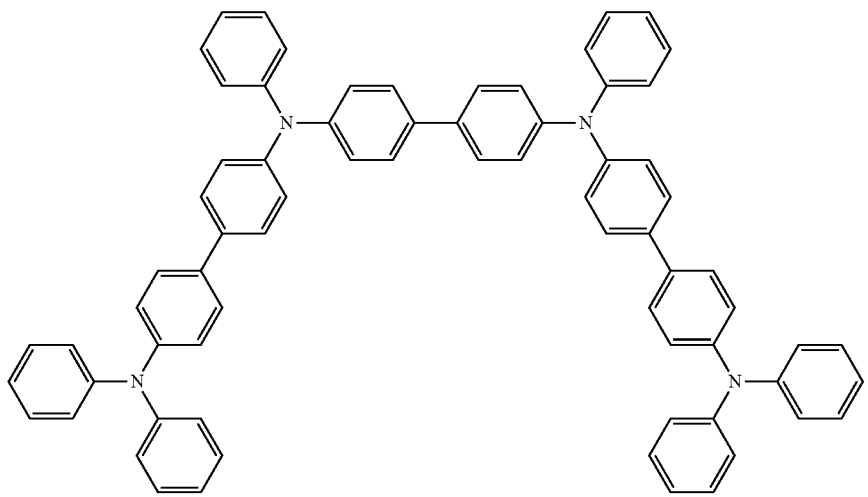
HT-39
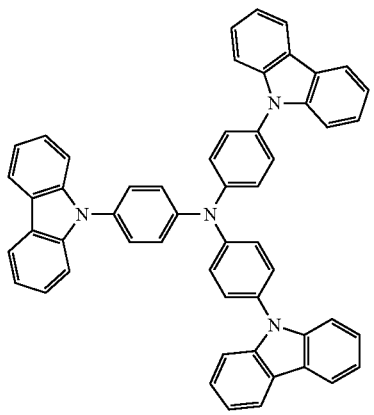
HT-40
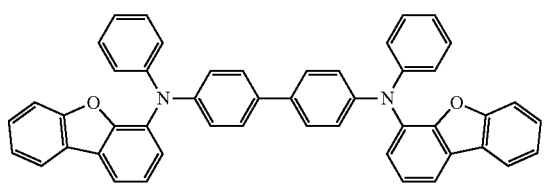
HT-41
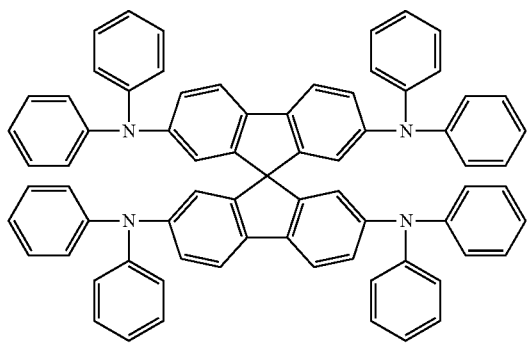
HT-42
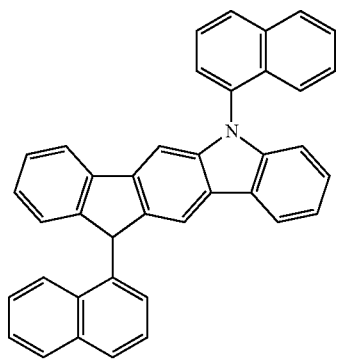
HT-43
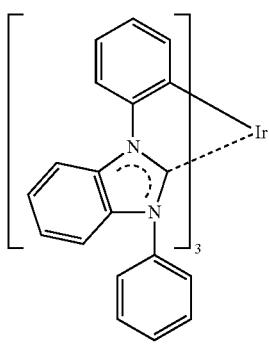
HT-44
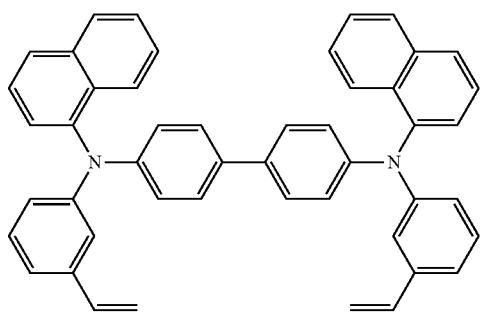

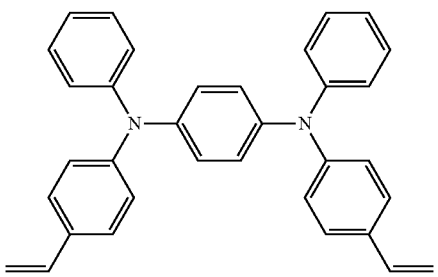

HT-45

<<Electron Transport Layer>>

An electron transport layer is composed of a material having a function to transfer an electron, and an electron injection layer and a hole blocking layer are included in an electron transport layer in a broad meaning. A single layer or plural layers of an electron transport layer may be provided.

As an electron transport material (including a hole blocking material and an electron injection material) used for an electron transport layer is only required to have a function of transporting electrons ejected from the cathode to the light emitting layer. As materials to form an electron transport layer, any of the conventional compounds may be selected and they can be employed singly or jointly.

Examples of them (hereinafter, they are called as an electron transport material) include: a nitro-substituted fluorene derivative, a diphenylquinone derivative, a thiopyradineoxide derivative, heterocyclic tetracarboxylic acid anhydride such as naphthalene perylene, carbodiimide, a fluorenylidenemethane derivative, anthraquinonedimethane, an anthrone derivative, an oxadiazole derivative, a carboline derivative and an azacarbazole derivative.

Here, "an azacarbazole derivative" indicates a compound having a structure in which at least one of the carbon atoms constituting the carboline ring is replaced with one or more nitrogen atoms.

Further, as examples of an oxadiazole derivative described above, the following compounds can be used as an electron transport material: a thiadiazole derivative in which an oxygen atom in the oxadiazole ring is replaced with a sulfur atom; and a quinoxaline derivative which contains a quinoxaline ring known as an electron withdrawing group.

Polymer materials, in which these materials are introduced in a polymer chain or these materials form the main chain of polymer, can be also utilized.

Further, a metal complex of a 8-quinolinol derivative such as tris(8-quinolinol)aluminum (Alq$_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transport material.

Further, metal-free or metal phthalocyanine, or a compound whose terminal is substituted by an alkyl group or a sulfonic acid group, can be preferably utilized as an electron transport material.

In the same manner as for a hole injection layer and hole transport layer, an inorganic semiconductor such as an n-type-Si and an n-type-SiC can be also utilized as an electron transport material.

The preparation method of the constituting layers of the organic EL element will be described in detail in the portion of preparation of an organic EL element.

The layer thickness of the electron transport layer of the present invention is not specifically limited; however, it is generally 5 nm-5,000 nm, and preferably it is 5 nm-200 nm. This electron transport layer may be a single layer structure containing of one or more types of the above described materials.

Further, it is possible to employ an electron transport layer of a higher n property which is doped with impurities. As its example, listed are those described in each of JP-A Nos. 4-297076, 10-270172, 2000-196140, 2001-102175, as well as in J. Appl. Phys., 95, 5773 (2004).

Next, there will be listed specific example compounds (electron transport materials) known in the art and preferably used in the electron transport layer of the white light emitting organic EL element. However, the present invention is not limited to them.

ET-1

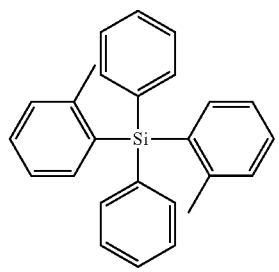

ET-2 (BCP)

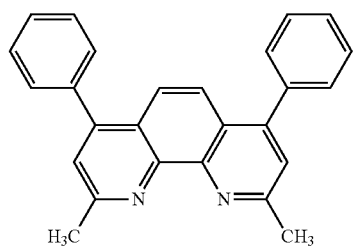

ET-3(PBD)

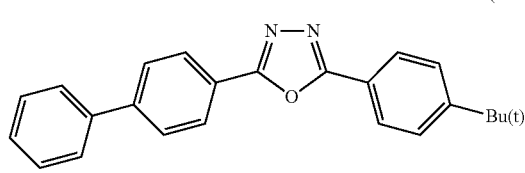

ET-4
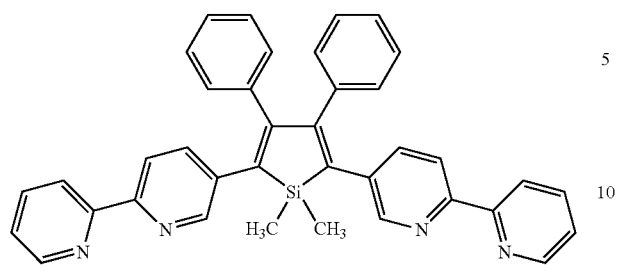
ET-8 (BAlq)
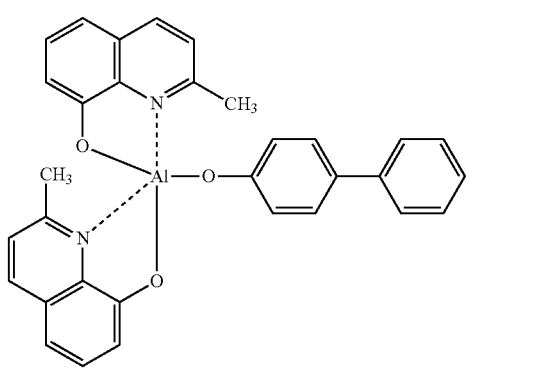
ET-5
ET-9
ET-6
ET-10
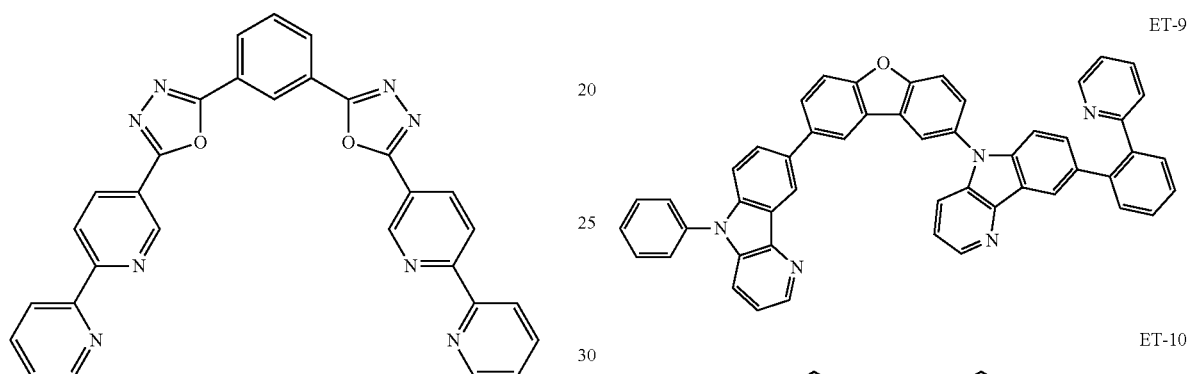
ET-11
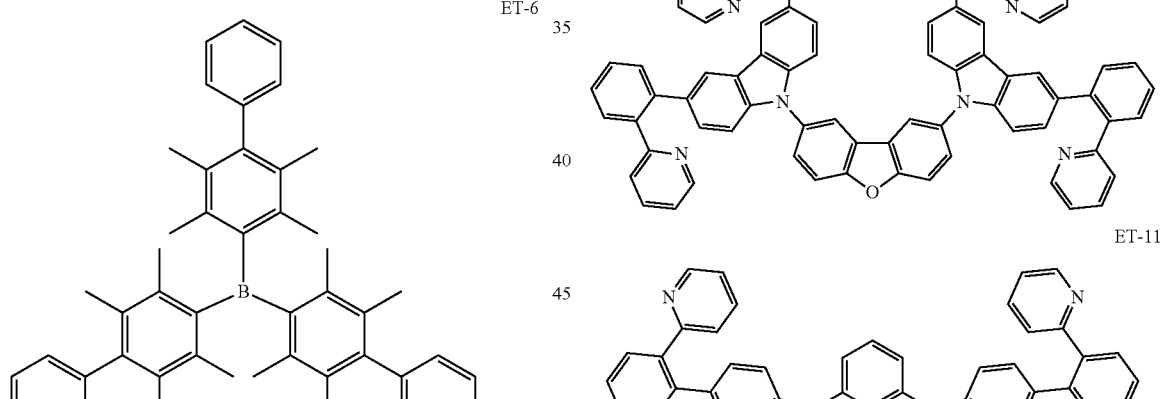
ET-7 (Alq₃)
ET-12
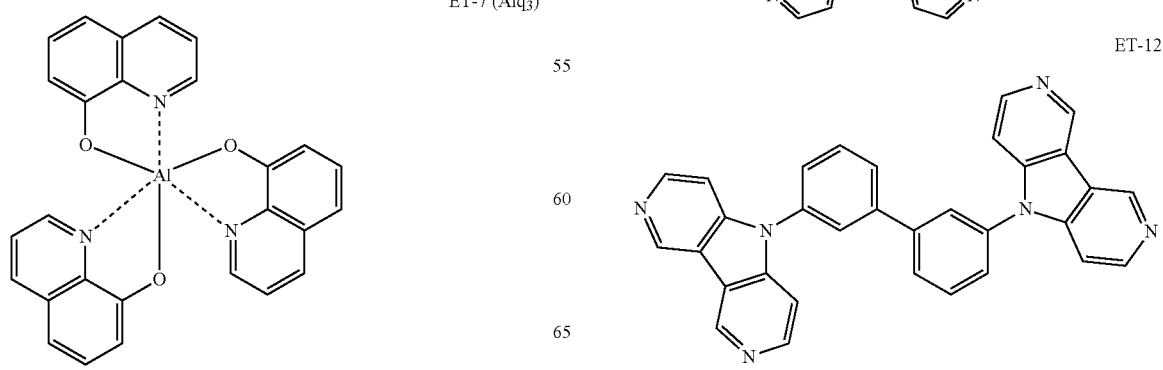

ET-13

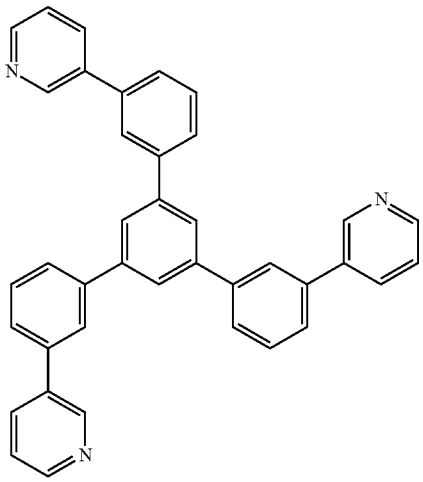

ET-14

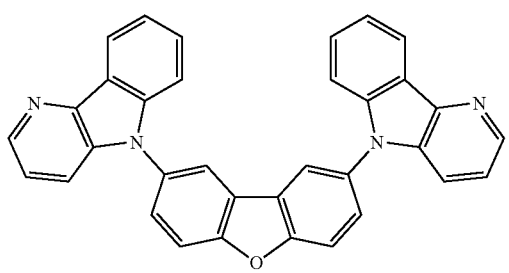

ET-15

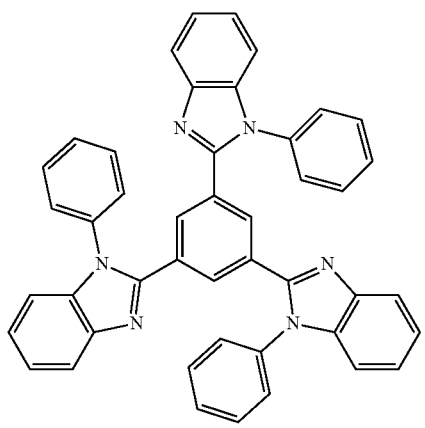

ET-16

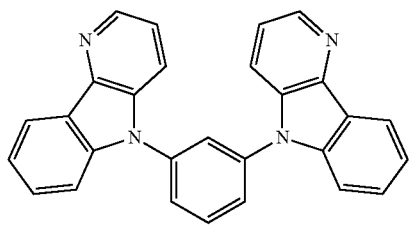

ET-17

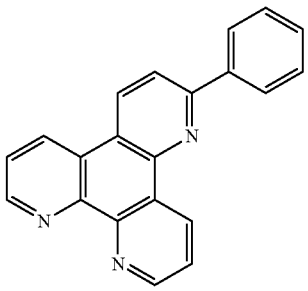

<<Blocking Layer: Hole Blocking Layer, Electron Blocking Layer>>

A blocking layer is appropriately provided in addition to the basic constitution layers composed of organic thin layers as described above. Examples are described in such as JP-A Nos. 11-204258 and 11-204359 and p. 273 of "Organic EL Elements and Industrialization Front Thereof (Nov. 30 (1998), published by N. T. S. Corp.)" is applicable to a hole blocking (hole block) layer according to the present invention.

A hole blocking layer, in a broad meaning, is provided with a function of electron transport layer, being comprised of a material having a function of transporting an electron but a very small ability of transporting a hole, and can improve the recombination probability of an electron and a hole by blocking a hole while transporting an electron.

Further, a constitution of an electron transport layer described above can be appropriately utilized as a hole blocking layer according to the present invention.

The hole blocking layer of the organic EL element of the present invention is preferably arranged adjacent to the light emitting layer.

It is preferable that the hole blocking layer incorporates a nitrogen containing compound such as: a carbazole derivative, an azacarbazole derivative (here, "an azacarbazole derivative" indicates a compound having a structure in which at least one of the carbon atoms constituting the carboline ring is replaced with one or more nitrogen atoms), or a pyridine derivative.

Further, in the present intention, in the case in which a plurality of light emitting layers which differ in a plurality of different emitted light colors, it is preferable that the light emitting layer which results in the shortest wavelength of the emitted light maximum wavelength is nearest to the anode in all light emitting layers. However, in such a case, it is preferable to additionally arrange the hole blocking layer between the aforesaid shortest wavelength layer and the light emitting layer secondly near the anode.

Further, at least 50% by weight of the compounds incorporated in the hole blocking layer arranged in the aforesaid position preferably exhibits the ionization potential which is greater by at least 0.3 eV than that of the host compounds of the aforesaid shortest wavelength light emitting layer.

The ionization potential is defined as energy which is necessary to release electrons in the HOMO (being the highest occupied molecular orbital) to the vacuum level, and may be determined via, for example, the method described below.
(1) By employing Gaussian98 (Gauaaian98, Revision A. 11. 4, M. J. Frisch, et al. Gaussian 98(Gaussian98, Revision A. 11. 4, M. 3. Frisch, et al, Gaussian, Inc., Pittsburgh Pa., 2002), which is a molecular orbital calculation software, produced by Gaussian Co. in the United State of America, and by employing B3LYP/6-31G* as a key word, the value (in terms of corresponding eV unit) was computed, and it is possible to obtain the ionization potential by rouging off the second decimal point. The background, in which the resulting calculated values are effective, is that the calculated values obtained by the above method exhibit high relationship with the experimental values.

(2) It is possible to determine the ionization potential via a method in which ionization potential is directly determined employing a photoelectron spectrometry. For example, by employing a low energy electron spectrophotometer "Model AC-1", produced by Riken Keiki Co., or appropriately employ a method known as an ultraviolet light electron spectrometry.

On the other hand, the electron blocking layer, as described herein, has a function of the hole transport layer in a broad sense, and is composed of materials having markedly small capability of electron transport, while having capability of transporting holes and enables to enhance the recombination probability of electrons and holes by inhibiting electrons, while transporting electrons.

Further, it is possible to employ the constitution of the hole transport layer, described below, as an electron blocking layer when needed. The thickness of the hole blocking layer and the electron transport layer according to the present invention is preferably 3-100 nm, but is more preferably 3-30 nm.

<<Anode>>

As an anode according to an organic EL element of the present invention, those comprising metal, alloy, a conductive compound, which is provided with a large work function (not less than 4 eV), and a mixture thereof as an electrode substance are preferably utilized. Specific examples of such an electrode substance include a conductive transparent material such as metal like Au, CuI, indium tin oxide (ITO), $SnO_2$ and ZnO.

Further, a material such as IDIXO ($In_2O_3$—ZnO), which can prepare an amorphous and transparent electrode, may be also utilized. As for an anode, these electrode substances may be made into a thin layer by a method such as evaporation or spattering and a pattern of a desired form may be formed by means of photolithography, or in the case of requirement of pattern precision is not so severe (about 100 μm or more), a pattern may be formed through a mask of a desired form at the time of evaporation or spattering of the above-described substance.

Alternatively, when coatable materials such as organic electrically conductive compounds are employed, it is possible to employ a wet system filming method such as a printing system or a coating system. When emission is taken out of this anode, the transmittance is preferably set to not less than 10% and the sheet resistance as an anode is preferably a few hundreds $\Omega/\square$ or less. Further, although the layer thickness depends on a material, it is generally selected in the range of 10 nm-1,000 nm and preferably of 10 nm-200 nm.

<<Cathode>>

On the other hand, as a cathode according to the present invention, metal, alloy, a conductive compound and a mixture thereof, which have a small work function (not more than 4 eV), are utilized as an electrode substance.

Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal.

Among them, with respect to an electron injection property and durability against such as oxidation, preferable are: a mixture of electron injecting metal with a second metal which is stable metal having a work function larger than electron injecting metal. Examples thereof are: a magnesium/silver mixture, a magnesium/aluminum mixture, a magnesium/indium mixture, an potassium/aluminum mixture and aluminum.

As for a cathode, these electrode substances may be made into a thin layer by a method such as evaporation or spattering. Further, the sheet resistance as a cathode is preferably not more than a few hundreds $\Omega/\square$ and the layer thickness is generally selected in a range of 10 nm-5 μm and preferably of 50 nm-200 nm.

Herein, to transmit produced emission, either one of an anode or a cathode of an organic EL element is preferably transparent or translucent to improve the emission luminance.

Further, after forming, on the cathode, the above metals at a film thickness of 1 nm-20 nm, it is possible to prepare a transparent or translucent cathode in such a manner that electrically conductive transparent materials are prepared thereon. By applying the above, it is possible to produce an element in which both anode and cathode are transparent.

<<Support Substrate>>

A support substrate according to an organic EL element of the present invention is not specifically limited with respect to types of such as glass and plastics. The support substrate may be also called as substrate body, substrate, substrate substance, or support. They may be transparent or opaque. However, a transparent support substrate is preferable when the emitting light is taken from the side of the support substrate.

Support substrates preferably utilized includes such as glass, quartz and transparent resin film. A specifically preferable support substrate is a resin film capable of providing an organic EL element with a flexible property.

Resin films includes such as: polyesters such as polyethylene terephthalate (PET) and polyethylene naphthalate (PEN); polyethylene, polypropylene; cellulose esters or their derivatives such as cellophane, cellulose diacetate, cellulose tiacetate, cellulose acetate butylate, cellulose acetate propionate (CAP), cellulose acetate phthalate (TAC) and cellulose nitrate; polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyetherimide, polyether ketone imide, polyamide, fluororesin, Nylon, polymethylmethacrylate, acrylic resin, polyacrylate; and cycloolefin resins such as ARTON (produced by JSR Co. Ltd.) and APEL (produce by Mitsui Chemicals, Inc.).

On the surface of a resin film, it may be formed a film incorporating an inorganic or an organic compound or a hybrid film incorporating both compounds. Barrier films are preferred at a water vapor permeability (25±0.5° C., and relative humidity (90±2) % RH) of 0.01 g/($m^2 \cdot 24$ h) or less, determined based on JIS K 7129-1992. Further, high barrier films are preferred at an oxygen permeability of $1 \times 10^{-3}$ ml/($m^2 \cdot 24$ h·MPa) or less, and at a water vapor permeability of $10^{-5}$ g/($m^2 \cdot 24$ h) or less, determined based on JIS K 7126-1987.

As materials forming a barrier film, employed may be those which retard penetration of moisture and oxygen, which deteriorate the element. For example, it is possible to employ silicon oxide, silicon dioxide, and silicon nitride.

Further, in order to improve the brittleness of the aforesaid film, it is more preferable to achieve a laminated layer structure of inorganic layers and organic layers. The laminating order of the inorganic layer and the organic layer is not particularly limited, but it is preferable that both are alternatively laminated a plurality of times.

Barrier film forming methods are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, specifically preferred is a method employing an atmospheric pressure plasma polymerization method, described in JP-A No. 2004-68143.

Examples of opaque support substrates include metal plates such aluminum or stainless steel, films, opaque resin substrates, and ceramic substrates.

The external extraction efficiency of light emitted by the organic EL element of the present invention is preferably 1% or more at room temperature, but is more preferably 5% or more.

External quantum yield (%)=(Number of photons emitted by the organic EL element to the exterior/Number of electrons fed to organic EL element)×100.

Further, even by simultaneously employing color hue improving filters such as a color filter, simultaneously employed may be color conversion filters which convert emitted light color from the organic EL element to multicolor by employing fluorescent materials. When the color conversion filters are employed, it is preferable that λmax of light emitted by the organic EL element is 480 nm or less.

<<Preparation Method of Organic EL Element>>

As one example of the preparation method of the organic EL element of the present invention, there will be described the preparation method of the organic EL element composed of anode/hole injection layer/hole transport layer/light emitting layer/hole blocking layer/electron transport layer/cathode buffer layer (electron injection layer)/cathode.

Initially, a thin film composed of desired electrode substances, for example, anode substances is formed on an appropriate base material to reach a thickness of 1 μm or less, but preferably 10 nm-200 nm, whereby an anode is prepared.

Subsequently, on the above, formed are organic compound thin layers including a hole injection layer, a hole transport layer, a light emitting layer, a hole blocking layer, an electron transport layer, and a cathode buffer layer, which contain organic materials.

In the organic EL element of phosphorescence luminescence of the present invention, at least a cathode and an electron transport layer located adjacent to the cathode are preferably coated and formed with a wet process.

Examples of a wet process include: a spin coating method, a cast method, a die coating method, a blade coating method, a roll coating method, an inkjet method, a printing method, a spray coating method, a curtain coating method, and a LB method. From the viewpoint of enabling to form a precise thin layer with a high productivity, a die coating method, a roll coating method, an inkjet method and a spray coating method are preferably used. These methods are suitable for applying to a roll to roll production method. It may be possible to use a different film production method for every layer.

As liquid media which are employed to dissolve or disperse organic metal complexes according to the present invention, employed may be, for example, ketones such as methyl ethyl ketone or cyclohexanone, fatty acid esters such as ethyl acetate, halogenated hydrocarbons such as dichlorobenzene, aromatic hydrocarbons such as toluene, xylene, mesitylene, and cyclohexylbenzene, aliphatic hydrocarbons such as cyclohexane, decaline, and dodecane, and organic solvents such as DMF or DMSO.

Further, with regard to dispersion methods, it is possible to achieve dispersion employing dispersion methods such as ultrasonic waves, high shearing force dispersion or media dispersion.

After forming these layers, a thin layer composed of cathode materials is formed on the above layers so that the film thickness reaches 1 μm or less, but is preferably in the range of 50-200 nm, whereby a cathode is arranged, and the desired organic EL element is prepared.

Further, by reversing the preparation order, it is possible to achieve preparation in order of a cathode, a cathode buffer layer, an electron injection layer, an electron transport layer, a light emitting layer, a hole transport layer, a hole injection layer, and an anode.

When direct current voltage is applied to the multicolor display device prepared as above, the anode is employed as (+) polarity, while the cathode is employed as (−) polarity. When 2-40 V is applied, it is possible to observe light emission. Further, alternating current voltage may be applied. The wave form of applied alternating current voltage is not specified.

It is preferable to produce an organic EL element of the present invention with one vacuum operation, from formation of a hole injection layer to formation of a cathode without interruption. However, it may be possible to interrupt the operation and take out the intermediate product in order to apply a different film forming method. In that case, working under a dry inert gas atmosphere is preferable.

<<Sealing>>

As sealing means employed in the present invention, listed may be, for example, a method in which sealing members, electrodes, and a supporting substrate are subjected to adhesion via adhesives.

The sealing members may be arranged to cover the display region of an organic EL element, and may be an engraved plate or a flat plate. Neither transparency nor electrical insulation is limited.

Specifically listed are glass plates, polymer plate—films, metal plates, and films. Specifically, it is possible to list, as glass plates, soda-lime glass, barium-strontium containing glass, lead glass, aluminosilicate glass, borosilicate glass, barium borosilicate glass, and quartz.

Further, listed as polymer plates may be polycarbonate, acryl, polyethylene terephthalate, polyether sulfide, and polysulfone. As a metal plate, listed are those composed of at least one metal selected from the group consisting of stainless steel, iron, copper, aluminum magnesium, nickel, zinc, chromium, titanium, molybdenum, silicon, germanium, and tantalum, or alloys thereof.

In the present invention, since it is possible to convert the element to a thin film, it is possible to preferably employ a metal film.

Further, the oxygen permeability of the polymer film is preferably $1\times10^{-3}$ ml/(m$^2 \cdot$24 h$\cdot$MPa) or less, determined by the method based on JIS K 7126-1987, while its water vapor permeability (at 25 ±0.5° C. and relative humidity (90±2) % RH) is $10^{-5}$ g/(m$^2 \cdot$24 h) or less, determined by the method based on HS K 7129-1992.

Conversion of the sealing member into concave is carried out employing a sand blast process or a chemical etching process.

In practice, as adhesives, listed may be photo-curing and heat-curing types having a reactive vinyl group of acrylic acid based oligomers and methacrylic acid, as well as moisture curing types such as 2-cyanoacrylates. Further listed may be thermal and chemical curing types (mixtures of two liquids) such as epoxy based ones.

Still further listed may be hot-melt type polyamides, polyesters, and polyolefins. Yet further listed may be cationically curable type ultraviolet radiation curable type epoxy resin adhesives.

In addition, since an organic EL element is occasionally deteriorated via a thermal process, those are preferred which enable adhesion and curing between room temperature and 80° C. Further, desiccating agents may be dispersed into the aforesaid adhesives. Adhesives may be applied onto sealing portions via a commercial dispenser or printed on the same in the same manner as screen printing.

Further, it is appropriate that on the outside of the aforesaid electrode which interposes the organic layer and faces the support substrate, the aforesaid electrode and organic layer are covered, and in the form of contact with the support substrate, inorganic and organic material layers are formed as a sealing film.

In this case, as materials forming the aforesaid film may be those which exhibit functions to retard penetration of those such as moisture or oxygen which results in deterioration. For example, it is possible to employ silicon oxide, silicon dioxide, and silicon nitride.

Still further, in order to improve brittleness of the aforesaid film, it is preferable that a laminated layer structure is formed, which is composed of these inorganic layers and layers composed of organic materials.

Methods to form these films are not particularly limited. It is possible to employ, for example, a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a thermal CVD method, and a coating method.

In a gas phase and a liquid phase, it is preferable to inject inert gases such as nitrogen or argon, and inactive liquids such as fluorinated hydrocarbon or silicone oil into the space between the sealing member and the surface region of the organic EL element. Further, it is possible to form vacuum. Still further, it is possible to enclose hygroscopic compounds in the interior.

Examples of hygroscopic compounds include metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). In sulfates, metal halides, and perchlorates, suitably employed are anhydrides.

<<Protective Film and Protective Plate>>

The aforesaid sealing film on the side which nips the organic layer and faces the support substrate or on the outside of the aforesaid sealing film, a protective or a protective plate may be arranged to enhance the mechanical strength of the element. Specifically, when sealing is achieved via the aforesaid sealing film, the resulting mechanical strength is not always high enough, whereby it is preferable to arrange the protective film or the protective plate described above.

Usable materials for these include glass plates, polymer plate-films, and metal plate-films which are similar to those employed for the aforesaid sealing. However, in terms of light weight and a decrease in thickness, it is preferable to employ polymer films.

<<Light Extraction>>

It is generally known that an organic EL element emits light in the interior of the layer exhibiting the refractive index (being about 1.7-about 2.1) which is greater than that of air, whereby only about 15-about 20% of light generated in the light emitting layer is extracted.

This is due to the fact that light incident to an interface (being an interface of a transparent substrate to air) at an angle of θ which is at least critical angle is not extracted to the exterior of the element due to the resulting total reflection, or light is totally reflected between the transparent electrode or the light emitting layer and the transparent substrate, and light is guided via the transparent electrode or the light emitting layer, whereby light escapes in the direction of the element side surface.

Means to enhance the efficiency of the aforesaid light extraction include, for example, a method in which roughness is formed on the surface of a transparent substrate, whereby total reflection is minimized at the interface of the transparent substrate to air (U.S. Pat. No. 4,774,435), a method in which efficiency is enhanced in such a manner that a substrate results in light collection (JP-A No. 63-314795), a method in which a reflection surface is formed on the side of the element (JP-A No. 1-220394), a method in which a flat layer of a middle refractive index is introduced between the substrate and the light emitting body and an antireflection film is formed (JP-A No. 62-172691), a method in which a flat layer of a refractive index which is equal to or less than the substrate is introduced between the substrate and the light emitting body (JP-A No. 2001-202827), and a method in which a diffraction grating is formed between the substrate and any of the layers such as the transparent electrode layer or the light emitting layer (including between the substrate and the outside) (JP-A No. 11-283751).

In the present invention, it is possible to employ these methods while combined with the organic EL element of the present invention. Of these, it is possible to appropriately employ the method in which a flat layer of a refs active index which is equal to or less than the substrate is introduced between the substrate and the light emitting body and the method in which a diffraction grating is formed between the substrate and any of the layers such as the transparent electrode layer or the light emitting layer (including between the substrate and the outside).

By combining these means, the present invention enables the production of elements which exhibit higher luminance or excel in durability.

When a low refractive index medium of a thickness, which is greater than the wavelength of light, is formed between the transparent electrode and the transparent substrate, the extraction efficiency of light emitted from the transparent electrode to the exterior increases as the refractive index of the medium decreases.

As materials of the low refractive index layer, listed are, for example, aerogel, porous silica, magnesium fluoride, and fluorine based polymers. Since the refractive index of the transparent substrate is commonly about 1.5-1.7, the refractive index of the low refractive index layer is preferably approximately 1.5 or less, but is more preferably 1.35 or less.

Further, thickness of the low refractive index medium is preferably at least two times the wavelength in the medium. The reason is that when the thickness of the low refractive index medium reaches nearly the wavelength of light so that electromagnetic waves oozed via evanescent enter into the substrate, effects of the low refractive index layer are lowered.

The method in which the interface which results in total reflection or a diffraction grating is introduced in any of the media is characterized in that light extraction efficiency is significantly enhanced.

The above method works as follows. By utilizing properties of the diffraction grating capable of changing the light direction to the specific direction different from diffraction via so-called Bragg diffraction such as primary diffraction or secondary diffraction of the diffraction grating, of light emitted from the light emitting layer, light, which is not emitted to the exterior due to total reflection between layers, is diffracted via introduction of a diffraction grating between any layers or in a medium (in the transparent substrate and the transparent electrode) so that light is extracted to the exterior.

It is preferable that the introduced diffraction grating exhibits a two-dimensional periodic refractive index. The reason is as follows. Since light emitted in the light emitting layer is randomly generated to all directions, in a common one-dimensional diffraction grating exhibiting a periodic refractive index distribution only in a certain direction, light which travels to the specific direction is only diffracted, whereby light extraction efficiency is not sufficiently enhanced.

However, by changing the refractive index distribution to a two-dimensional one, light, which travels to all directions, is diffracted, whereby the light extraction efficiency is enhanced.

As noted above, a position to introduce a diffraction grating may be between any layers or in a medium (in a transparent substrate or a transparent electrode). However, a position near the organic light emitting layer, where light is generated, is desirous.

In this case, the cycle of the diffraction grating is preferably about ½-3 times the wavelength of light in the medium.

The preferable arrangement of the diffraction grating is such that the arrangement is two-dimensionally repeated in the form of a square lattice, a triangular lattice, or a honeycomb lattice.

<<Light Collection Sheet>>

Via a process to arrange a structure such as a micro-lens array shape on the light extraction side of the organic EL element of the present invention or via combination with a so-called light collection sheet, light is collected in the specific direction such as the front direction with respect to the light emitting element surface, whereby it is possible to enhance luminance in the specific direction.

In an example of the micro-lens array, square pyramids to realize a side length of 30 μm and an apex angle of 90 degrees are two-dimensionally arranged on the light extraction side of the substrate. The side length is preferably 10 μm-100 μm. When it is less than the lower limit, it will result in coloration due to generation of diffraction effects, while when it exceeds the upper limit, the thickness increases undesirably.

It is possible to employ, as a light collection sheet, for example, one which is put into practical use in the LED backlight of liquid crystal display devices. It is possible to employ, as such a sheet, for example, the luminance enhancing film (BEF), produced by Sumitomo 3M Limited.

As shapes of a prism sheet employed may be, for example, Δ shaped stripes of an apex angle of 90 degrees and a pitch of 50 μm formed on a base material, a shape in which the apex angle is rounded, a shape in which the pitch is randomly changed, and other shapes.

Further, in order to control the light radiation angle from the light emitting element, simultaneously employed may be a light diffusion plate-film. For example, it is possible to employ the diffusion film (LIGHT-UP), produced by Kimoto Co., Ltd.

<<Applications>>

It is possible to employ the organic EL element of the present invention as display devices, displays, and various types of light emitting sources. Examples of light emitting sources include, but are not limited to lighting apparatuses (home lighting and car lighting), clocks, backlights for liquid crystals, sign advertisements, signals, light sources of light memory media, light sources of electrophotographic copiers, light sources of light communication processors, and light sources of light sensors.

It is effectively employed especially as backlights of liquid crystal display devices and lighting sources.

If needed, the organic EL element of the present invention may undergo patterning via a metal mask or an ink-jet printing method during film formation. When the patterning is carried out, only an electrode may undergo patterning, an electrode and a light emitting layer may undergo patterning, or all element layers may undergo patterning. During preparation of the element, it is possible to employ conventional methods.

Figure 4:
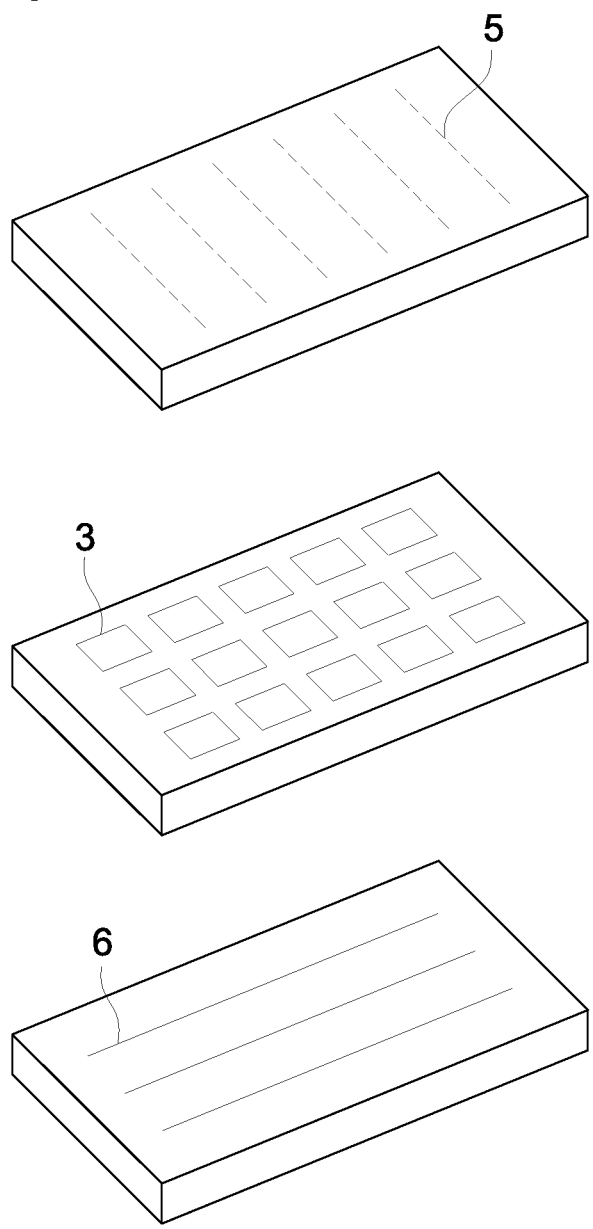
FIG. 4 is a schematic drawing of a full color display device according to a passive matrix mode.

Color of light emitted by the organic EL element of the present invention and compounds according to the present invention is specified as follows. In FIG. 4.16 on page 108 of "Shinpen Shikisai Kagaku Handbook (New Edition Color Science Handbook)" (edited by The Color Science Association of Japan, Tokyo Daigaku Shuppan Kai, 1985), values determined via a spectroradiometric luminance meter CS-1000 (produced by Konica Minolta Sensing Inc.) are applied to the CIE chromaticity coordinate, whereby the color is specified.

Further, when the organic EL element of the present invention is a white element, "white", as described herein, means that when 2-degree viewing angle front luminance is determined via the aforesaid method, chromaticity in the CIE 1931 Color Specification System is within the region of X=0.33±0.07 and Y=0.33±0.07.

<<Display Device>>

A display device of the present invention will now be explained. The display device of the present invention includes the above-described organic EL element.

A display device of the present invention may be either monochromatic or multi-colored. Here explained will be a multicolor display device.

In the case of a multicolor display device, a shadow mask is provided only at the time of emission layer formation, and layers can be formed all over the surface by such as an evaporation method, a cast method, a spin coat method, an inkjet method and a printing method.

When patterning is performed only for producing a light emitting layer, the method is not specifically limited; however, preferable are an evaporation method, an inkjet method, a spin coating method and a printing method.

The constitution of the organic EL element used for a display device can be selected from the embodiments of the organic EL element as described above, in accordance with the requirement.

The production method of the organic EL element was described above for one of the embodiments of the organic EL element of the present invention.

When a direct current voltage is applied on the multicolor display device thus prepared, emission can be observed by application of a voltage of approximately 2-40 V setting an anode to (+) polarity and a cathode to (−) polarity. Further, no current flows and no emission generate at all even when a voltage is applied with a reversed polarity. Further, in the case of alternate current voltage being applied, emission generates only in a state of an anode being + and a cathode being −. Herein, the wave shape of alternate current may be arbitrary.

A multicolor display device can be utilized as a display device, a display and various types of emission light sources. In a display device and a display, full-colored display is possible by employing three types of organic EL elements providing blue, red and green emissions.

A display device and a display include a TV, a personal computer, a mobile instrument, an AV instrument, a character broadcast display and an information display in a car. Particularly, the display device and the display may be also utilized as a display to playback still images and moving images, and may adopt either a simple matrix (a passive matrix) mode or an active matrix mode when being utilized as a display device for moving image playback.

An illumination light source includes a home use illumination, a car room illumination, a backlight of a watch or a liquid crystal, a panel advertisement, a signal, a light source of an optical memory medium, a light source for an electrophotographic copier, a light source for an optical telecommunication processor and a light source for a photo-sensor, however, the present invention is not limited thereto.

In the following, one example of a display device provided with an organic EL element of the present invention will be explained with reference to figures.

FIG. 1 is a schematic drawing to show an example of a display device constituted of an organic EL element. It is a schematic drawing of a display, which displays image information by emission of an organic EL element, such as a mobile phone.

Display 1 is constituted of display section A having plural number of pixels and control section B which performs image scanning of display section A based on image information.

Control section B, which is electrically connected to display section A, sends a scanning signal and an image data signal to plural number of pixels based on image information from the outside and pixels of each scanning line successively emit depending on the image data signal by a scanning signal to perform image scanning, whereby image information is displayed on display section A.

Figure 2:
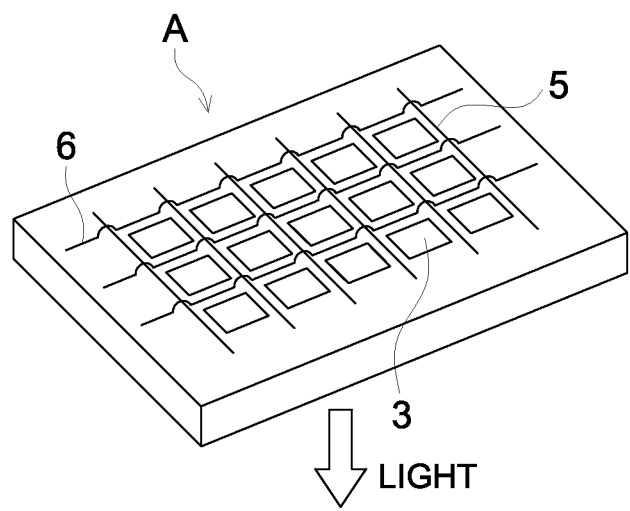
FIG. 2 is a schematic drawing of display section A.

FIG. 2 is a schematic drawing of display section A.

Display section A is provided with such as a wiring part, which contains plural scanning lines 5 and data lines 6, and plural pixels 3 on a substrate. Primary part materials of display section A will be explained in the following.

In the drawing, shown is the case that light emitted by pixel 3 is taken out along the white allow (downward).

Scanning lines 5 and plural data lines 6 in a wiring part each are comprised of a conductive material, and scanning lines 5 and data lines 6 are perpendicular in a grid form and are connected to pixels 3 at the right-angled crossing points (details are not shown in the drawing).

Pixel 3 receives an image data from data line 6 when a scanning signal is applied from scanning line 5 and emits according to the received image data.

Full-color display device is possible by appropriately arranging pixels having an emission color in a red region, pixels in a green region and pixels in a blue region, side by side on the same substrate.

Next, an emission process of a pixel will be explained.

Figure 3:
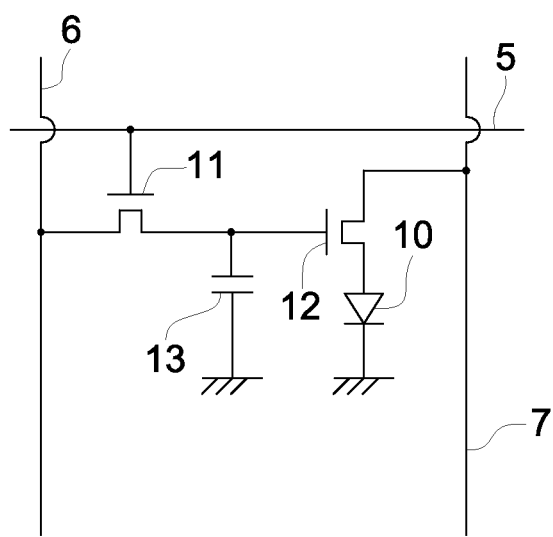
FIG. 3 is an equivalent circuit diagram of an image pixel.

FIG. 3 is a schematic drawing of a pixel.

A pixel is equipped with such as organic EL element 10, switching transistor 11, operating transistor 12 and capacitor 13. Red, green and blue emitting organic EL elements are utilized as organic EL element 10 for plural pixels, and full-color display device is possible by arranging these side by side on the same substrate.

In FIG. 3, an image data signal is applied on the drain of switching transistor 11 via data line 6 from control section B. Then, when a scanning signal is applied on the gate of switching transistor 11 via scanning line 5 from control section B, operation of switching transistor is on to transmit the image data signal applied on the drain to the gates of capacitor 13 and operating transistor 12.

Operating transistor 12 is on, simultaneously with capacitor 13 being charged depending on the potential of an image data signal, by transmission of an image data signal. In operating transistor 12, the drain is connected to electric source line 7 and the source is connected to the electrode of organic EL element 10, and an electric current is supplied from electric source line 7 to organic EL element 10 depending on the potential of an image data applied on the gate.

When a scanning signal is transferred to next scanning line 5 by successive scanning of control section B, operation of switching transistor 11 is off.

However, since condenser 13 keeps the charged potential of an image data signal even when operation of switching transistor 11 is off, operation of operating transistor 12 is kept on to continue emission of organic EL element 10 until the next scanning signal is applied.

When the next scanning signal is applied by successive scanning, operating transistor 12 operates depending on the potential of an image data signal synchronized to the scanning signal and organic EL element 10 emits.

That is, emission of each organic EL element 10 of plural pixels 3 is performed by providing switching transistor 11 and operating transistor 12 against each organic EL element 10 of plural pixels 3. Such an emission method is called as an active matrix mode.

Herein, emission of organic EL element 10 may be either emission of plural gradations based on a multiple-valued image data signal having plural number of gradation potentials or on and off of a predetermined emission quantity based on a binary image data signal. Further, potential hold of capacitor 13 may be either continuously maintained until the next scanning signal application or discharged immediately before the next scanning signal application.

In the present invention, emission operation is not necessarily limited to the above-described active matrix mode but may be a passive matrix mode in which organic EL element is emitted based on a data signal only when a scanning signal is scanned.

FIG. 4 is a schematic drawing of a display device based on a passive matrix mode. In FIG. 4, plural number of scanning lines 5 and plural number of image data lines 6 are arranged grid-wise, opposing to each other and sandwiching pixels 3.

When a scanning signal of scanning line 5 is applied by successive scanning, pixel 3 connected to scanning line 5 applied with said signal emits depending on an image data signal.

Since pixel 3 is provided with no active element in a passive matrix mode, decrease of manufacturing cost is possible.

<<Lighting Device>>

A lighting device of the present invention will now be explained. The lighting device of the present invention includes the above-described organic EL element.

An organic EL element of the present invention can be utilized as an organic EL element provided with a resonator structure, and a utilization purpose of such an organic EL element provided with a resonator structure includes such as a light source for an optical memory medium, a light source for an electrophotographic copier, a light source for a optical telecommunication processor and a light source for a photosensor, however, is not limited thereto. Further, the organic EL element may be utilized for the above-described applications by being made to perform laser emission.

Further, an organic EL element of the present invention may be utilized as one type of a lamp like an illumination and an exposure light, and may be also utilized as a display device of a projector of an image projecting type and a display device (a display) of a type to directly view still images and moving images.

An operating mode in the case of being utilized as a display device for playback of moving images may be either a simple matrix (a passive matrix) mode or an active matrix mode. In addition, a full-color display device can be prepared by utilizing at least two types of organic EL elements of the present invention which emit different emitting colors.

An organic EL element material of the present invention can be also applied to an organic EL element to generate emission of practically white color as a lighting device. Plural emission colors are simultaneously emitted by plural number of emission materials to obtain white light by mixing colors.

A combination of plural emission colors may be either the one, in which three emission maximum wavelengths of three primary colors of blue, green and red are contained, or the other, in which two emission maximum wavelengths, utilizing a relationship of complimentary colors such as blue and yellow, or blue and orange, are contained.

Further, a combination of emission materials to obtain plural number of emission colors may be either a combination comprising plural number of materials which emit phosphoresce or fluorescence, or a combination of a material which emits phosphoresce or fluorescence and a dye material which emits by light from an emission material as exiting light, however, in a white organic electroluminescence element according to the present invention, it is enough only to mix plural emission dopants in combination.

A mask is provided only at the time of forming such as an emission layer, a hole transport layer or an electron transport layer, to only simply arrange the plural emission dopants such as by separately painting through the mask, while other layers are commonly utilized to require no patterning such as a mask. Therefore, such as an electrode can be formed all over the plane by such as an evaporation method, a cast method, a spin coat method, an inkjet method and a printing method, resulting in improvement of productivity.

According to this method, different from a white organic EL device in which plural colors of emission elements are arranged parallel in an alley form, an element itself is white emitting.

An emission material utilized in an emission layer is not specifically limited, and in the case of a backlight of a liquid crystal display element, any combination by arbitrary selection among platinum complexes according to the present invention or emission materials well known in the art can be utilized so as to be fitted to the wavelength range corresponding to CF (color filter) characteristics, whereby white emission can be obtained.

<<One Embodiment of Lighting Device of the Present Invention>>

It will be described one of the embodiments of a lighting device provided with an organic EL element of the present invention.

The non-light emitting surface of the organic EL element of the present invention was covered with a glass case, and a 300 μm thick glass substrate was employed as a sealing substrate. An epoxy based light curable type adhesive (LUX-TRACK LC0629B produced by Toagosei Co., Ltd.) was employed in the periphery as a sealing material. The resulting one was superimposed on the aforesaid cathode to be brought into close contact with the aforesaid transparent support substrate, and curing and sealing were carried out via exposure of UV radiation onto the glass substrate side, whereby the lighting device shown in FIG. 5 and FIG. 6 was formed.

Figure 5:
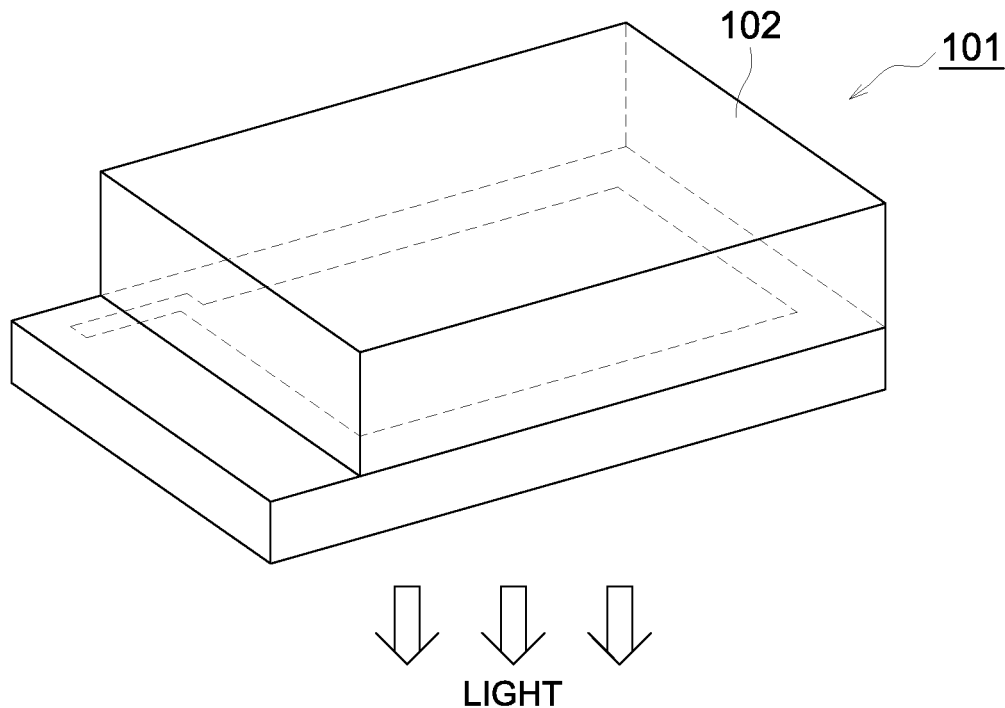
FIG. 5 is a schematic drawing of a lighting device.

FIG. 5 is a schematic view of a lighting device and Organic EL element 101 is covered with glass cover 102 (incidentally, sealing by the glass cover was carried out in a globe box under nitrogen ambience (under an ambience of high purity nitrogen gas at a purity of 99.999% or more) so that Organic EL Element 101 was not brought into contact with atmosphere.

Figure 6:
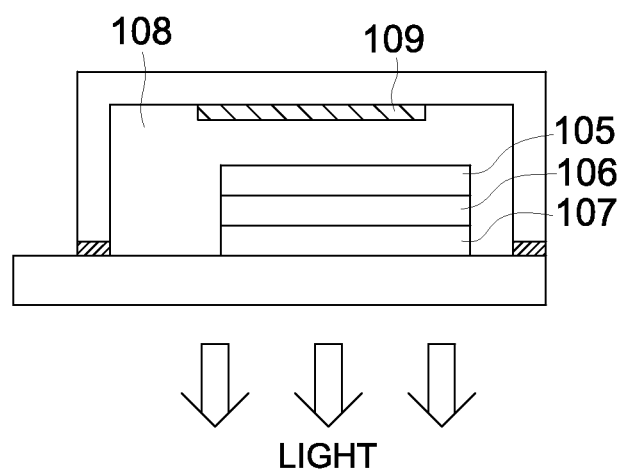
FIG. 6 is a cross-sectional drawing of a lighting device.
Figure 7A:
FIG. 7 is a schematic structural drawing of a full color organic EL display device.
Figure 7B:
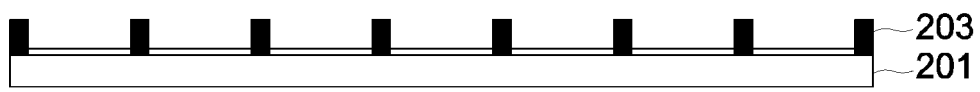
Figure 7C:
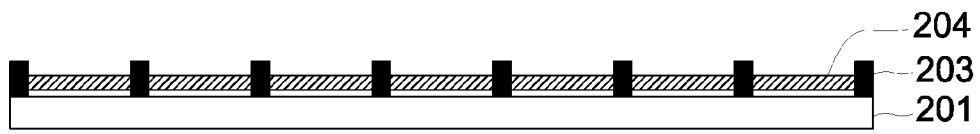
Figure 7D:
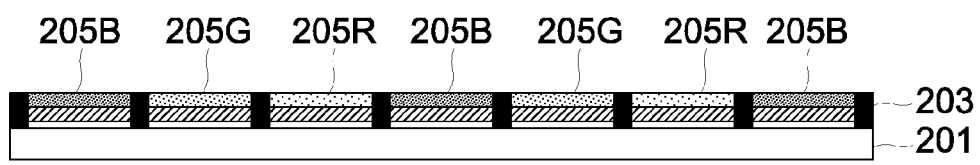
Figure 7E:
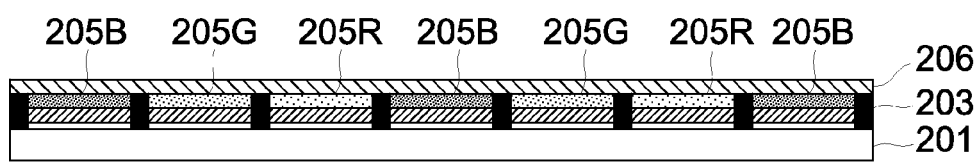

FIG. 6 is a cross-sectional view of a lighting device, and in FIG. 6, 105 represents a cathode, 106 represents an organic EL layer, and 107 represents a glass substrate fitted with a transparent electrode.

Further, the interior of glass cover 102 is filled with nitrogen gas 108 and water catching agent 109 is provided.

EXAMPLES

The present invention will now be described with reference to examples, however the present invention is not limited thereto.

The chemical structures of the compounds used in Examples are shown in the followings.

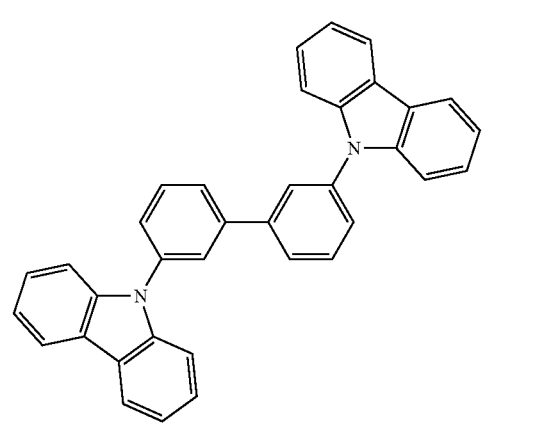

cHS-1

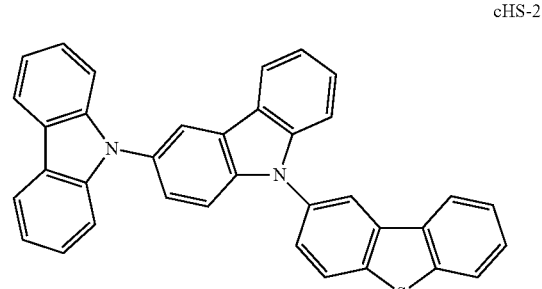

cHS-2

-continued
cHS-3
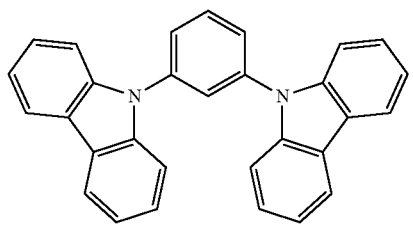
cHS-4
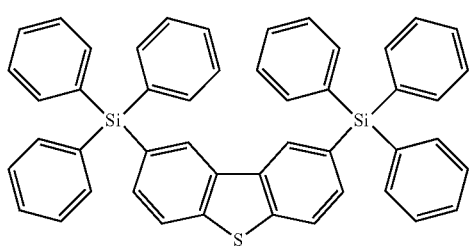
cHS-5
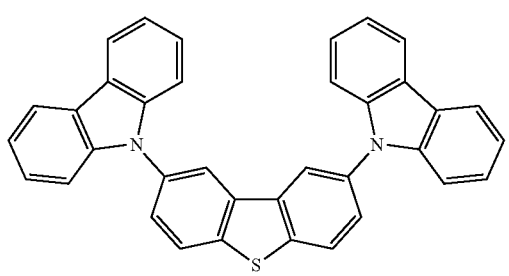
cHS-6
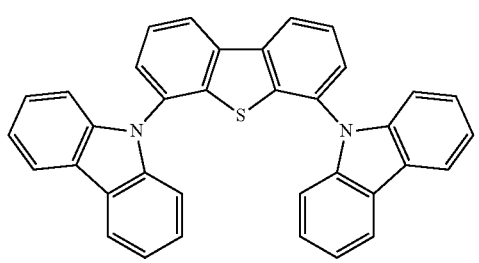
cHS-7
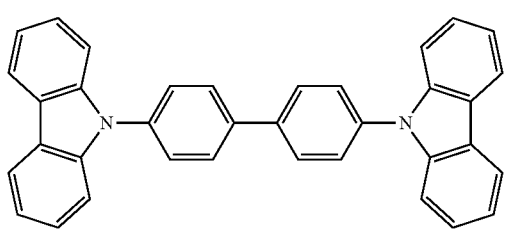
cHS-8
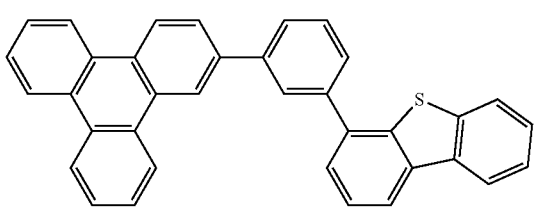
-continued
cDP-1
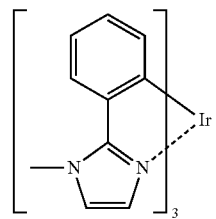
cDP-2
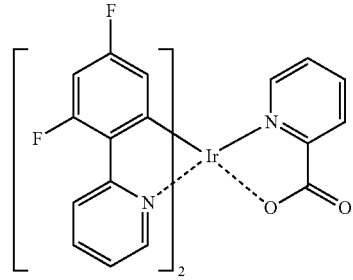
cDP-3
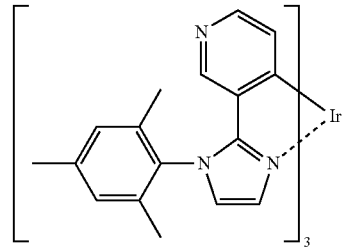
cDP-4
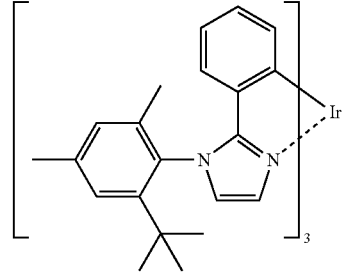
cDP-5
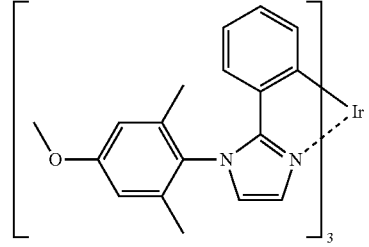
cDP-6
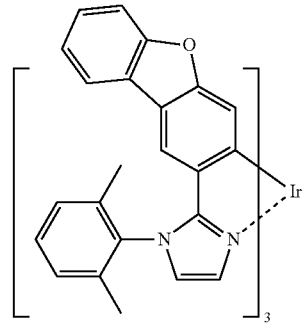

-continued cRD-1
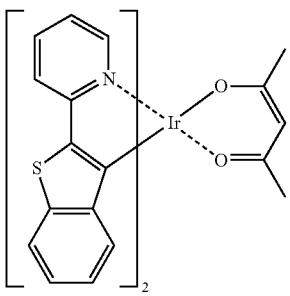

cRD-2
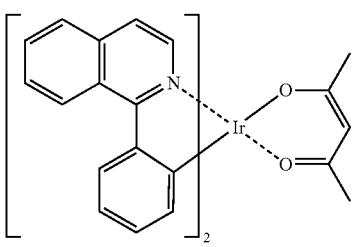

cRD-3
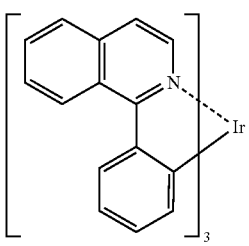

cGD-1
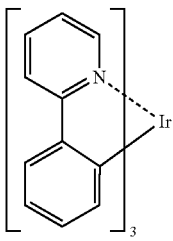

cGD-2
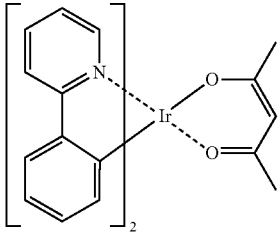

cGD-3
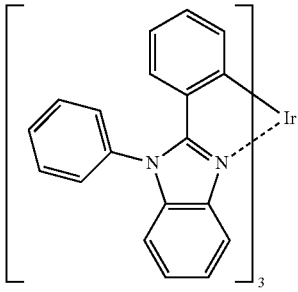

Example 1

<<Preparation of Organic EL Element 1-1>>

An anode was prepared by making patterning to a glass substrate of 100 mm×100 mm×1.1 mm (NA45 produced by NH Techno Glass Corp.) on which a 100 nm film of ITO (indium tin oxide) was formed. Thereafter, the above transparent support substrate provided with the ITO transparent electrode was subjected to ultrasonic washing with isopropyl alcohol, followed by drying with desiccated nitrogen gas, and was subjected to UV ozone washing for 5 minutes.

The resulting transparent support substrate was fixed to the substrate holder of a commercial vacuum deposition apparatus. Separately, 200 mg of HT-30 was placed in a molybdenum resistance heating boat, 200 mg of HT-2 was placed in another molybdenum resistance heating boat, 200 mg of cHS-1 was placed in another molybdenum resistance heating boat, 200 mg of cDP-1 was placed in another molybdenum resistance heating boat, and 200 mg of ET-8 was placed in another molybdenum resistance heating boat. The resulting boats were fitted in the vacuum deposition apparatus.

Subsequently, after reducing the pressure of the vacuum tank to $4 \times 10^{-4}$ Pa, the aforesaid heating boat containing HT-30 was heated via application of electric current and deposition was carried out onto the transparent support substrate at a deposition rate of 0.1 nm/second, whereby it was produced a hole injection layer having a thickness of 10 nm.

Further, the aforesaid heating boat containing HT-2 was heated via application of electric current and deposition was carried out onto the hole injection layer at a deposition rate of 0.1 nm/second, whereby it was produced a hole transport layer having a thickness of 30 nm.

Further, the aforesaid heating boats each respectively containing cHS-1 and cDP-1 were heated via application of electric current and co-deposition was carried out onto the aforesaid hole transport layer at a respective deposition rate of 0.1 nm/second and 0.010 nm/second, whereby it was produced a light emitting layer having a thickness of 40 nm.

Further, the aforesaid heating boat containing ET-8 was heated via application of electric current and deposition was carried out onto the light emitting layer at a deposition rate of 0.1 nm/second, whereby it was produced a hole blocking layer having a thickness of 10 nm.

Further, the aforesaid heating boat containing ET-7 was heated via application of electric current and deposition was carried out onto the hole blocking layer at a deposition rate of 0.1 nm/second, whereby it was produced an electron transport layer having a thickness of 30 nm.

Subsequently, 0.5 nm thick lithium fluoride was vapor deposited to form a cathode buffer layer, and then, 110 nm thick aluminium was vapor deposited to form a cathode, whereby Organic EL element 1-1 was prepared.

<<Preparation of Organic EL Elements 1-2 to 1-10>>

Organic EL elements 1-2 to 1-10 each were prepared in the same manner as preparation of Organic EL element 1-1, except that the dopant compound and the host compound were replaced with the compounds as are listed in Table 1.

<<Evaluation of Organic EL Elements 1-1 to 1-10>>

In order to evaluate the obtained organic EL elements, the following processes were done to them. The non-light emitting surface of each of the organic EL elements was covered with a glass cover. As a sealing material, an epoxy based light curable type adhesive (LUXTRACK LC0629B produced by Toagosei Co., Ltd.) was applied to the periphery of the glass cover where the glass cover and the grass substrate prepared thereon Organic EL element were contacted. The resulting one was superimposed on the aforesaid cathode side to be brought into close contact with the aforesaid transparent support substrate, and curing and sealing were carried out via exposure of UV radiation onto the glass substrate side, whereby the lighting device shown in FIG. 5 and FIG. 6 was formed. The organic EL elements were evaluated using the lighting devices.

Then, the following evaluations were carried out.
(Electric Power Efficiency)

By using a spectroradiometric luminance meter CS-1000 (produced by Konica Minolta Sensing Inc.), a front luminance and an angle dependence of the luminance for each Organic EL element were measured. The electric power efficiency at a front luminance of 1000 cd/m$^2$ was determined.

The electric power efficiency was represented by a relative value when the electric power efficiency of Organic EL element 1-1 was set to be 100.
(Emission Lifetime)

Organic EL element was driven with a constant electric current of 2.5 mA/cm$^2$ at room temperature (at about 23 to 25° C.) to continuously emit a light. The time required for a decease in one half of the luminance of immediately after the initiation of light emission (being the initial luminance) was determined, and the resulting value was employed as an index of the lifetime in terms of a half lifetime ($\tau_{1/2}$). The emission lifetime was represented as a relative value when the lifetime of Organic EL element 1-1 was set to be 100.
(Aging Stability)

Each Organic EL element was kept at aging condition of 60° C. for 24 hours. Electric power efficiency of each Organic EL element before aging and after aging was measured. Electric power efficiency ratio of after aging to before aging was determined according to the following formula. This value was used for evaluating aging stability.

Aging stability (%)=(Electric power efficiency after kept at aging condition/Electric power efficiency before kept at aging condition)×100.

Here, electric power efficiency was measured using a spectroradiometric luminance meter CS-1000 (produced by Konica Minolta Sensing Inc.). A front luminance and an angle dependence of the luminance for each Organic EL element were measured. The electric power efficiency at a front luminance of 1000 cd/m$^2$ was determined.
(Emission Color)

An emission color produced under the condition of a constant electric current of 2.5 mA/cm$^2$ was visually observed and evaluated.

TABLE 1

| Element No. | Dopant | Host | Electric power efficiency | Emission lifetime | Aging stability | Emission color | Remarks |
|---|---|---|---|---|---|---|---|
| Organic El element 1-1 | cDP-1 | cHS-1 | 100 | 100 | 64 | Blue | Comparative example |
| Organic El element 1-2 | DP-8 | cHS-1 | 97 | 174 | 69 | Blue | Comparative example |
| Organic El element 1-3 | DP-6 | cHS-1 | 103 | 238 | 76 | Blue | Comparative example |
| Organic El element 1-4 | cDP-1 | HS-24 | 108 | 286 | 79 | Blue | Comparative example |
| Organic El element 1-5 | DP-8 | HS-24 | 110 | 357 | 84 | Blue | Reference example |
| Organic El element 1-6 | DP-6 | HS-24 | 122 | 714 | 96 | Blue | Inventive example |
| Organic El element 1-7 | DP-6 | HS-26 | 115 | 595 | 90 | Blue | Inventive example |
| Organic El element 1-8 | DP-6 | HS-11 | 111 | 405 | 84 | Blue | Inventive example |
| Organic El element 1-9 | DP-6 | HS-8 | 120 | 571 | 87 | Blue | Inventive example |
| Organic El element 1-10 | DP-6 | HS-15 | 112 | 452 | 91 | Blue | Inventive example |

As shown by the results in Table 1, it is evident that Organic El element jointly employing a dopant compound and a host compound both relating to the present invention is superior to the comparative example with respect to Electric power efficiency and Emission lifetime.

Example 2

<<Preparation of Organic EL Element 2-1>>

An anode was prepared by making patterning to a glass substrate of 100 mm×100 mm×1.1 mm (NA45 produced by NH Techno Glass Corp.) on which a 100 nm film of ITO (indium tin oxide) was formed. Thereafter, the above transparent support substrate provided with the ITO transparent electrode was subjected to ultrasonic washing with isopropyl alcohol, followed by drying with desiccated nitrogen gas, and was subjected to UV ozone washing for 5 minutes.

On the transparent support substrate thus prepared was applied a 70% solution of poly(3,4-ethylenedioxythiphene)-polystyrene sulfonate (PEDOT/PSS, Baytron P AI 4083 made by Bayer AG.) diluted with water by using a spin coating method at 3,000 rpm for 30 seconds to form a film and then it was dried at 200° C. for one hour. A 1$^{st}$ hole transport layer having a thickness of 20 nm was prepared.

The aforesaid substrate was transferred under an atmosphere of nitrogen, and a solution containing 50 mg of HT-27 dissolved in 10 ml of toluene was applied on the aforesaid 1$^{st}$ hole transport layer by using a spin coating method at 1,500 rpm for 30 seconds to form a film. The film was irradiated with UV rays for 110 seconds while heating the substrate at 80° C. so as to achieve photopolymerization and cross-linking, followed by subjected to vacuum drying at 60° C. for one hour. A 2$^{nd}$ hole transport layer having a thickness of 20 nm was thus prepared.

One the 2$^{nd}$ hole transport layer was applied a solution containing 100 mg of cHS-2 and 13 mg of cDP-2 dissolved in 10 ml of butyl acetate by using a spin coating method at 1,000 rpm for 30 seconds to form a film. The film was subjected to vacuum drying at 60° C. for one hour to obtain a light emitting layer having a thickness of 45 nm.

One the light emitting layer was applied a solution containing 50 mg of ET-15 dissolved in 10 ml of hexafluoroisopropanol (HFIP) by using a spin coating method at 1,000 rpm for 30 seconds to form a film. The film was subjected to vacuum drying at 60° C. for one hour to obtain an electron transport layer having a thickness of 25 nm.

Subsequently, this substrate was fixed to the substrate holder of the vacuum deposition apparatus, and the pressure of the vacuum tank was reduced to $4 \times 10^{-4}$ Pa. Then, 0.4 nm thick potassium fluoride was vapor deposited to form a cathode buffer layer, and then, 110 nm thick aluminum was vapor deposited to form a cathode, whereby Organic EL element 2-1 was prepared.

<<Preparation of Organic EL Elements 2-2 to 2-10>>

Organic EL elements 2-2 to 2-10 each were prepared in the same manner as preparation of Organic EL element 2-1, except that the dopant compound and the host compound were replaced with the compounds as are listed in Table 2.

<<Evaluation of Organic EL Elements 2-1 to 2-10>>

In order to evaluate the obtained organic EL elements, they were sealed in the same manner as sealing of Organic EL elements 1-1 to 1-10 in Example 1. The organic EL elements were evaluated after forming the lighting devices as illustrated in FIG. 5 and FIG. 6.

Then, the following evaluations were carried out.

(External Quantum Efficiency (EQE))

Each organic EL element was allowed to emit a light with a constant electric current of 2.5 mA/cm² at room temperature (at about 23 to 25° C.). The external quantum efficiency (EQE) was determined by measuring the luminance (L) (cd/m²) measured immediately after starting to emit light.

Here, the measurement of luminance was done with a spectroradiometric luminance meter CS-1000 (produced by Konica Minolta Sensing Inc.).

The external quantum efficiency (EQE) was represented by a relative value when the external quantum efficiency of Organic EL element 2-1 was set to be 100.

(Emission Lifetime)

Organic EL element was driven with a constant electric current of 6 mA/cm² at room temperature (at about 23 to 25° C.) to continuously emit a light. The time required for a decease in one half of the luminance of immediately after the initiation of light emission (being the initial luminance) was determined, and the resulting value was employed as an index of the lifetime in terms of a half lifetime ($\tau_{1/2}$). The emission lifetime was represented as a relative value when the lifetime of Organic EL element 2-1 was set to be 100.

(Voltage Increasing Ratio)

Organic EL element was driven with a constant electric current of 6 mA/cm². The initial voltage and the voltage after driving 50 hours each were measured. A relative value of the voltage after 50 hour driving with respect to the initial voltage was defined as a voltage increasing ratio.

(Emission Color)

An emission color was evaluated in the same manner as evaluation in Example 1.

TABLE 2

| Element No. | Dopant | Host | EQE | Emission lifetime | Voltage increasing ratio | Emission color | Remarks |
|---|---|---|---|---|---|---|---|
| Organic El element 2-1 | cDP-2 | cHS-2 | 100 | 100 | 110 | Blue | Comparative example |
| Organic El element 2-2 | DP-9 | cHS-2 | 95 | 127 | 108 | Blue | Comparative example |
| Organic El element 2-3 | DP-2 | cHS-2 | 102 | 152 | 107 | Blue | Comparative example |
| Organic El element 2-4 | cDP-2 | HS-25 | 106 | 197 | 104 | Blue | Comparative example |
| Organic El element 2-5 | DP-9 | HS-25 | 110 | 258 | 104 | Blue | Inventive example |
| Organic El element 2-6 | DP-2 | HS-25 | 120 | 485 | 102 | Blue | Inventive example |
| Organic El element 2-7 | DP-2 | HS-9 | 111 | 409 | 103 | Blue | Inventive example |
| Organic El element 2-8 | DP-2 | HS-10 | 110 | 288 | 104 | Blue | Reference example |
| Organic El element 2-9 | DP-2 | HS-4 | 108 | 333 | 102 | Blue | Inventive example |
| Organic El element 2-10 | DP-2 | HS-15 | 113 | 303 | 105 | Blue | Inventive example |

As shown by the results in Table 2, it is evident that Organic El element jointly employing a dopant compound and a host compound both relating to the present invention is superior to the comparative example with respect to EQE, Emission lifetime, and Voltage increasing ratio.

Example 3

<<Preparation of Organic EL Element 3-1>>

An anode was prepared by making patterning to a glass substrate of 100 mm×100 mm×1.1 mm (NA45 produced by NH Techno Glass Corp.) on which a 100 nm film of ITO (indium tin oxide) was formed. Thereafter, the above transparent support substrate provided with the ITO transparent electrode was subjected to ultrasonic washing with isopropyl alcohol, followed by drying with desiccated nitrogen gas, and was subjected to UV ozone washing for 5 minutes.

The resulting transparent support substrate was fixed to the substrate holder of a commercial vacuum deposition apparatus. Separately, 200 mg of HT-31 was placed in a molybdenum resistance heating boat, 200 mg of HT-1 was placed in another molybdenum resistance heating boat, 200 mg of cHS-1 was placed in another molybdenum resistance heating boat, 200 mg of cDP-3 was placed in another molybdenum resistance heating boat, 200 mg of cGD-2 was placed in another molybdenum resistance heating boat, 200 mg of cRD-1 was placed in another molybdenum resistance heating boat, and 200 mg of ET-2 was placed in another molybdenum resistance heating boat. The resulting boats were fitted in the vacuum deposition apparatus.

Subsequently, after reducing the pressure of the vacuum tank to $4 \times 10^{-4}$ Pa, the aforesaid heating boat containing HT-31 was heated via application of electric current and deposition was carried out onto the transparent support substrate at a deposition rate of 0.1 nm/second, whereby it was produced a hole injection layer having a thickness of 10 nm.

Further, the aforesaid heating boat containing HT-1 was heated via application of electric current and deposition was carried out onto the hole injection layer at a deposition rate of 0.1 nm/second, whereby it was produced a hole transport layer having a thickness of 20 nm.

Further, the aforesaid heating boats each respectively containing cHS-3, cDP-3, cGD-2 and cRD-1 were heated via application of electric current and co-deposition was carried out onto the aforesaid hole transport layer at a respective deposition rate of 0.1 nm/second, 0.025 nm/second, 0.0007 nm/second, and 0.0002 nm/second, whereby it was produced a light emitting layer having a thickness of 60 nm.

Further, the aforesaid heating boat containing ET-2 was heated via application of electric current and deposition was carried out onto the light emitting layer at a deposition rate of 0.1 nm/second, whereby it was produced an electron transport layer having a thickness of 20 nm.

Subsequently, 0.5 nm thick potassium fluoride was vapor deposited to form a cathode buffer layer, and then, 110 nm thick aluminium was vapor deposited to form a cathode, whereby Organic EL element 3-1 was prepared.

Then, the following evaluations were carried out.
(Driving Voltage)

Each organic EL element was driven at a constant electric current of 2.5 mA/cm$^2$ at room temperature (at about 23 to 25° C.), and the driving voltage thereof was measured as an actual value. Each of the driving voltages was represented by a relative value as shown below when the driving voltage of Organic EL element 3-1 was set to be 100.

Driving voltage (relative value)=(Driving voltage (actual value) of each organic EL element/Driving voltage (actual value) of Organic EL element 3-1)×100.

Here, the less relative value means the less driving voltage.
(Aging Stability)

Each Organic EL element was kept at aging condition of 85° C. for 24 hours. Electric power efficiency of each Organic EL element before aging and after aging was measured. Electric power efficiency ratio of after aging to before aging was determined according to the following formula. This value was used for evaluating aging stability.

Aging stability(%)=(Electric power efficiency after kept at aging condition/Electric power efficiency before kept at aging condition)×100.

Here, electric power efficiency was measured using a spectroradiometric luminance meter CS-1000 (produced by Konica Minolta Sensing Inc.). A front luminance and an angle dependence of the luminance for each Organic EL element were measured. The electric power efficiency at a front luminance of 1,000 cd/m$^2$ was determined.
(Emission Color)

Emission color was evaluated in the same manner as done in Example 1.

TABLE 3

| Element No. | Dopant | Host | Driving voltage | Aging stability | Emission color | Remarks |
|---|---|---|---|---|---|---|
| Organic El element 3-1 | cDP-3 | cHS-3 | 100 | 56 | White | Comparative example |
| Organic El element 3-2 | DP-10 | cHS-3 | 98 | 62 | White | Comparative example |
| Organic El element 3-3 | DP-4 | cHS-3 | 99 | 79 | White | Comparative example |
| Organic El element 3-4 | cDP-3 | HS-17 | 96 | 77 | White | Comparative example |
| Organic El element 3-5 | DP-10 | HS-17 | 94 | 85 | White | Reference example |
| Organic El element 3-6 | DP-4 | HS-17 | 90 | 97 | White | Inventive example |
| Organic El element 3-7 | DP-4 | HS-21 | 91 | 93 | White | Inventive example |
| Organic El element 3-8 | DP-4 | HS-6 | 95 | 92 | White | Inventive example |
| Organic El element 3-9 | DP-4 | HS-16 | 93 | 87 | White | Inventive example |

<<Preparation of Organic EL Elements 3-2 to 3-9>>

Organic EL elements 3-2 to 3-9 each were prepared in the same manner as preparation of Organic EL element 3-1, except that cHS-3 and cDP-3 were replaced with the compounds as are listed in Table 3.

<<Evaluation of Organic EL Elements 3-1 to 3-9>>

In order to evaluate the obtained organic EL elements, they were sealed in the same manner as sealing of Organic EL elements 1-1 to 1-10 in Example 1. The organic EL elements were evaluated after forming the lighting devices as illustrated in FIG. 5 and FIG. 6.

As shown by the results in Table 3, it is evident that Organic El element jointly employing a dopant compound and a host compound both relating to the present invention is superior to the comparative example with respect to Driving voltage and Aging stability.

Example 4

<<Preparation of Organic EL Element 4-1>>

An anode was prepared by making patterning to a glass substrate of 100 mm×100 mm×1.1 mm (NA45 produced by NH Techno Glass Corp.) on which a 100 nm film of ITO (indium tin oxide) was formed. Thereafter, the above transparent support substrate provided with the ITO transparent electrode was subjected to ultrasonic washing with isopropyl alcohol, followed by drying with desiccated nitrogen gas, and was subjected to UV ozone washing for 5 minutes.

On the transparent support substrate thus prepared was applied a 70% solution of poly(3,4-ethylenedioxythiphene)-polystyrene sulfonate (PEDOT/PSS, Baytron P AI 4083 made by Bayer AG.) diluted with water by using a spin coating method at 3,000 rpm for 30 seconds to form a film and then it was dried at 200° C. for one hour. A $1^{st}$ hole transport layer having a thickness of 20 nm was prepared.

The aforesaid substrate was transferred under an atmosphere of nitrogen, and a solution containing 47 mg of HT-44 and 3 mg of HT-45 dissolved in 10 ml of toluene was applied on the aforesaid $1^{st}$ hole transport layer by using a spin coating method at 1,500 rpm for 30 seconds to form a film. The film was irradiated with UV rays at 120° C. for 90 seconds so as to achieve photopolymerization and cross-linking, followed by subjected to vacuum drying at 60° C. for one hour. A $2^{nd}$ hole transport layer having a thickness of 20 nm was thus prepared.

One the $2^{nd}$ hole transport layer was applied a solution containing 100 mg of cHS-4, 20 mg of cDP-4, 0.5 mg of cGD-3, and 0.2 mg of cRD-2 dissolved in 10 ml of butyl acetate by using a spin coating method at 600 rpm for 30 seconds to form a film. The film was subjected to vacuum drying at 60° C. for one hour to obtain a light emitting layer having a thickness of 70 nm.

One the light emitting layer was applied a solution containing 50 mg of ET-13 dissolved in 10 ml of hexafluoroisopropanol (HFIP) by using a spin coating method at 1,500 rpm for 30 seconds to form a film. The film was subjected to vacuum drying at 60° C. for one hour to obtain an electron transport layer having a thickness of 20 nm.

Subsequently, this substrate was fixed to the substrate holder of the vacuum deposition apparatus, and the pressure of the vacuum tank was reduced to $4\times10^{-4}$ Pa. Then, 0.4 nm thick potassium fluoride was vapor deposited to form a cathode buffer layer, and then, 110 nm thick aluminum was vapor deposited to form a cathode, whereby Organic EL element 4-1 was prepared.

<<Preparation of Organic EL Elements 4-2 to 4-10>>

Organic EL elements 4-2 to 4-10 each were prepared in the same manner as preparation of Organic EL element 4-1, except that cHS-4 and cDP-4 were replaced with the compounds as are listed in Table 4.

<<Evaluation of Organic EL Elements 4-1 to 4-10>>

In order to evaluate the obtained organic EL elements, they were sealed in the same manner as sealing of Organic EL elements 1-1 to 1-10 in Example 1. The organic EL elements were evaluated after forming the lighting devices as illustrated in FIG. 5 and FIG. 6.

Then, the following evaluations were carried out
(External Quantum Efficiency (EQE))

External quantum efficiency (EQE) was evaluated in the same manner as done in Example 2.
(Aging Stability)

Each Organic EL element was kept at aging condition of 60° C. and 70% RH for one month. Electric power efficiency of each Organic EL element before aging and after aging was measured. Electric power efficiency ratio of after aging to before aging was determined according to the following formula. This value was used for evaluating aging stability.

Aging stability(%)=(Electric power efficiency after kept at aging condition/electric power efficiency before kept at aging condition)×100.

Here, electric power efficiency was measured using a spectroradiometric luminance meter CS-1000 (produced by Konica Minolta Sensing Inc.). A front luminance and an angle dependence of the luminance for each Organic EL element were measured. The electric power efficiency at a front luminance of 1,000 cd/m$^2$ was determined.
(Emission Color)

Emission color was evaluated in the same manner as done in Example 1.

TABLE 4

| Element No. | Dopant | Host | EQE | Aging stability | Emission color | Remarks |
|---|---|---|---|---|---|---|
| Organic El element 4-1 | cDP-4 | cHS-4 | 100 | 44 | White | Comparative example |
| Organic El element 4-2 | DP-11 | cHS-4 | 97 | 51 | White | Comparative example |
| Organic El element 4-3 | DP-5 | cHS-4 | 102 | 66 | White | Comparative example |
| Organic El element 4-4 | cDP-4 | HS-1 | 115 | 55 | White | Comparative example |
| Organic El element 4-5 | DP-11 | HS-1 | 117 | 71 | White | Reference example |
| Organic El element 4-6 | DP-5 | HS-1 | 130 | 86 | White | Inventive example |
| Organic El element 4-7 | DP-5 | HS-7 | 122 | 82 | White | Inventive example |
| Organic El element 4-8 | DP-5 | HS-5 | 116 | 75 | White | Inventive example |
| Organic El element 4-9 | DP-5 | HS-14 | 119 | 80 | White | Inventive example |
| Organic El element 4-10 | DP-5 | HS-27 | 117 | 77 | White | Inventive example |

As shown by the results in Table 4, it is evident that Organic El element jointly employing a dopant compound and a host compound both relating to the present invention is superior to the comparative example with respect to External quantum efficiency and Aging stability.

Example 5

<<Preparation of Organic EL Element 5-1>>

An anode was prepared by making patterning to a glass substrate of 100 mm×100 mm×1.1 mm (NA45 produced by NH Techno Glass Corp.) on which a 100 nm film of ITO (indium tin oxide) was formed. Thereafter, the above transparent support substrate provided with the ITO transparent electrode was subjected to ultrasonic washing with isopropyl alcohol, followed by drying with desiccated nitrogen gas, and was subjected to UV ozone washing for 5 minutes.

On the transparent support substrate thus prepared was applied a 70% solution of poly(3,4-ethylenedioxythiphene)-polystyrene sulfonate (PEDOT/PSS, Baytron P AI 4083 made by Bayer AG.) diluted with water by using a spin coating method at 3,000 rpm for 30 seconds to form a film and then it was dried at 200° C. for one hour. A $1^{st}$ hole transport layer having a thickness of 20 nm was prepared.

The aforesaid substrate was transferred under an atmosphere of nitrogen, and a solution containing 50 mg of ADS254B (made by American Dye Source, Inc.,) dissolved in 10 ml of toluene was applied on the aforesaid 1$^{st}$ hole transport layer by using a spin coating method at 2,500 rpm for 30 seconds to form a film. The film was subjected to vacuum drying at 60° C. for one hour to obtain a 2$^{nd}$ hole transport layer having a thickness of 20 nm.

One the 2$^{nd}$ hole transport layer was applied a solution containing 100 mg of cHS-5 and 10 mg of cDP-5 dissolved in 10 ml of butyl acetate by using a spin coating method at 2,000 rpm for 30 seconds to form a film. The film was subjected to vacuum drying at 60° C. far one hour to obtain a 1$^{st}$ light emitting layer having a thickness of 35 nm.

Subsequently, this substrate was fixed to the substrate holder of the vacuum deposition apparatus. Separately, 200 mg of cHS-5 was placed in a molybdenum resistance heating boat, 200 mg of cRD-3 was placed in another molybdenum resistance heating boat, 200 mg of cGD-1 was placed in another molybdenum resistance heating boat, and 200 mg of ET-9 was placed in another molybdenum resistance heating boat. The resulting boats were fitted in the vacuum deposition apparatus.

Then, after reducing the pressure of the vacuum tank to 4×10$^{-4}$ Pa, the aforesaid heating boats each respectively containing cHS-5, cRD-3 and cGD-1 were heated via application of electric current and deposition was carried out onto the 1$^{st}$ light emitting layer at a deposition rate of 0.1 nm/second, 0.010 nm/second, and 0.002 nm/second, whereby it was produced a 2$^{nd}$ light emitting layer having a thickness of 35 nm.

Further, the aforesaid heating boat containing ET-9 was heated via application of electric current and deposition was carried out onto the light emitting layer at a deposition rate of 0.1 nm/second, whereby it was produced an electron transport layer having a thickness of 20 nm.

Subsequently, 0.5 nm thick lithium fluoride was vapor deposited to form a cathode buffer layer, and then, 110 nm thick aluminium was vapor deposited to form a cathode, whereby Organic EL element 5-1 was prepared.

<<Preparation of Organic EL Elements 5-2 to 5-10>>

Organic EL elements 5-2 to 5-10 each were prepared in the same manner as preparation of Organic EL element 5-1, except that cHS-5 and cDP-5 were replaced with the compounds as are listed in Table 5.

<<Evaluation of Organic EL Elements 5-1 to 5-10>>

In order to evaluate the obtained organic EL elements, they were sealed in the same manner as sealing of Organic EL elements 1-1 to 1-10 in Example 1. The organic EL elements were evaluated after forming the lighting devices as illustrated in FIG. 5 and FIG. 6.

Then, the following evaluations were carried out.

(External Quantum Efficiency (EQE))

External quantum efficiency (EQE) was evaluated in the same manner as done in Example 2.

(Driving Voltage)

Driving voltage was evaluated in the same manner as done in Example 3.

(Aging Stability)

Each Organic EL element was kept at aging condition of 70° C. and 60% RH for one month. Electric power efficiency of each Organic EL element before aging and after aging was measured. Electric power efficiency ratio of after aging to before aging was determined according to the following formula. This value was used for evaluating aging stability.

Aging stability(%)=(Electric power efficiency after kept at aging condition/electric power efficiency before kept at aging condition)×100.

Here, electric power efficiency was measured using a spectroradiometric luminance meter CS-1000 (produced by Konica Minolta Sensing Inc.). A front luminance and an angle dependence of the luminance for each Organic EL element were measured. The electric power efficiency at a front luminance of 1,000 cd/m$^2$ was determined.

(Emission Lifetime and Emission Color)

Emission lifetime and Emission color were evaluated in the same manner as done in Example 1.

TABLE 5

| Element No. | Dopant | Host | EQE | Driving voltage | Emission lifetime | Aging stability | Emission color | Remarks |
|---|---|---|---|---|---|---|---|---|
| Organic El element 5-1 | cDP-5 | cHS-5 | 100 | 100 | 100 | 52 | White | Comparative example |
| Organic El element 5-2 | DP-14 | cHS-5 | 106 | 98 | 131 | 65 | White | Comparative example |
| Organic El element 5-3 | DP-1 | cHS-5 | 108 | 95 | 178 | 70 | White | Comparative example |
| Organic El element 5-4 | cDP-5 | HS-3 | 105 | 93 | 147 | 65 | White | Comparative example |
| Organic El element 5-5 | DP-14 | HS-3 | 108 | 91 | 189 | 73 | White | Reference example |
| Organic El element 5-6 | DP-1 | HS-3 | 116 | 84 | 260 | 90 | White | Inventive example |
| Organic El element 5-7 | DP-6 | HS-23 | 112 | 90 | 274 | 88 | White | Inventive example |
| Organic El element 5-8 | DP-6 | HS-20 | 107 | 81 | 206 | 80 | White | Inventive example |
| Organic El element 5-9 | DP-6 | HS-28 | 109 | 89 | 225 | 76 | White | Inventive example |
| Organic El element 5-10 | DP-6 | HS-22 | 113 | 92 | 244 | 84 | White | Inventive example |

As shown by the results in Table 5, it is evident that Organic El element jointly employing a dopant compound and a host compound both relating to the present invention is superior to the comparative example with respect to External quantum efficiency and Emission lifetime.

Example 6

<<Preparation of Organic EL Element 6-1>>

An anode was prepared by making patterning to a glass substrate of 100 mm×100 mm×1.1 mm (NA45 produced by NH Techno Glass Corp) on which a 100 nm film of ITO (indium tin oxide) was formed. Thereafter, the above transparent support substrate provided with the ITO transparent electrode was subjected to ultrasonic washing with isopropyl alcohol, followed by drying with desiccated nitrogen gas, and was subjected to UV ozone washing for 5 minutes.

The resulting transparent support substrate was fixed to the substrate holder of a commercial vacuum deposition apparatus. Separately, 200 mg of HT-30 was placed in a molybdenum resistance heating boat, 200 mg of HT-36 was placed in another molybdenum resistance heating boat, 200 mg of cHS-6 was placed in another molybdenum resistance heating boat, 200 mg of cDP-6 was placed in another molybdenum resistance heating boat, 200 mg of cHS-7 was placed in another molybdenum resistance heating boat, 200 mg of cGD-1 was placed in another molybdenum resistance heating boat, 200 mg of cRD-1 was placed in another molybdenum resistance heating boat, and 200 mg of ET-11 was placed in another molybdenum resistance heating boat. The resulting boats were fitted in the vacuum deposition apparatus.

Subsequently, after reducing the pressure of the vacuum tank to $4 \times 10^{-4}$ Pa, the aforesaid heating boat containing HT-30 was heated via application of electric current and deposition was carried out onto the transparent support substrate at a deposition rate of 0.1 nm/second, whereby it was produced a hole injection layer having a thickness of 10 nm.

Further, the aforesaid heating boat containing HT-36 was heated via application of electric current and deposition was carried out onto the hole injection layer at a deposition rate of 0.1 nm/second, whereby it was produced a hole transport layer having a thickness of 20 nm.

Further, the aforesaid heating boats each respectively containing cHS-6 and cDP-6 were heated via application of electric current and co-deposition was carried out onto the aforesaid hole transport layer at a respective deposition rate of 0.1 nm/second and 0.012 nm/second, whereby it was produced a $1^{st}$ light emitting layer having a thickness of 60 nm.

Further, the aforesaid heating boats each respectively containing cHS-7, cGD-1 and cRD-1 were heated via application of electric current and co-deposition was carried out onto the aforesaid hole transport layer at a respective deposition rate of 0.1 nm/second, 0.012 nm/second and 0.002 nm/second, whereby it was produced a $2^{nd}$ light emitting layer having a thickness of 60 nm.

Further, the aforesaid heating boat containing ET-11 was heated via application of electric current and deposition was carried out onto the $2^{nd}$ light emitting layer at a deposition rate of 0.1 nm/second, whereby it was produced an electron transport layer having a thickness of 25 nm.

Subsequently, 0.5 nm thick potassium fluoride was vapor deposited to form a cathode buffer layer, and then, 110 nm thick aluminium was vapor deposited to form a cathode, whereby Organic EL element 6-1 was prepared.

<<Preparation of Organic EL Elements 6-2 to 6-10>>

Organic EL elements 6-2 to 6-10 each were prepared in the same manner as preparation of Organic EL element 6-1, except that cHS-6, cHS-7 and cDP-6 were replaced with the compounds as are listed in Table 6.

<<Evaluation of Organic EL Elements 6-1 to 6-10>>

In order to evaluate the obtained organic EL elements, they were sealed in the same manner as sealing of Organic EL elements 1-1 to 1-10 in Example 1. The organic EL elements were evaluated after forming the lighting devices as illustrated in FIG. 5 and FIG. 6.

Then, the following evaluations were carried out.
(Voltage Increasing Ratio)

Voltage increasing ratio was evaluated in the same manner as done in Example 2.

(Electric Power Efficiency, Emission Lifetime and Emission Color)

Electric power efficiency, Emission lifetime and Emission color each were evaluated in the same manner as done in Example 1.

TABLE 6

| Element No. | Dopant | B Host | RD Host | Electric power efficiency | Voltage increasing ratio | Emission lifetime | Emission color | Remarks |
| --- | --- | --- | --- | --- | --- | --- | --- | --- |
| Organic El element 6-1 | cDP-6 | cHS-6 | cHS-7 | 100 | 118 | 100 | White | Comparative example |
| Organic El element 6-2 | DP-13 | cHS-6 | cHS-7 | 116 | 112 | 154 | White | Comparative example |
| Organic El element 6-3 | DP-7 | cHS-6 | cHS-7 | 120 | 111 | 169 | White | Comparative example |
| Organic El element 6-4 | cDP-6 | HS-2 | cHS-7 | 123 | 106 | 220 | White | Comparative example |
| Organic El element 6-5 | DP-13 | HS-2 | cHS-7 | 139 | 105 | 300 | White | Inventive example |
| Organic El element 6-6 | DP-7 | HS-2 | cHS-7 | 149 | 103 | 475 | White | Inventive example |
| Organic El element 6-7 | DP-7 | HS-13 | cHS-7 | 147 | 106 | 347 | White | Inventive example |
| Organic El element 6-8 | DP-7 | HS-12 | cHS-7 | 130 | 104 | 322 | White | Inventive example |
| Organic El element 6-9 | DP-7 | HS-19 | cHS-7 | 139 | 105 | 376 | White | Inventive example |
| Organic El element 6-10 | DP-7 | HS-2 | cHS-8 | 150 | 103 | 520 | White | Inventive example |

As shown by the results in Table 6, it is evident that Organic El element jointly employing a dopant compound and a host compound both relating to the present invention is superior to the comparative example with respect to Electric power efficiency, Voltage increasing ratio and Emission lifetime.

Description of Symbols

1: display
3: pixel
5: scanning line
6: data line
7: electric source line
10: organic EL element 11: switching transistor
12: operating transistor
13: capacitor
A: display section
B: control diction
101: organic EL element
102: glass cover
105: cathode
106: organic EL layer
107: glass substrate having a transparent electrode
108: nitrogen gas
109: water catching agent
201: glass substrate
202: ITO transparent electrode
203: dividing wall
204: hole injection layer
205B, 205G and 205R: light emitting layer
206: cathode

What is claimed is:

1. An organic electroluminescence element comprising an anode, a cathode and a plurality of organic layers including a light emitting layer sandwiched between the anode and the cathode,
wherein at least one of the plurality of organic layers contains:
a blue phosphorescence organic metal complex represented by Formula (2-1); and
a compound represented by Formula (H1), Formula (2-1)

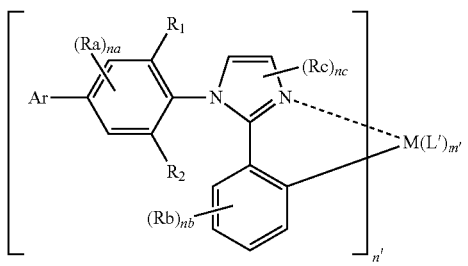

wherein, Ar represents an aromatic hydrocarbon ring, an aromatic heterocycle, a non-aromatic hydrocarbon ring, or a non-aromatic heterocycle; $R_1$ and $R_2$ each respectively represent a hydrogen atom, a halogen atom, a cyano group, an alkyl group, an alkenyl group, an alkynyl group, an alkoxyl group, an amino group, a silyl group, an arylalkyl group, an aryl group, a heteroaryl group, a non-aromatic hydrocarbon ring group, or a non aromatic heterocyclic group, provided that these groups may have a substituent, and that at least one of $R_1$ and $R_2$ is an alkyl group having 2 or more carbon atoms or a cycloalkyl group; $R_a$, $R_b$ and $R_c$, each respectively represent a hydrogen atom, a halogen atom, a cyano group, an alkyl group, an alkenyl group, an alkynyl group, an alkoxyl group, an amino group, a silyl group, an arylalkyl group, an aryl group, a heteroaryl group, a non-aromatic hydrocarbon ring group, or a non-aromatic heterocyclic group, provided that these groups may have a substituent; na and nc each respectively represent an integer of 1 or 2; and nb represents an integer of 1 to 4; L' represents a monoanionic bidentate ligand which is coordinated to M; M represents Ir; m' represents an integer of 0 to 2, n' represents an integer of 1 to 3, provided that m'+n' is equal to 3, $Q_m$-$L_n$  Formula (H1)

wherein, L is a condensed aromatic heterocycle which may have a substituent; Q is an aromatic hydrocarbon ring or aromatic heterocycle which may have a substituent; n and m each respectively represent an integer of 1 to 3, provided that when n is 2 or more, a plurality of Ls may be the same or different with each other, when m is 2 or more, a plurality of Qs may be the same or different with each other, provided that the compound represented by Formula (H1) includes a structure represented by Formula (H2-2)

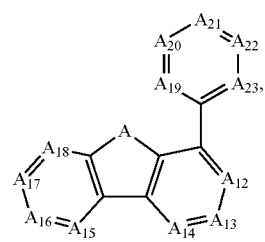

wherein, A represents an oxygen atom, a sulfur atom, NR', or CR"=CR"; $A_{12}$ to $A_{23}$ each respectively represent a nitrogen atom or CR", R' and R" each respectively represent a linking position, a hydrogen atom, or a substituent, provided that when there are a plurality of CR"s, each CR" may be the same or different, and the plurality of CR"s may be joined to form a ring.

2. The organic electroluminescence element of claim 1, wherein, Formula (H1) is further represented by any one of Formulas (H3) to (H102),

 Formula (H3)

(m = 1, n = 1)

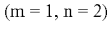 Formula (H4)

(m = 1, n = 2)

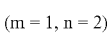 Formula (H5)

(m = 1, n = 2)

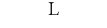 Formula (H6)

(m =1, n = 3)

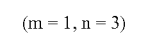 Formula (H7)

(m = 1, n = 3)

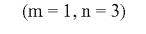 Formula (H8)

(m = 1, n = 3)

 Formula (H9)

(m = 2, n = 1)

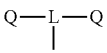 Formula (H10)

(m = 2, n = 1)

 Formula (H11)

(m = 3, n = 1)

-continued

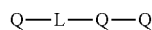
(m = 3, n = 1)

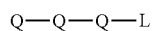
(m = 3, n = 1)

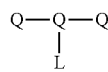
(m = 3, n = 1)

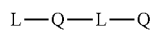
(m = 2, n = 2)

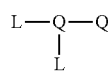
(m = 2, n = 2)

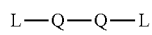
(m = 2, n = 2)

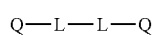
(m = 2, n = 2)

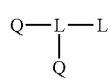
(m = 2, n = 2)

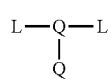
(m = 2, n = 2)

Formula (H12)

Formula (H13)

Formula (H14)

Formula (H15)

Formula (H16)

Formula (H17)

Formula (H18)

Formula (H19)

Formula (H20)

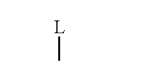
(m = 3, n = 2)

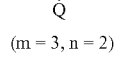
(m = 3, n = 2)

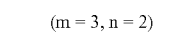
(m = 3, n = 2)

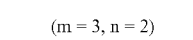
(m = 3, n = 2)

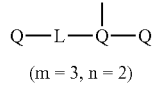
(m = 3, n = 2)

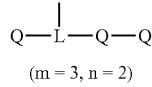
(m = 3, n = 2)

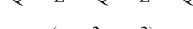
(m = 3, n = 2)

Formula (H21)

Formula (H22)

Formula (H23)

Formula (H24)

Formula (H25)

Formula (H26)

Formula (H27)

-continued

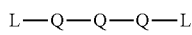
(m = 3, n = 2)

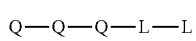
(m = 3, n = 2)

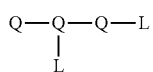
(m = 3, n = 2)

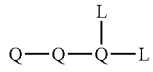
(m = 3, n = 2)

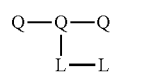
(m = 3, n = 2)

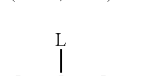
(m = 3, n = 2)

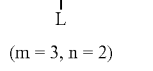
(m = 2, n = 3)

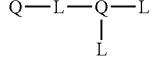
(m = 2, n = 3)

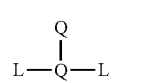
(m = 2, n = 3)

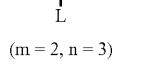
(m = 2, n = 3)

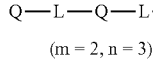
(m = 2, n = 3)

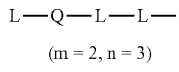
(m = 2, n = 3)

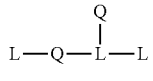
(m = 2, n = 3)

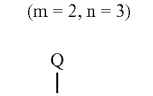
(m = 2, n = 3)

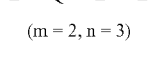
(m = 2, n = 3)

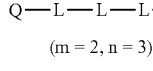
(m = 2, n = 3)

Formula (H28)

Formula (H29)

Formula (H30)

Formula (H31)

Formula (H32)

Formula (H33)

Formula (H34)

Formula (H35)

Formula (H36)

Formula (H37)

Formula (H38)

Formula (H39)

Formula (H40)

Formula (H41)

Formula (H42)

Formula (H43)
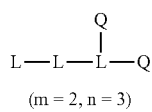
(m = 2, n = 3)

Formula (H44)
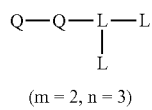
(m = 2, n = 3)

Formula (H45)
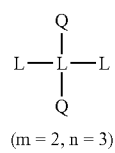
(m = 2, n = 3)

Formula (H46)
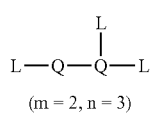
(m = 2, n = 3)

Formula (H47)
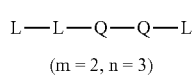
(m = 2, n = 3)

Formula (H48)
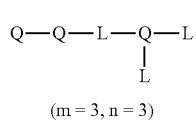
(m = 3, n = 3)

Formula (H49)
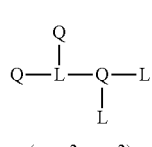
(m = 3, n = 3)

Formula (H50)
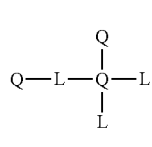
(m = 3, n = 3)

Formula (H51)
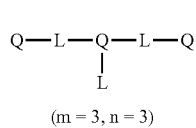
(m = 3, n = 3)

Formula (H52)
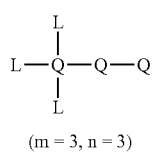
(m = 3, n = 3)

Formula (H53)
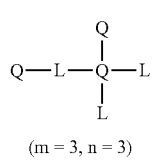
(m = 3, n = 3)

Formula (H54)
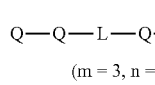
(m = 3, n = 3)

Formula (H55)
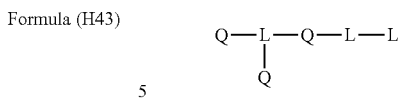
(m = 3, n = 3)

Formula (H56)
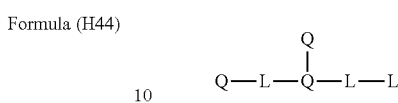
(m = 3, n = 3)

Formula (H57)
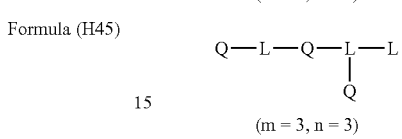
(m = 3, n = 3)

Formula (H58)
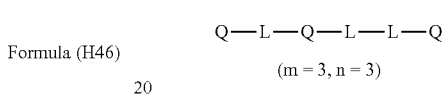
(m = 3, n = 3)

Formula (H59)
(m = 3, n = 3)

Formula (H60)
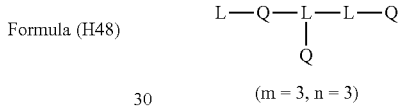
(m = 3, n = 3)

Formula (H61)
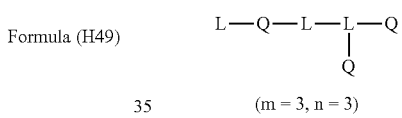
(m = 3, n = 3)

Formula (H62)
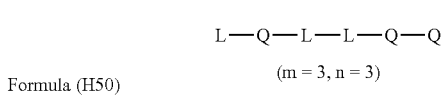
(m = 3, n = 3)

Formula (H63)
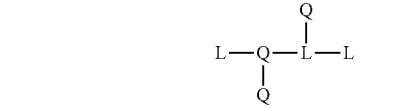
(m = 3, n = 3)

Formula (H64)
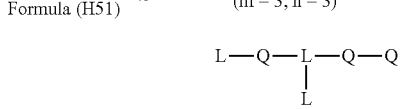
(m = 3, n = 3)

Formula (H65)
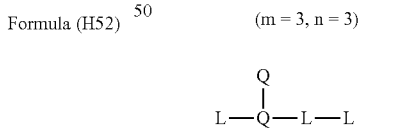
(m = 3, n = 3)

Formula (H66)
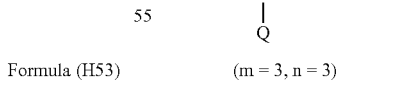
(m = 3, n = 3)

Formula (H67)
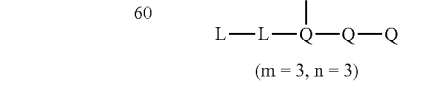
(m = 3, n = 3)

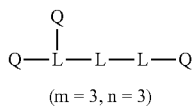
Formula (H68)
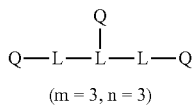
Formula (H69)
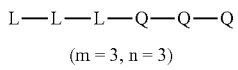
Formula (H70)
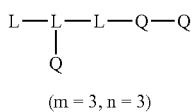
Formula (H71)
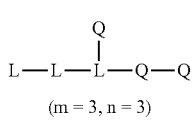
Formula (H72)
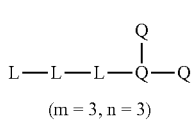
Formula (H73)
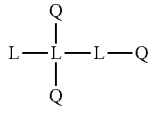
Formula (H74)
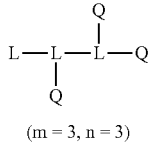
Formula (H75)
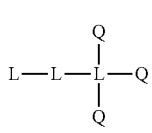
Formula (H76)
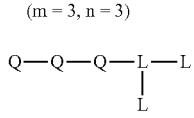
Formula (H77)
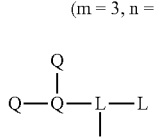
Formula (H78)
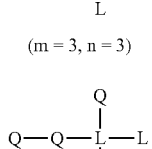
Formula (H79)
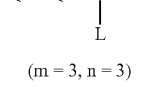
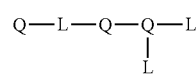
Formula (H80)
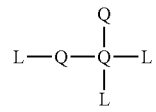
Formula (H81)
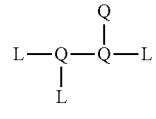
Formula (H82)
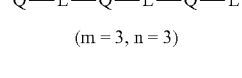
Formula (H83)
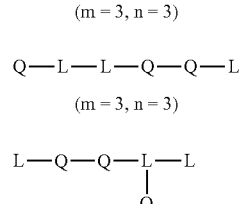
Formula (H84)
Formula (H85)
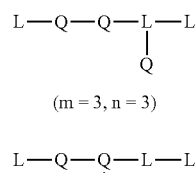
Formula (H86)
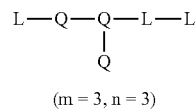
Formula (H87)
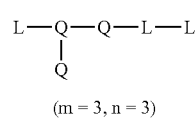
Formula (H88)
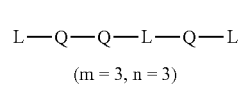
Formula (H89)
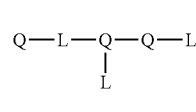
Formula (H90)
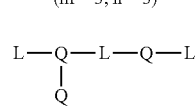
Formula (H91)
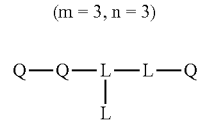
Formula (H92)

-continued

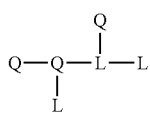

Formula (H93)

(m = 3, n = 3)

L—L—Q—Q—Q—L

Formula (H94)

(m = 3, n = 3)

L—L—Q—L—Q
        |
        Q

Formula (H95)

(m = 3, n = 3)

L—Q—Q—Q—L
     |
     L

Formula (H96)

(m = 3, n = 3)

L—Q—Q—Q—L
        |
        L

Formula (H97)

(m = 3, n = 3)

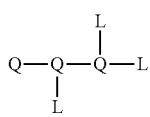

Formula (H98)

(m = 3, n = 3)

Q—Q—Q—L
   |
   L—L

Formula (H99)

(m = 3, n = 3)

L—L—L
   |
   Q

Formula (H100)

(m = 1, n = 3)

Q—Q—L—L

Formula (H101)

(m = 2, n = 2)

Q—L—Q—L—L—Q.

Formula (H102)

(m = 3, n = 3)

3. The organic electroluminescence element of claim 1, wherein, A in Formula (H2) represents an oxygen atom, a sulfur atom, or NR'.

4. The organic electroluminescence element of claim 1, wherein, L in Formula (H1) is further represented by Formula (H2'),

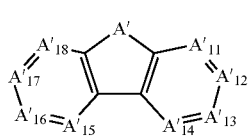

Formula (H2')

wherein, A' represents an oxygen atom, a sulfur atom, or NR'''; $A'_{11}$ to $A'_{18}$ each respectively represent a nitrogen atom or CR'''', R''' and R'''' each respectively represent a linking position, a hydrogen atom, or a substituent, provided that when there are a plurality of CR''''s, each CR'''' may be the same or different, and the plurality of CR''''s may be joined to form a ring.

5. The organic electroluminescence element of claim 4, wherein all of $A'_{11}$ to $A'_{18}$ in Formula (H2') represent CR''''.

6. The organic electroluminescence element of claim 1, wherein, $R_1$ and $R_2$ in Formula (1) represents an alkyl group having 2 or more carbon atoms or a cycloalkyl group.

7. The organic electroluminescence element of claim 1, wherein, at least one of $R_1$ and $R_2$ in Formula (1) represents a branched alkyl group having 3 or more carbon atoms.

8. The organic electroluminescence element of claim 1, wherein, both $R_1$ and $R_2$ in Formula (1) represent a branched alkyl group having 3 or more carbon atoms.

9. The organic electroluminescence element of claim 1, wherein, Ar in Formula (1) represents a benzene ring.

10. An organic electroluminescence element comprising an anode, a cathode, and a plurality of organic layers including a light emitting layer sandwiched between the anode and the cathode,
wherein at least one of the plurality of organic layers contains:
a blue phosphorescence organic metal complex represented by Formula (2-1); and
a compound represented by Formula (H1),

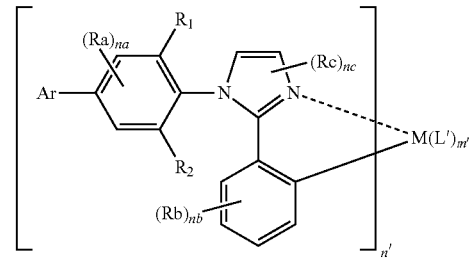

Formula (2-1)

wherein, Ar represents an aromatic hydrocarbon ring, an aromatic heterocycle, a non-aromatic hydrocarbon ring, or a non-aromatic heterocycle; $R_1$ and $R_2$ each respectively represent a hydrogen atom, a halogen atom, a cyano group, an alkyl group, an alkenyl group, an alkynyl group, an alkoxyl group, an amino group, a silyl group, an arylalkyl group, an aryl group, a heteroaryl group, a non-aromatic hydrocarbon ring group, or a non-aromatic heterocyclic group; provided that these groups may have a substituent, and that at least one of $R_1$ and $R_2$ is an alkyl group having 2 or more carbon atoms or a cycloalkyl group; Ra, Rb and Rc each respectively represent a hydrogen atom, a halogen atom, a cyano group, an alkyl group, an alkenyl group, an alkynyl group, an alkoxyl group, an amino group, a silyl group, an arylalkyl group, an aryl group, a heteroaryl group, a non- aromatic hydrocarbon ring group, or a non-aromatic heterocyclic group, provided that these groups may have a substituent; na and nc each respectively represent an integer of 1 or 2; and nb represents an integer of 1 to 4; L'represents a monoanionic bidentate ligand which is coordinated to M; M represents Ir; m'represents an integer of 0 to 2, n' represents an integer of 1 to 3, provided that m'+n' is equal to 3, $Q_m$-$L_n$ Formula (H1)

wherein, L is a condensed aromatic heterocycle which may have a substituent, at least one of Ls represents a carbazole ring; Q is an aromatic hydrocarbon ring or aromatic heterocycle which may have a substituent; n represent an integer of 2 or 3, and m represent an integer of 1 to 3, a plurality of Ls may be the same or different with each other, provided that when m is 2 or more, a plurality of Qs may be the same or different with each other, provided that the compound represented by Formula (H1) includes a structure represented by Formula (H2), Formula (H2)

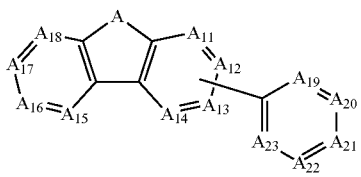

wherein, A represents an oxygen atom, a sulfur atom, NR", or CR"=CR"; $A_{11}$ to $A_{23}$ each respectively represent a nitrogen atom or CR", R' and R" each respectively represent a linking position, a hydrogen atom, or a substituent, provided that when there are a plurality of CR"s, each CR" may be the same or different, and the plurality of CR"s may be joined to form a ring.

11. The organic electroluminescence element of claim 10, wherein, Formula (H1) is further represented by any one of Formulas (H3) to (H102), Formula (H3)

L—Q
(m=1, n=1)

Formula (H4)

L—Q—L
(m=1, n=2)

Formula (H5)

L—L—Q
(m=1, n=2)

Formula (H6)

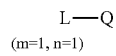
(m=1, n=3)

Formula (H7)

L—Q—L—L
(m=1, n=3)

Formula (H8)

L—L—L—Q
(m=1, n=3)

Formula (H9)

Q—L—Q
(m=2, n=1)

Formula (H10)

Q—Q—L
(m=2, n=1)

Formula (H11)

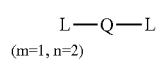
(m=3, n=1)

Formula (H12)

Q—L—Q—Q
(m=3, n=1)

Formula (H13)

Q—Q—Q—L
(m=3, n=1)

Formula (H14)

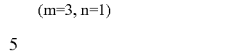
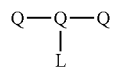
(m=3, n=1)

Formula (H15)

L—Q—L—Q
(m=2, n=2)

Formula (H16)

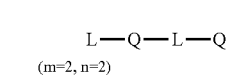
(m=2, n=2)

Formula (H17)

L—Q—Q—L
(m=2, n=2)

Formula (H18)

Q—L—L—Q
(m=2, n=2)

Formula (H19)

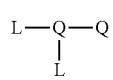
(m=2, n=2)

Formula (H20)

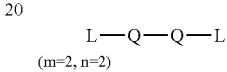
(m=2, n=2)

Formula (H21)

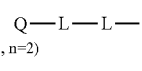
(m=3, n=2)

Formula (H22)

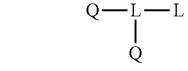
(m=3, n=2)

Formula (H23)

L—Q—L—Q—Q
(m=3, n=2)

Formula (H24)

Q—L—Q—Q—L
(m=3, n=2)

Formula (H25)

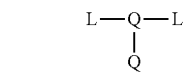
(m=3, n=2)

Formula (H26)

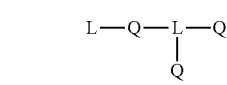
(m=3, n=2)

Formula (H27)

Q—L—Q—L—Q
(m=3, n=2)

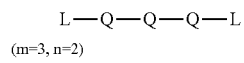
(m=3, n=2)
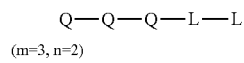
(m=3, n=2)
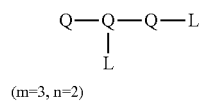
(m=3, n=2)
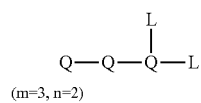
(m=3, n=2)
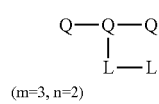
(m=3, n=2)
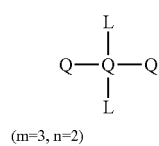
(m=3, n=2)
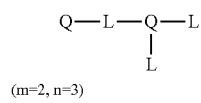
(m=2, n=3)
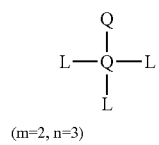
(m=2, n=3)
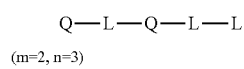
(m=2, n=3)
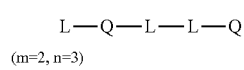
(m=2, n=3)
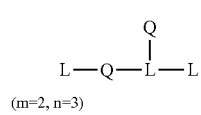
(m=2, n=3)
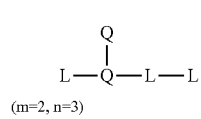
(m=2, n=3)
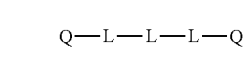
(m=2, n=3)
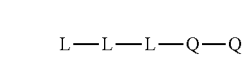
(m=2, n=3)
Formula (H28)
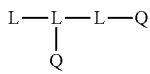
(m=2, n=3)
Formula (H29)
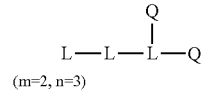
(m=2, n=3)
Formula (H30)
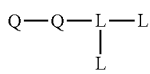
(m=2, n=3)
Formula (H31)
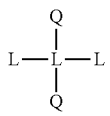
(m=2, n=3)
Formula (H32)
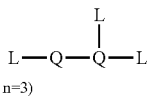
(m=2, n=3)
Formula (H33)
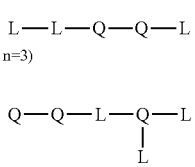
(m=3, n=3)
Formula (H34)
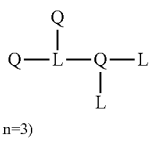
(m=3, n=3)
Formula (H35)
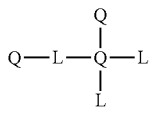
(m=3, n=3)
Formula (H36)
Formula (H37)
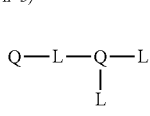
Formula (H38)
(m=3, n=3)
Formula (H39)
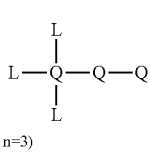
(m=3, n=3)
Formula (H40)
Formula (41)
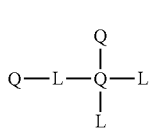
(m=3, n=3)
Formula (42)
Formula (43)
Formula (44)
Formula (45)
Formula (46)
Formula (47)
Formula (48)
Formula (49)
Formula (50)
Formula (51)
Formula (52)
Formula (53)

-continued

Q—Q—L—Q—L—L
(m=3, n=3)

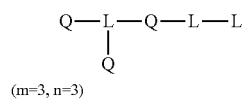
(m=3, n=3)

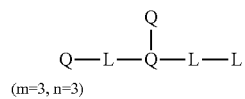
(m=3, n=3)

Q—L—Q—L—L
(m=3, n=3)

Q—L—Q—L—Q
(m=3, n=3)

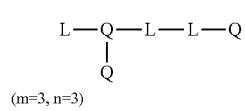
(m=3, n=3)

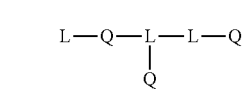
(m=3, n=3)

L—Q—L—L—Q—Q
(m=3, n=3)

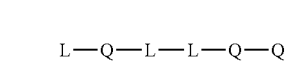
(m=3, n=3)

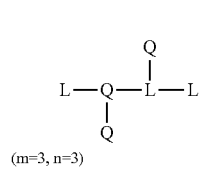
(m=3, n=3)

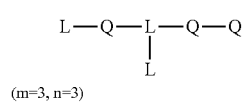
(m=3, n=3)

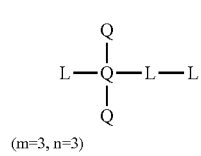
(m=3, n=3)

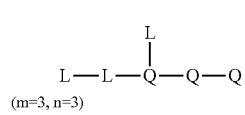
(m=3, n=3)

Q—Q—L—L—L—Q
(m=3, n=3)

-continued

Formula (54)

Formula (H68)

Formula (55)

Formula (H69)

Formula (H56)

L—L—L—Q—Q
(m=3, n=3)
Formula (H70)

Formula (H57)

Formula (H71)

Formula (H58)

Formula (H72)

Formula (H59)

Formula (H73)

Formula (H60)

Formula (H74)

Formula (H61)

Formula (H75)

Formula (H62)

(m=3, n=3)
Formula (H76)

Formula (H63)

Formula (H77)

Formula (H64)

Q—Q—Q—L—L
(m=3, n=3)
Formula (H78)

Formula (H65)

(m=3, n=3)
Formula (H79)

Formula (H66)

Formula (H67)

-continued

Formula (H80)

Q—L—Q—Q—L
            |
            L (m=3, n=3)

Formula (H81)

L—Q—Q—L
      |
      L (m=3, n=3)

Formula (H82)

L—Q—Q—L
      |
      L (m=3, n=3)

Formula (H83)

Q—L—Q—L—Q—L (m=3, n=3)

Formula (H84)

Q—L—Q—Q—L—L (m=3, n=3)

Formula (H85)

Q—L—L—Q—Q—L (m=3, n=3)

Formula (H86)

L—Q—Q—L—L
         |
         Q (m=3, n=3)

Formula (H87)

L—Q—Q—L—L
     |
     Q (m=3, n=3)

Formula (H88)

L—Q—Q—L—L
     |
     Q (m=3, n=3)

Formula (H89)

L—Q—Q—L—Q—L (m=3, n=3)

Formula (H90)

Q—L—Q—Q—L
          |
          L (m=3, n=3)

Formula (H91)

L—Q—L—Q—L
     |
     Q (m=3, n=3)

Formula (H92)

Q—Q—L—L—Q
        |
        L (m=3, n=3)

Formula (H93)

Q
     |
Q—Q—L—L
     |
     L (m=3, n=3)

Formula (H94)

L—L—Q—Q—Q—L (m=3, n=3)

Formula (H95)

L—L—Q—L—Q
        |
        Q (m=3, n=3)

Formula (H96)

L—Q—Q—Q—L
      |
      L (m=3, n=3)

Formula (H97)

L—Q—Q—Q—L
         |
         L (m=3, n=3)

Formula (H98)

L
     |
L—Q—Q—L
     |
     L (m=3, n=3)

Formula (H99)

L—Q—Q—L
     |
     L—L (m=3, n=3)

Formula (H100)

L—L—L
   |
   Q (m=1, n=3)

Formula (H101)

Q—Q—L—L (m=2, n=2)

Formula (H102)

Q—L—Q—L—L—Q.

(m=3, n=3)

12. The organic electroluminescence element of claim 10, wherein, A in Formula (H2) represents an oxygen atom, a sulfur atom, or NR'.

13. The organic electroluminescence element of claim 10, wherein, L in Formula (H1) is further represented by Formula (H2'), Formula (H2')

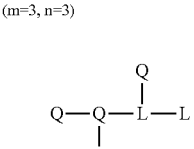

wherein, A' represents an oxygen atom, a sulfur atom, or NR'''; $A'_{11}$ to $A'_{18}$ each respectively represent a nitrogen atom or CR'''', R''' and R'''' each respectively represent a linking position, a hydrogen atom, or a substituent, provided that when there are a plurality of CR''''s, each CR'''' may be the same or different, and the plurality of CR''''s may be joined to form a ring.

14. The organic electroluminescence element of claim 13, wherein all of $A'_{11}$ to $A'_{18}$ in Formula (H2') represent CR''''.

15. The organic electroluminescence element of claim 10, wherein, $R_1$ and $R_2$ in Formula (1) represents an alkyl group having 2 or more carbon atoms or a cycloalkyl group.

16. The organic electroluminescence element of claim 10, wherein, at least one of $R_1$ and $R_2$ in Formula (1) represents a branched alkyl group having 3 or more carbon atoms.

17. The organic electroluminescence element of claim 10, wherein, both $R_1$ and $R_2$ in Formula (1) represent a branched alkyl group having 3 or more carbon atoms.

18. The organic electroluminescence element of claim 10, wherein, Ar in Formula (1) represents a benzene ring.

* * * * *